(12) United States Patent
Ito

(10) Patent No.: US 7,852,633 B2
(45) Date of Patent: Dec. 14, 2010

(54) CONNECTOR FOR CONNECTION TO A MODULE BOARD

(75) Inventor: Toshiyasu Ito, Tougane (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/508,352

(22) Filed: Jul. 23, 2009

(65) Prior Publication Data

US 2010/0022113 A1 Jan. 28, 2010

Related U.S. Application Data

(60) Provisional application No. 61/083,358, filed on Jul. 24, 2008.

(51) Int. Cl.
*H05K 7/20* (2006.01)

(52) U.S. Cl. ............... 361/715; 361/704; 361/707; 361/719; 165/80.3; 439/485

(58) Field of Classification Search ............ None
See application file for complete search history.

(56) References Cited

U.S. PATENT DOCUMENTS

| | | | | | |
|---|---|---|---|---|---|
| 6,128,194 | A | * | 10/2000 | Francis | 361/737 |
| 6,780,060 | B1 | * | 8/2004 | Kajiura et al. | 439/620.21 |
| 6,873,524 | B2 | * | 3/2005 | Kaczeus et al. | 361/679.33 |
| 6,942,506 | B2 | * | 9/2005 | Kimura et al. | 439/159 |
| 7,090,519 | B2 | * | 8/2006 | Muramatsu et al. | 439/159 |
| 7,133,285 | B2 | * | 11/2006 | Nishimura | 361/715 |
| 7,448,921 | B2 | * | 11/2008 | Kim et al. | 439/744 |
| 7,518,870 | B2 | * | 4/2009 | Choi et al. | 361/702 |
| 7,545,638 | B2 | * | 6/2009 | Aoto et al. | 439/487 |
| 7,667,972 | B2 | * | 2/2010 | Chen et al. | 361/709 |
| 7,733,652 | B2 | * | 6/2010 | Costello et al. | 361/704 |
| 2002/0048980 | A1 | | 4/2002 | Kodama et al. | |
| 2005/0162834 | A1 | | 7/2005 | Nishimura | |
| 2006/0263570 | A1 | | 11/2006 | Bunyan | |

FOREIGN PATENT DOCUMENTS

| | | |
|---|---|---|
| JP | 10-289754 | 10/1998 |
| JP | 2000-40562 | 2/2000 |
| JP | 2002-50434 | 2/2002 |
| JP | 2005-519452 | 6/2005 |
| JP | 2005-520296 | 7/2005 |
| JP | 2005-222437 | 8/2005 |
| JP | 2005-222537 | 8/2005 |

(Continued)

*Primary Examiner*—Boris L Chervinsky
(74) *Attorney, Agent, or Firm*—Finnegan, Henderson, Farabow, Garrett & Dunner, LLP

(57) ABSTRACT

Provided is a connector for connection to a module board including an eject mechanism selectively ejecting a module from a module accommodating section. The eject mechanism includes a locking member that has a locking nib engageable with a recess of a case of the module. The locking member is rotatably supported by a sidewall section of a guide rail member, and thus can stay in an opening of the sidewall section. An eject button of the connector for connection to a module board has an operation section provided with a flange. The flange is pressed against the inner peripheral surface of a housing of an electronic device by a biasing force of coil springs all the time except for when the operation section is pushed in.

8 Claims, 54 Drawing Sheets

FOREIGN PATENT DOCUMENTS

| | | |
|---|---|---|
| JP | 2005-242946 | 9/2005 |
| JP | 2005-285522 | 10/2005 |
| JP | 2005-322498 | 11/2005 |
| JP | 2007-26854 | 2/2007 |
| JP | 2007-80580 | 3/2007 |
| JP | 3132340 | 5/2007 |

* cited by examiner

CONNECTOR FOR CONNECTION TO A MODULE BOARD

CROSS-REFERENCE TO RELATED APPLICATIONS

This application claims the benefit of U.S. Provisional Patent Application No. 61/083,358 filed Jul. 24, 2008, which is hereby incorporated by reference herein in its entirety.

BACKGROUND OF THE INVENTION

1. Field of the Invention

The present invention relates to a connector for connection to a module board including an eject mechanism selectively ejecting a module board.

2. Description of the Related Art

An expansion card such as a PC card including a module board therein is installed in an electronic device by being inserted in a card connector provided in the electronic device. The card connector has a card slot on its one end, and a PC card passes through the card slot at the time of installing the PC card. The card slot communicates with a card insertion opening provided in the outer periphery of a housing of an electronic device. In addition, such a card connector comprises an eject mechanism detachably holding a PC card, as shown in Japanese Patent Application Laid-Open No. 2002-50434, for example.

The eject mechanism includes a rotary lever and an eject rod with a push button. The rotary lever moves a PC card in the card connector in a direction to separate the PC card from contact pins. The eject rod has a push button for rotationally moving the rotary lever. The push button of the eject rod is exposed at the outer periphery of a housing of an electronic device, which allows users to operate the button. The push button includes a fixing tab. The fixing tab functions as a lock mechanism that prevents a PC card in a card accommodating section of the card connector from being accidentally disconnected and ejected to the outside. The fixing tab prevents disconnection or ejection of the PC card held in the card accommodating section of the card connector by selectively protruding into a card passage at the same time as the push button protrudes, and thus by fixing to the end of the rear-end surface of the PC card.

Furthermore, there has also proposed a card connector including a connector body provided with a heat sink, as described in Japanese Patent Application Laid-Open Nos. 2005-322498 and 2005-222537, for example. The heat sink serves as a radiator dissipating heat from a module board in a PC card in the card connector.

SUMMARY OF THE INVENTION

However, an eject mechanism having such a fixing tab of a push button of an eject rod as described above has a disposition that the length of the push button in the direction of insertion and withdrawal of a card needs to be changed when a module board or a card built into the card connector is changed in size. The disposition is contrary to component standardization since the problem leads to the need of different eject mechanisms for connection to a module boards in different sizes.

In addition, a card connector as described above might allow noise to leak from a gap between the outer periphery of a push button and an opening of a housing of an electronic device. This is trouble when outside leakage of noise generated by a module board is perceived as problems.

In view of the above-described problems, the present invention has an object to provide a connector for connection to a module board including an eject mechanism selectively ejecting a module board and having the following characteristics. Specifically, the connector for connection to a module board can provide a lock mechanism for preventing disconnection or ejection of a module board at a predetermined position irrespective of the size of the module board. In addition, the connector for connection to a module board can avoid outside leakage of noise generated by a module board through a gap between a push button of the eject mechanism and a housing of an electronic device.

To achieve the above-described object, a connector for connection to a module board according to the present invention includes a module accommodating section, a connector section and an eject mechanism. The module accommodating section detachably accommodates a module that includes a module board. The connector section is provided adjacent to the module accommodating section, and electrically connects the module board of the module to a wiring board. The eject mechanism is attached to an outer periphery of a guide rail member that forms the module accommodating section, and selectively ejects the module from the module accommodating section. The eject mechanism includes an eject mechanism, a locking member and a collar-like portion. The eject button is to be operated in order to selectively eject the module from the module accommodating section. The locking member is rotatably provided in a through hole of the guide rail member so as to be switched between a lock state and an unlock state in response to an operation of the eject button. Here, in the lock state, the locking member is engaged with a portion to be engaged of the module to lock the module in the module accommodating section. In addition, in the unlock state, the locking member is away from the portion to be engaged of the module and thus stays in the through hole to unlock the module in the module accommodating section. The collar-like portion is formed on an operation section of the eject button so as to conform to an opening of a housing provided with the wiring board. The collar-like portion is pressed against an inner peripheral surface around the opening of the housing during the lock state.

In the connector for connection to a module board according to the present invention, the locking member is rotatably provided in the through hole of the guide rail member that forms the module accommodating section. This allows provision of a lock mechanism for preventing disconnection or ejection of a module board at a predetermined position irrespective of the size of the module board. In addition, in the connector for connection to a module board, the collar-like portion is formed on the operation section of the eject button so as to conform to the opening of the housing provided with the wiring board, and is pressed against the inner peripheral surface around the opening of the housing during the lock state. Accordingly, the connector for connection to a module board prevents outside leakage of noise generated by the module board through a gap between the push button of the eject mechanism and the housing.

Further features of the present invention will become apparent from the following description of exemplary embodiments (with reference to the attached drawings).

DESCRIPTION OF THE EMBODIMENTS

Figure 2:
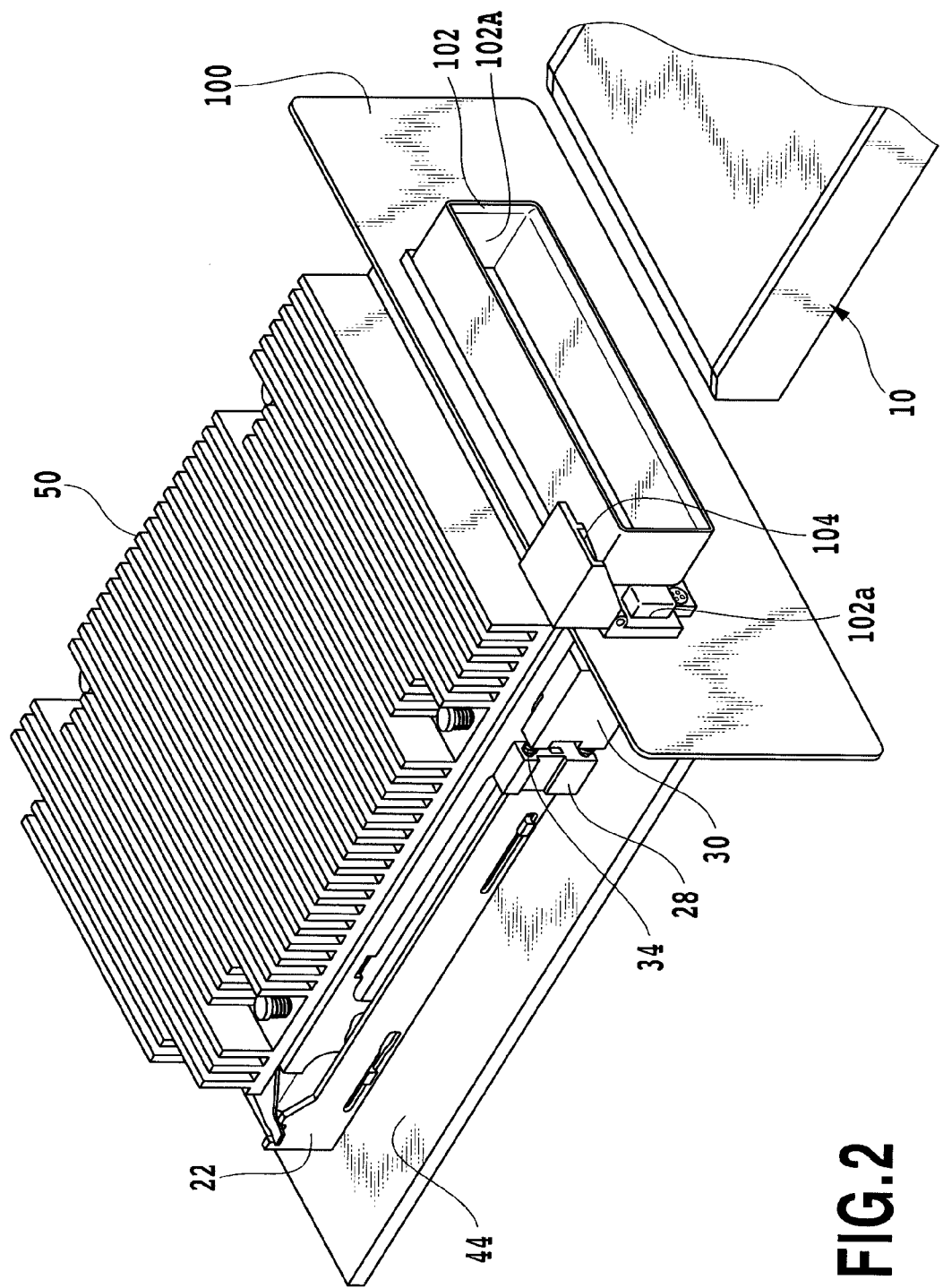
FIG. 2 is a perspective view showing an appearance of the example of a connector for connection to a module board according to the present invention, as well as a module.

FIG. 2 shows a view showing an appearance of embodiment of a connector for connection to a module board according to the present invention, as well as a module.

In FIG. 2, multiple connectors for connection to a module board are provided in parallel at predetermined positions in a housing 100 of a predetermined electronic equipment. Note that FIG. 2 shows one of the connectors for connection to a module board as a representative example.

Figure 3:
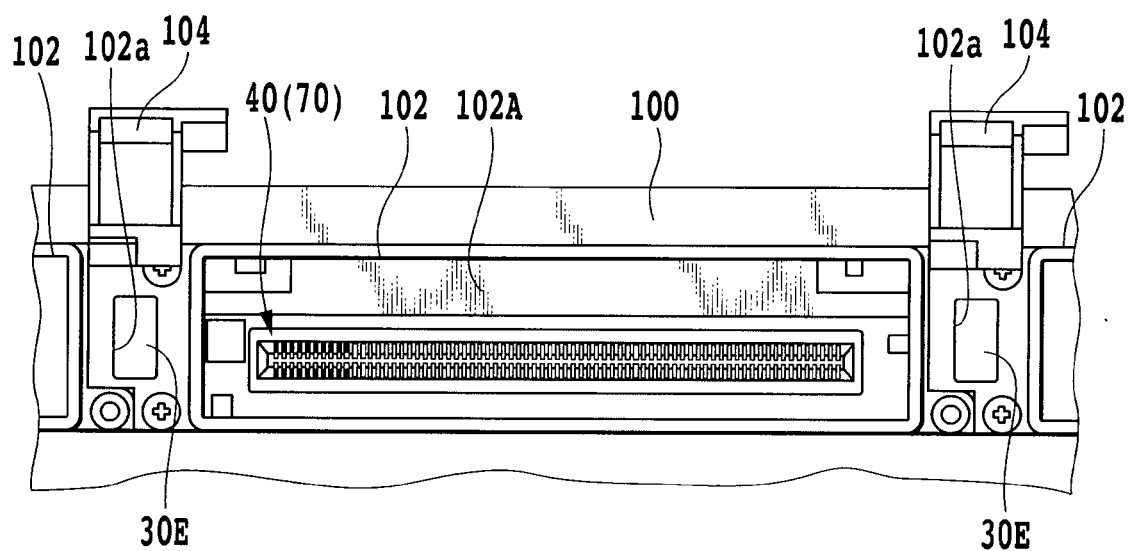
FIG. 3 is a front view of the example shown in FIG. 2.

To each portion where a module slot (not shown) is formed in the outer peripheral surface of the housing 100, a module guide 102 is attached as shown in FIGS. 2 and 3.

Note that, as shown in FIG. 3, the module guides 102 are arranged in a line at predetermined intervals on a common plane.

Figure 4:
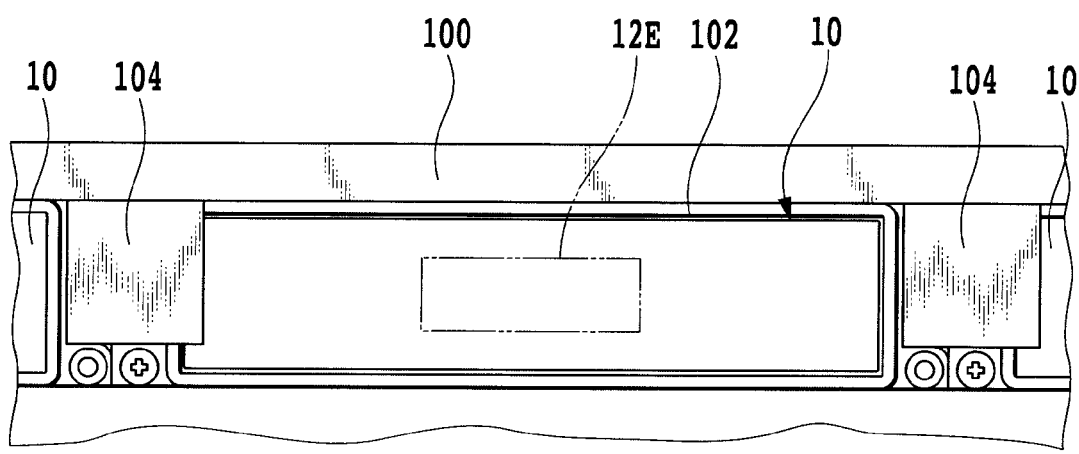
FIG. 4 is a front view showing the example shown in FIG. 3 with a module being mounted.

Each module guide 102 formed like an approximately rectangular frame has an opening 102A in the center, in which a module 10 passes through the opening 102A at the time of insertion and withdrawal of a module board from the connector for connection to a module board. The opening 102A communicates with the corresponding module slot and the inside of the housing 100. In FIG. 2, in the left end of the module guide 102, formed is a hole 102a through which an operation section 30E of an eject button 30 is to be passed. The eject button 30 will be described later. An anti-misoperation button cover 104 is rotational movably supported on the periphery of the hole 102a, which makes the anti-misoperation button cover 104 movable between an opened position and a covering position. When the anti-misoperation button cover 104 is in the opening position, the operation section 30E of the eject button 30 is set operatable as shown in FIG. 3. In addition, when being in the covering position, the anti-misoperation button cover 104 covers up the operation section 30E of the eject button 30 as shown in FIG. 4. Note that the anti-misoperation button cover 104 may be biased by an elastic member such as a torsion coil spring in the direction of the covering position.

In the case where the connector for connection to a module board includes a mechanism to eject the module 10 by using the operation section 30E of the eject button 30, the above-described structure prevents misoperation of the mechanism such as mistakenly pushing the eject button 30. In addition, in the case where the electronic device is installed with multiple modules 10 contiguously arranged as shown in FIG. 4, the above-described structure facilitates discriminant of one of the modules 10 that is desired to be ejected and the operation section 30E of the eject button 30 corresponding to the module.

Figure 5:
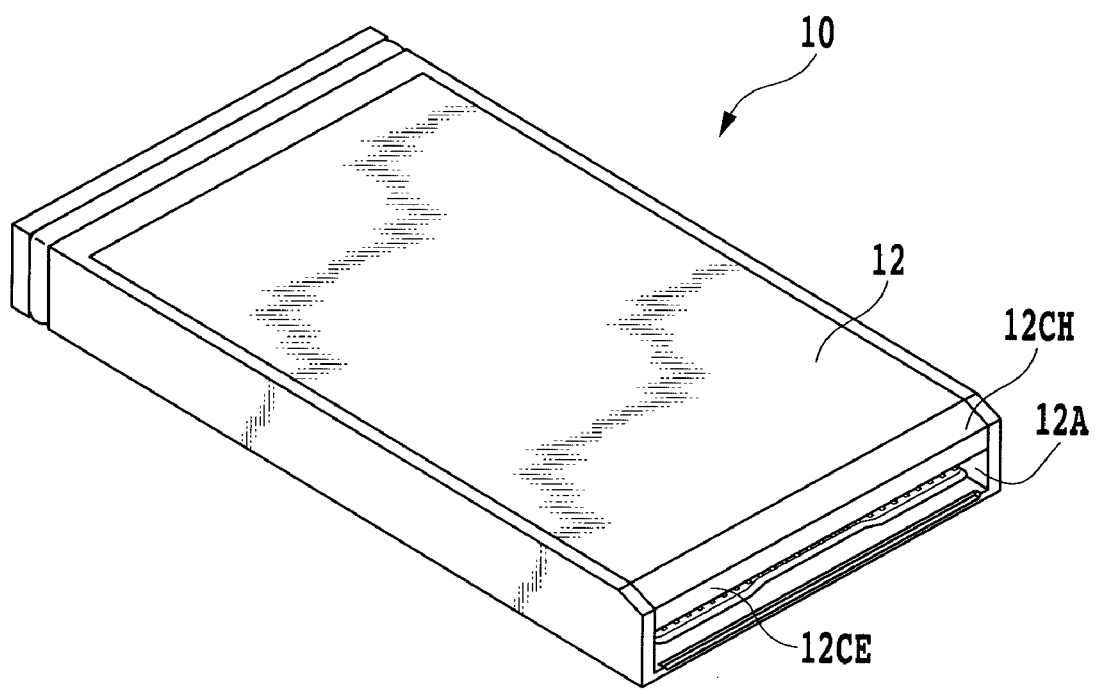
FIG. 5 is a perspective view showing an appearance of a module used in an example of a connector for connection to a module board according to the present invention.
Figure 6:
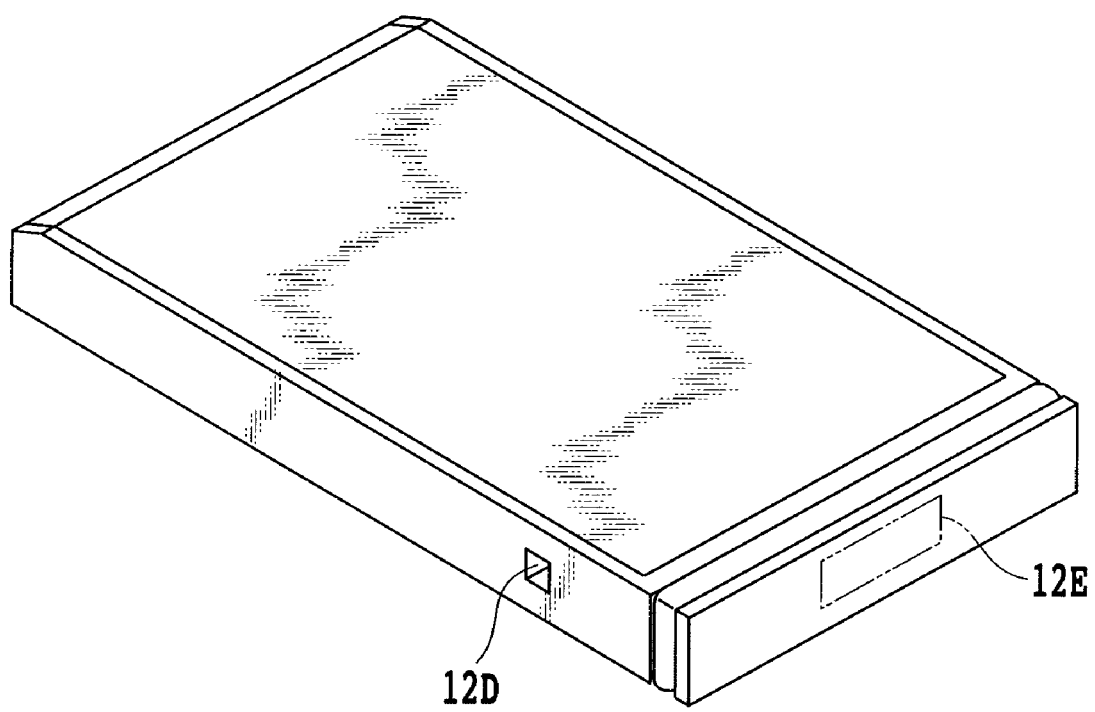
FIG. 6 is a perspective view showing an appearance of the module shown in FIG. 5 viewed from a port side.

As enlarged in FIGS. 5 and 6, the module 10 comprises: a case 12 forming the shell of the module 10; and a module board 14 positioned at a predetermined position in an accommodating section 12A of the case 12. In an end surface 12CE of one of the connecting ends of the case 12, formed is an opening in which contact terminals of a host connector are to be inserted. The host connector will be described later. In addition, an inclined surface portion 12CH is formed on the upper side of the periphery of the opening. Moreover, as shown in FIG. 6, in the other connecting end of the case 12, formed is a port 12E to which a predetermined transmission plug (not shown) is to be connected. The port 12E is electrically connected to the module board 14.

Figure 7:
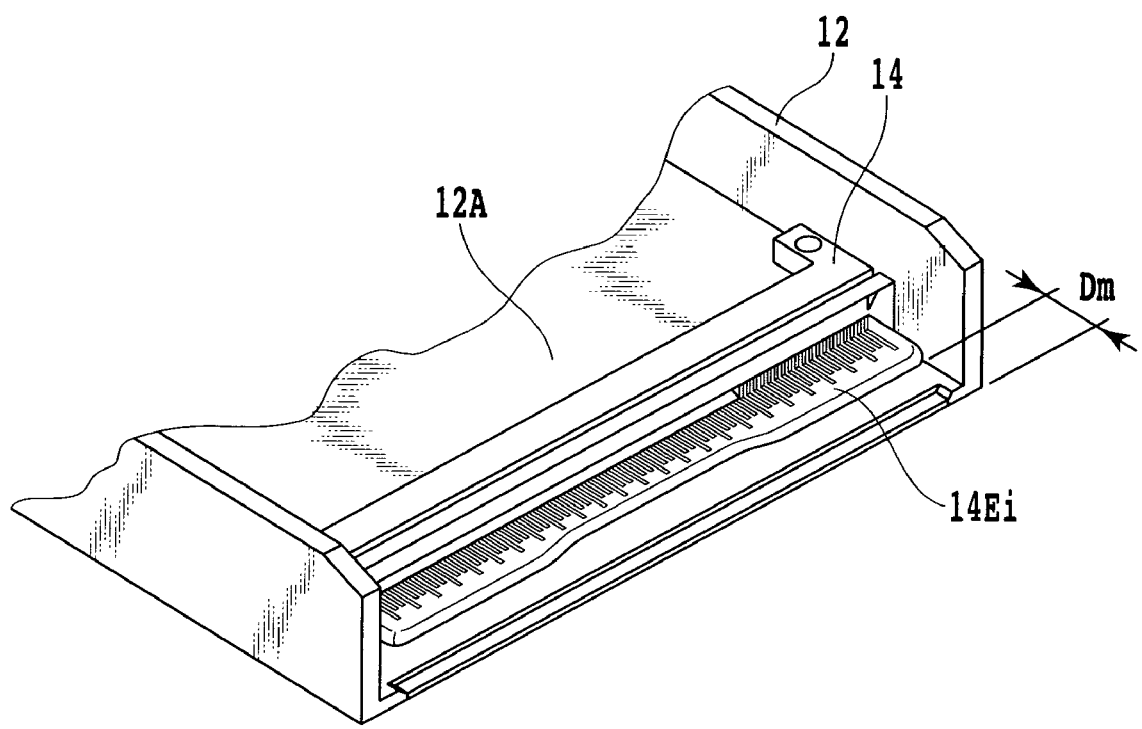
FIG. 7 is a perspective view illustrating an internal structure of the module shown in FIG. 5.

Connecting terminal groups of the module board 14 are positioned near the opening of the case 12 communicating the accommodating section 12A thereof. The connecting terminal groups of the module board 14 are formed respectively on the both sides of the module board 14. Each connecting terminal group consists of a line of multiple contact pads 14Ei (i=1 to n, where n is a positive integer) formed in parallel to one another. The distance Dm between the end of each of the multiple contact pads 14Ei and the end surface 12CE is set to a predetermined value as shown in FIG. 7.

As shown in FIG. 6, at a predetermined position of one of the side surfaces of the case 12, formed is a recess 12D to which a locking nib 32N of a locking member 32 to be hereinafter described is selectively engaged. As shown in FIG. 2, the connector for connection to a module board is placed on a printed wiring board 44 in the housing 100. The connector for connection to a module board includes, as main components, a guide rail member 20, a heat sink unit for dissipating heat from the module 10, an eject mechanism 38, a host connector 40 and a board connector 42. The guide rail member 20 has a module accommodating section 20B adapted to detachably accommodate the module 10. The eject mechanism 38 holds the module 10 provided in the module accommodating section 20B, and selectively ejects the module 10 toward the outside. The host connector 40 and the board connector 42 electrically connect the contact pads 14Ei of the module board 14 of the installed module 10 and a conductive pattern of the printed wiring board 44.

Figure 1:
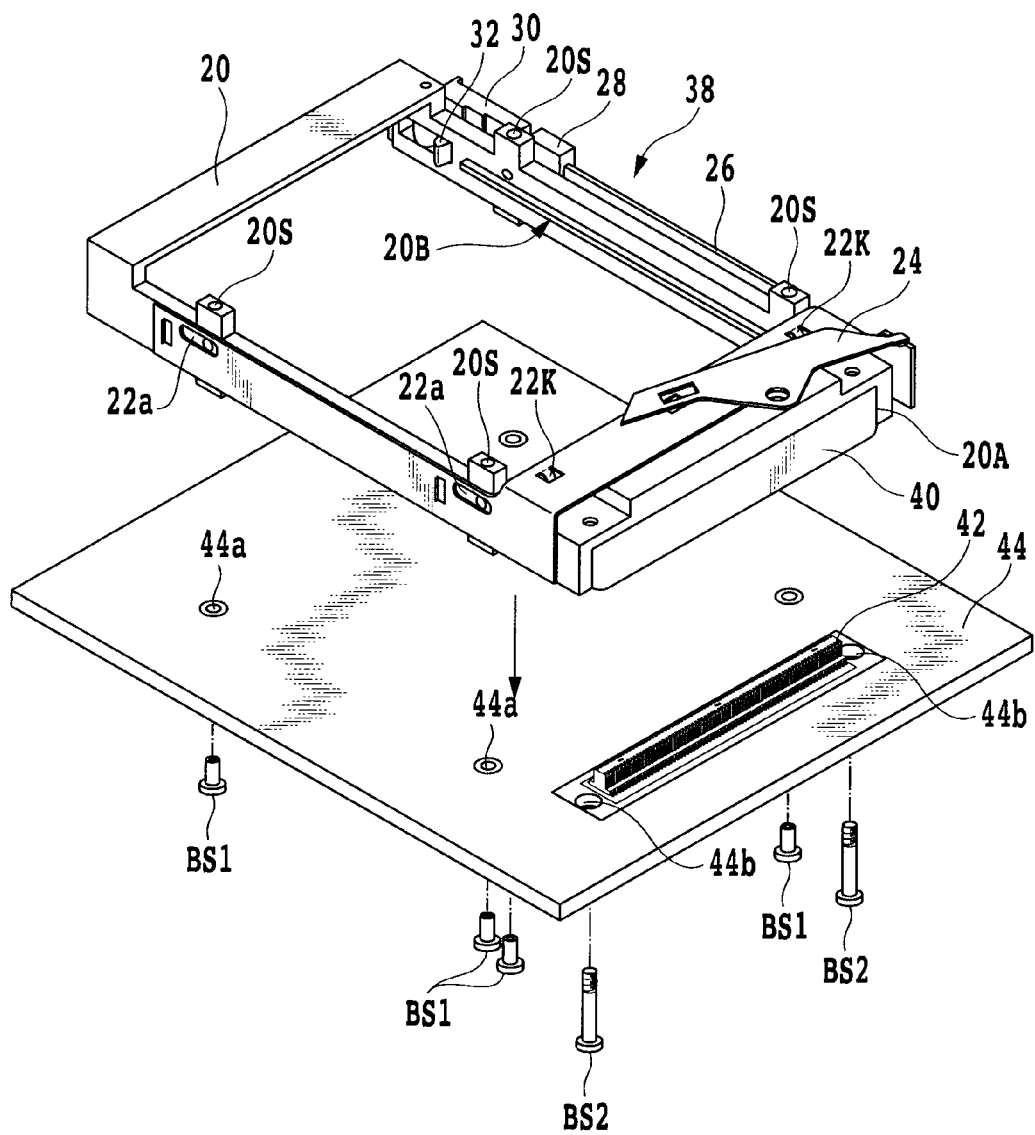
FIG. 1 is a perspective view schematically showing an eject mechanism used in an example of a connector for connection to a module board according to the present invention, as well as a printed wiring board.
Figure 8:
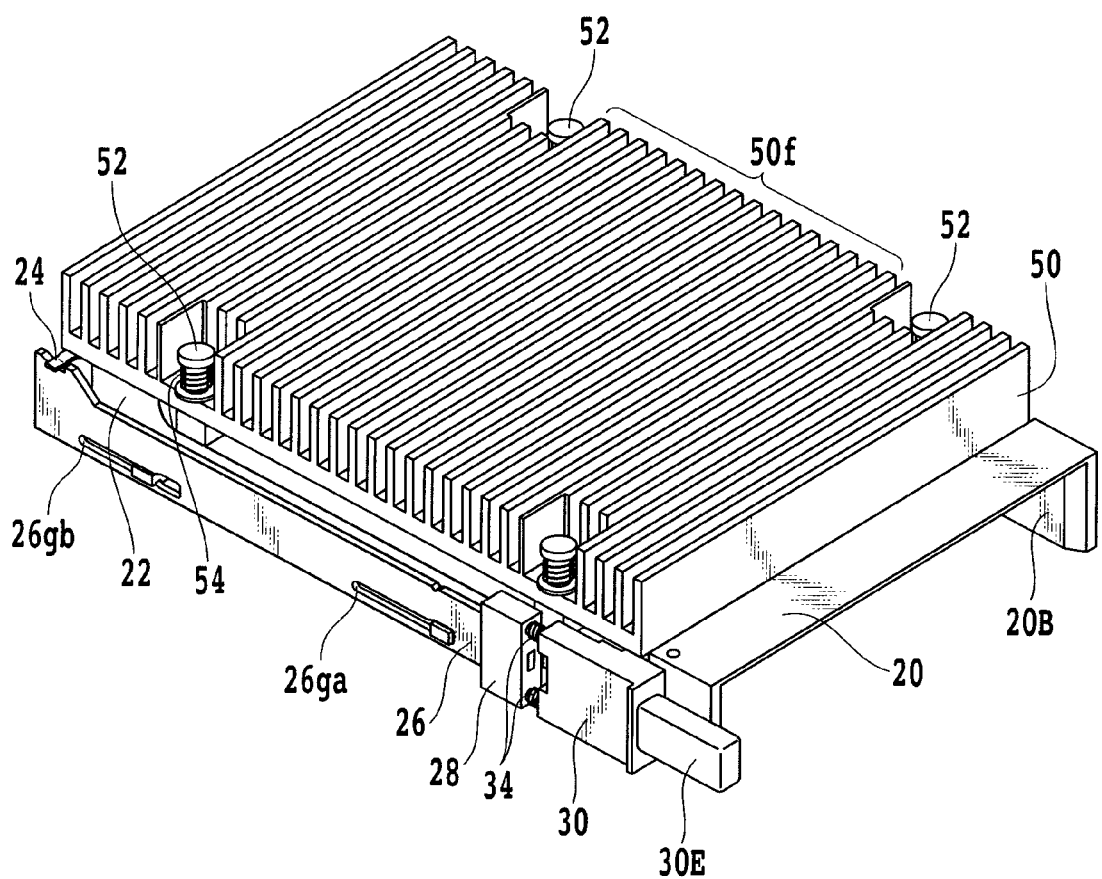
FIG. 8 is a perspective view showing a heat sink and an eject mechanism in the example shown in FIG. 2.
Figure 9:
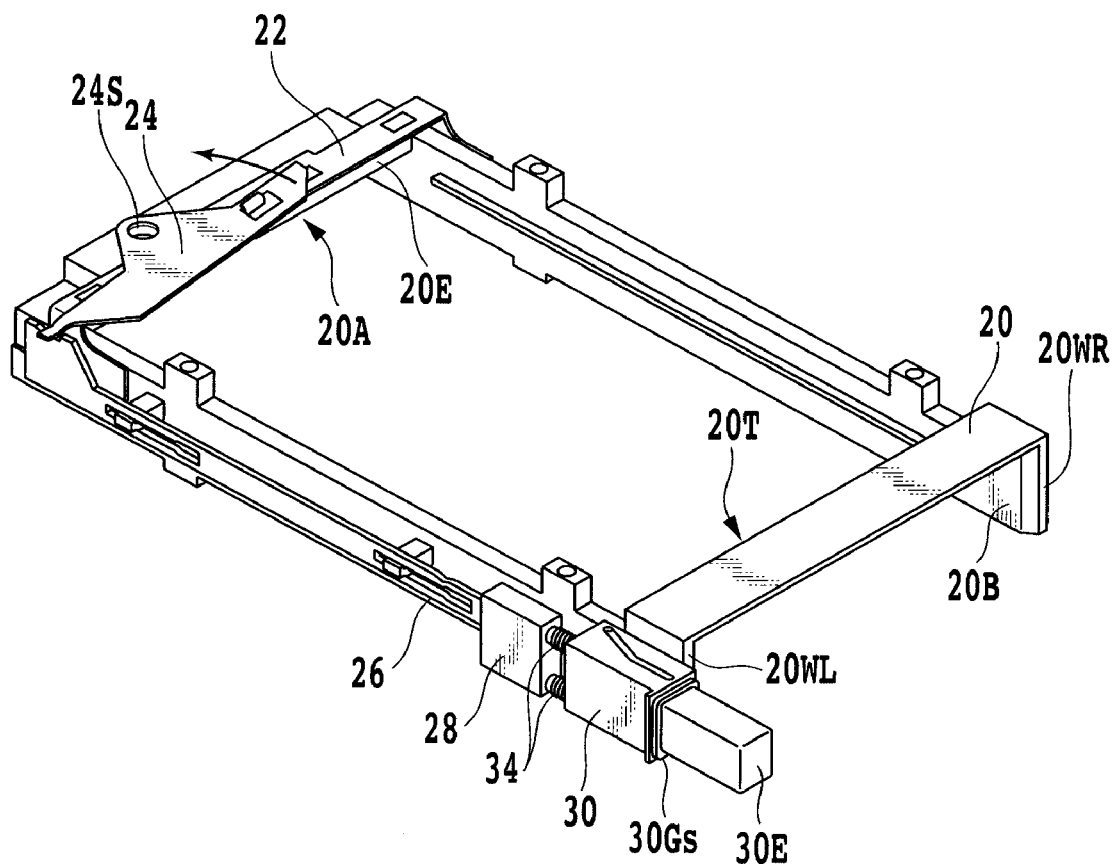
FIG. 9 is a perspective view of the example shown in FIG. 8 from which the heat sink is removed.

As shown in FIG. 1, the guide rail member 20 is fixed onto the printed wiring board 44 by screwing machine screws BS1 into their female screw holes (not shown) through four holes 44*a* of the printed wiring board 44, respectively. As shown in FIGS. 8 and 9, the guide rail member 20 has a portal cross section, and comprises: the module accommodating section 20B to accommodate the module 10; and a connector accommodating section 20A communicating with the module accommodating section 20B and adapted to accommodate the host connector 40 to be described later. The module accommodating section 20B has an opening 20T on the upper side. A raised portion 50R of the heat sink unit to be hereinafter described is to be inserted into the opening 20T. On the edge, facing the module accommodating section 20B, of a section connecting a sidewall section 20WR and a sidewall section 20WL to form the connector accommodating section 20A, formed is an edge 20E for positioning the accommodated module 10 relative to the host connector 40 (see FIG. 9).

Figure 10:
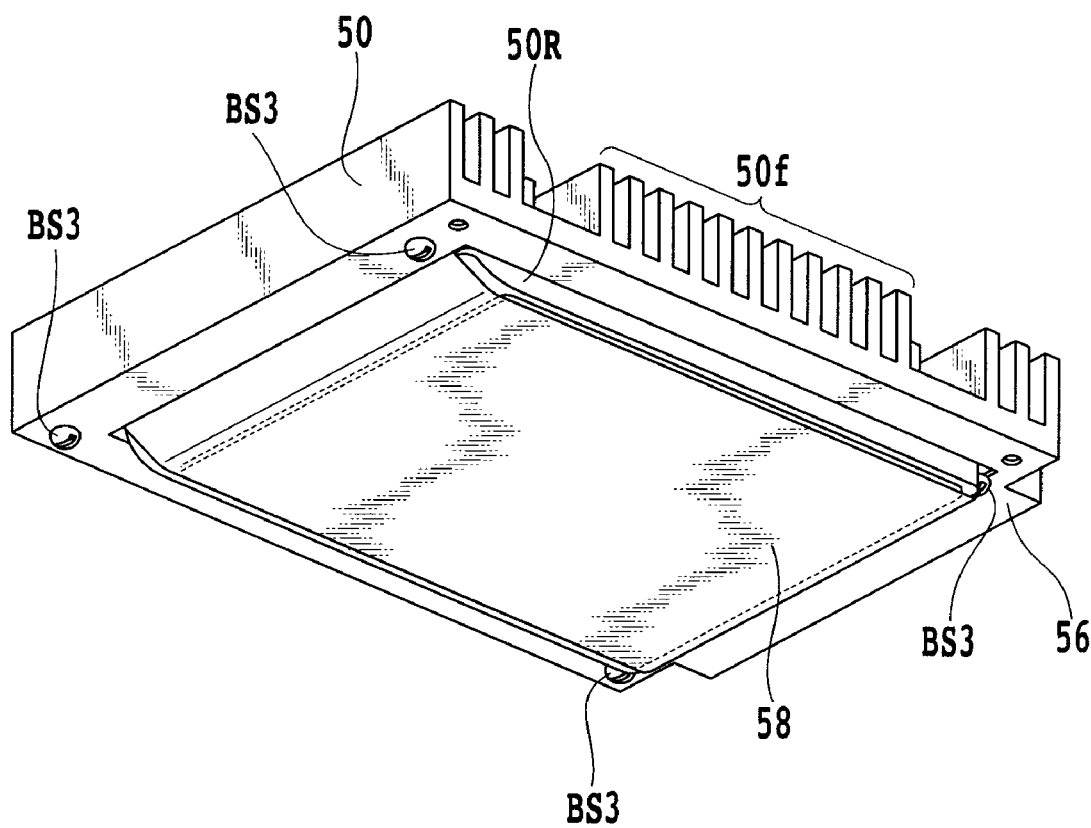
FIG. 10 is a perspective view showing the bottom of the heat sink in the example shown in FIG. 8.

As enlarged in FIG. 10, the heat sink unit includes a heat sink 50 having multiple heat-dissipating fins 50*f*, a thermally conductive sheet 60, a slide sheet 58 and a fixing frame member 56. The thermally conductive sheet 60 and the slide sheet 58 are stacked in this order on the raised portion 50R of the heat sink 50 and fixed thereto. The fixing frame member 56 is used to fix the thermally conductive sheet 60 and the slide sheet 58 to the heat sink 50.

On one of the surfaces of the heat sink 50, the heat-dissipating fins 50*f* each having an approximately rectangular cross section are formed in parallel to one another at predetermined intervals. In addition, on the surface, opposite to the heat-dissipating fins 50*f*, of the heat sink 50, the raised portion 50R is formed. On one of the ends of the raised portion 50R, an inclined surface portion is formed.

Figure 11:
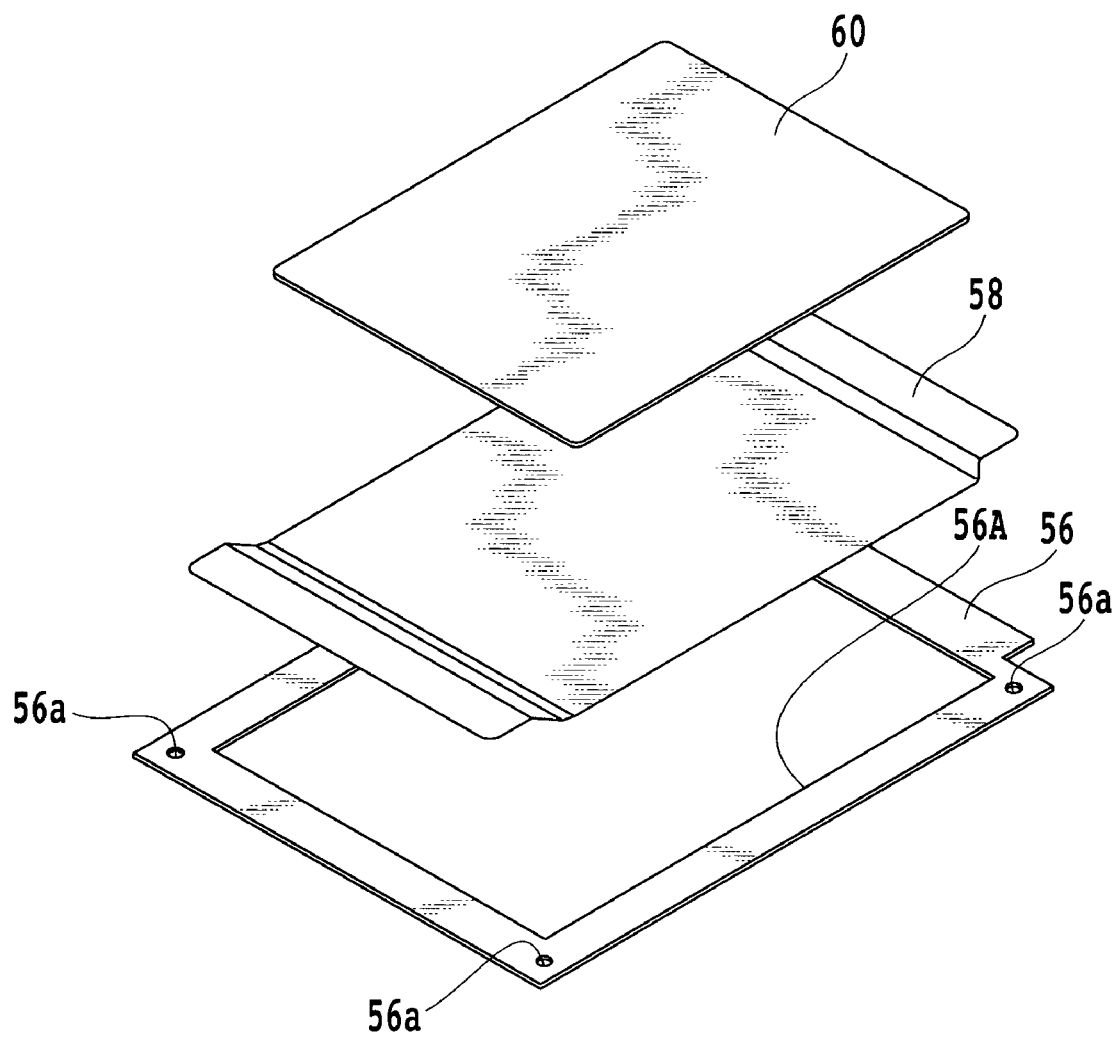
FIG. 11 is a perspective view showing a fixing frame member, a slide sheet and a thermally conductive sheet which are to be attached to the heat sink in the example shown in FIG. 8.
Figure 12:
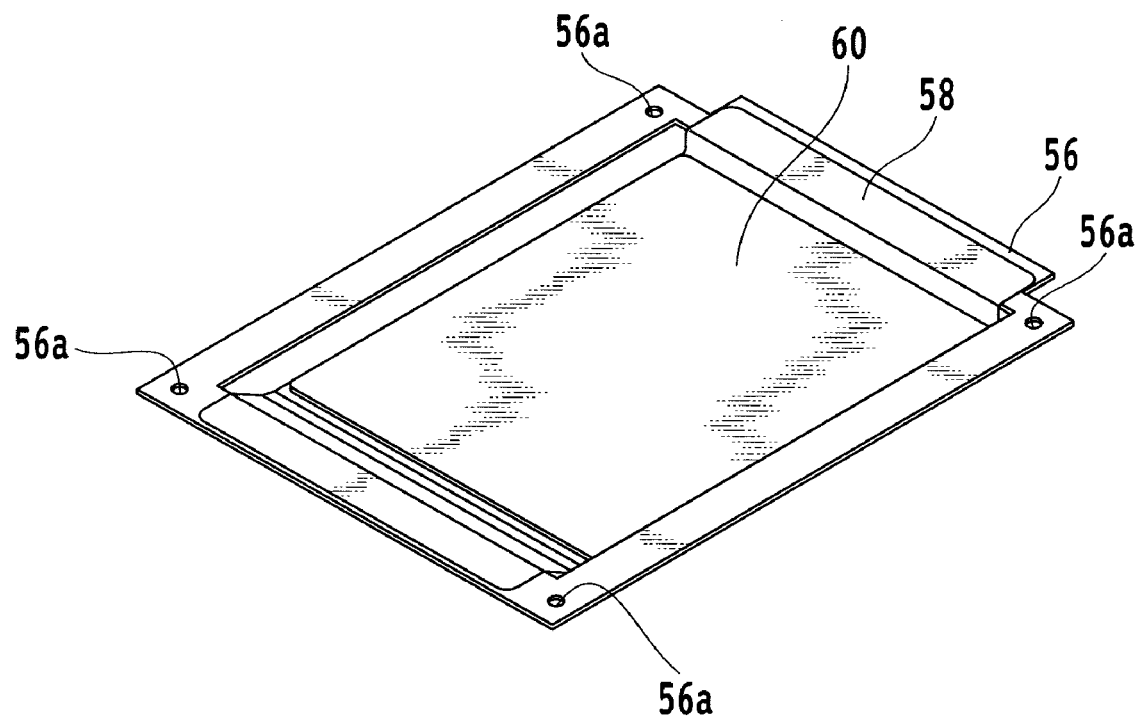
FIG. 12 is a perspective view showing an assembly of the fixing frame member, the slide sheet and the thermally conductive sheet shown in FIG. 11.

The surface of the raised portion 50R comes in contact with the thermally conductive sheet 60 that efficiently conducts heat to the raised portion 50R. The thermally conductive sheet 60 is formed in a thickness of approximately 0.5 mm, for example. As shown in FIG. 11, the slide sheet 58, which is formed integrally with metal foil, is stacked on the thermally conductive sheet 60. The slide sheet 58 needs only to have adequate durability and a relatively small friction coefficient, and may be made of a material such as YFLEX (registered trademark). Alternatively, the slide sheet 58 may be made of a composite material comprising a copper film having a thickness of 0.012 mm and a liquid crystal polymer (LCP) film having a thickness of 0.0381 mm. In this case, the surface of either the copper film or the liquid crystal polymer (LCP) film of the slide sheet 58 may be in contact with the thermally conductive sheet 60. In addition, a heat-transfer silicon grease may be applied between the surface of the raised portion 50R and the surface of the thermally conductive sheet 60 placed on the slide sheet 58 made of the above-described composite material.

The fixing frame member 56 has an opening 56A in the center in which the raised portion 50R is to be inserted into the opening 56A. Multiple holes 56*a* are formed at the periphery of the opening 56A. A machine screw BS3 is to be inserted into each hole 56*a*. After the machine screws BS3 are screwed into their female screw holes of the heat sink 50 through the holes 56*a*, respectively, the fixing frame member 56 presses, against the heat sink 50, both ends of the slide sheet 58 provided on the raised portion 50R with the thermally conductive sheet 60 interposed therebetween, and thus fixes both ends of the slide sheet 58 to the heat sink 50.

The above-described heat sink unit is supported on the guide rail member 20 with guide screws 52 inserted into four holes formed among the heat-dissipating fins 50*f* so that the heat sink unit can move up and down with respect to the guide rail member 20. Each guide screw 52 is screwed into a female screw hole 20S of the guide rail member 20 through a coil spring 54. The female screw holes 20S are formed in the upper edges of the sidewall sections 20WR and 20WL, which form the periphery of the opening 20T. Thereby, as shown in FIG. 13A, the coil springs 54 bias the heat sink unit in such a direction that the raised portion 50R can come closer to the inside of the module accommodating section 20B.

Note that the thermally conductive sheet 60 or the slide sheet 58 need not necessarily be used if the raised portion 50R of the heat sink 50 is in close contact with the outer peripheral surface of the case 12 of the module 10 while having a good thermal conductivity therebetween. Moreover, metal foil or a relatively thin metal plate may be used in place of the slide sheet 58.

In the case of using the slide sheet 58 but not using the thermally conductive sheet 60, the surface of either the copper film or the liquid crystal polymer (LCP) film of the slide sheet 58 may be in contact with the raised portion 50R. Moreover, in the case of not using the thermally conductive sheet 60, and bringing the raised portion 50R into contact with the surface of either the copper film or the liquid crystal polymer (LCP) film of the slide sheet 58, a thermally conductive silicon grease may be applied between the surface of the raised portion 50R and the surface of the thermally conductive sheet 60.

Figure 13A:
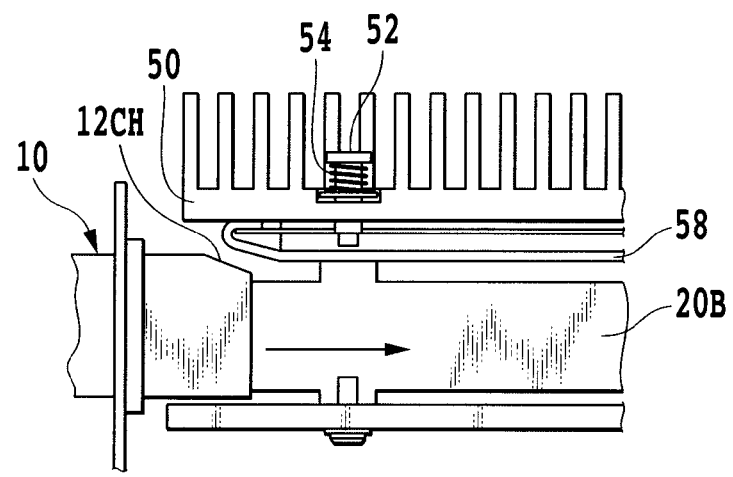
FIG. 13A is a partial cross-sectional view made available for illustrating an operation of a heat-sink support structure.
Figure 13B:
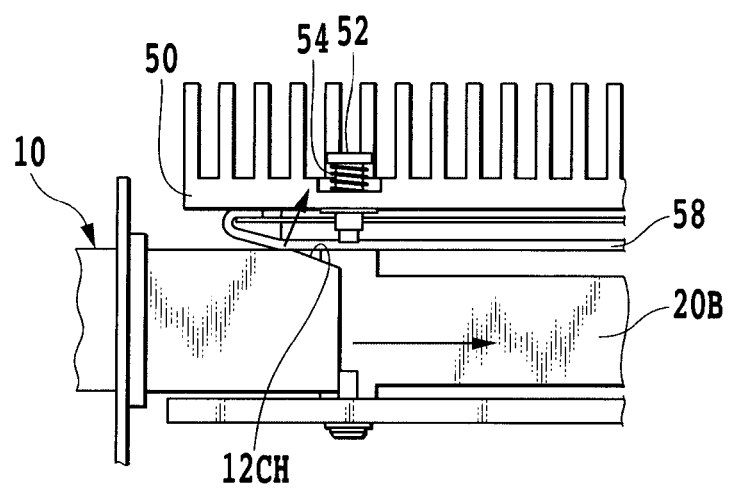
FIG. 13B is a partial cross-sectional view made available for illustrating the operation of the heat-sink support structure.
Figure 13C:
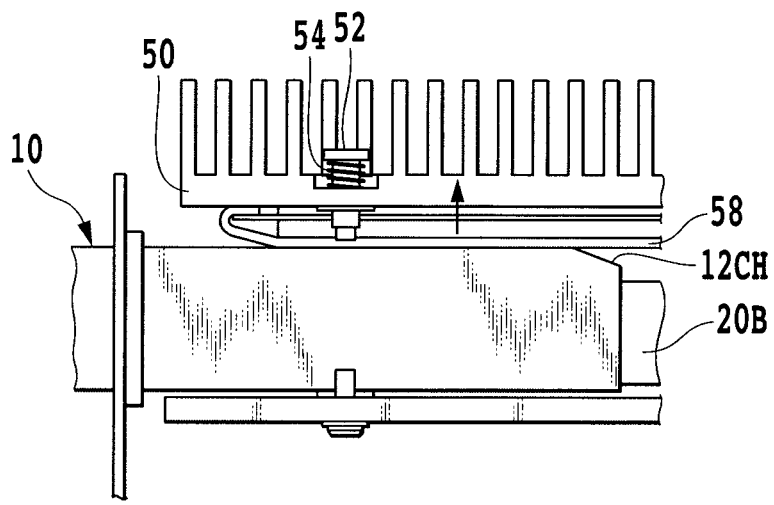
FIG. 13C is a partial cross-sectional view made available for illustrating the operation of the heat-sink support structure.

The above-described structure of the heat sink unit enables the following operations as shown in FIG. 13A. When the one end, having the inclined surface portion 12CH, of the module 10 is inserted into the module accommodating section 20B in the direction indicated by the arrow shown in FIG. 13A, the inclined surface portion 12CH of the case 12 of the module 10 reaches and thus comes into contact with the inclined surface portion of the raised portion 50R of the heat sink 50 as shown in FIG. 13B. Hereby, the heat sink unit starts to move up in the direction indicated by the arrow in FIG. 13B against an elastic force of the coil springs 54. Then, when the module 10 is further pushed in as shown in FIG. 13C, the heat sink unit is moved up in the direction indicated by the arrow in FIG. 13C to reach the uppermost position against the elastic force of the coil springs 54. This causes the module 10 to be pushed in while contiguously sliding the upper surface of the case 12 of the module 10 on the slide sheet 58 as above. In addition, while the heat sink unit is held at the uppermost position, the upper surface of the case 12 of the module 10 is in close contact with the slide sheet 58.

Thus, the structure allows the heat sink unit to be lifted up, and the case 12 of the module 10 to come into contact with the slide sheet 58, simply by inserting the module 10 into the module accommodating section 20B. Moreover, the small surface friction coefficient of the slide sheet 58 provides an effect of allowing the module 10 to be inserted with a low insertion force.

In the case where the slide sheet 58 is integrally formed of, for example, a film and metal foil, the film is reinforced with the metal foil which resists tearing. Accordingly, the slide of the module 10 might damage the film, but will never completely tear off the film on the whole as the metal foil is resistant to break. In addition, the thermally conductive sheet 60 can suppress reduction in thermal conductivity between the heat sink unit and the module 10 caused by surface roughness and unevenness of the case 12 of the module 10. Moreover, designing, as separate units, the heat sink 50 and other related components such as the slide sheet 58 and the thermally conductive sheet 60 has an advantage of enabling different specialized manufacturers to manufacture the heat sink 50 and the slide sheet 58, both of which require a technical know-how for manufacture.

As shown in FIGS. 1 and 9, the eject mechanism 38 supported by the above-described guide rail member 20 includes, as main components, an ejector 22, an eject cam member 24 and an eject lever member 26. The ejector 22 has a pair of bent pieces 22K, and, in ejecting the module 10, moves the module 10 along the guide rail member 20 to push out the module 10 through the opening 102A. The eject cam member 24 transmits an operating force to the ejector 22 in order to move the ejector 22 along the sidewall section 20WL of the guide rail member 20. The eject lever member 26 is connected to the eject cam member 24, and transmits an operating force exerted on the eject button 30 to the eject cam member 24 through coil springs 34 and a spring receptacle 28.

As shown in FIG. 1, the ejector 22 has a gate-like cross section, and movably supported on the outer peripheral surfaces of the respective sidewall sections 20WL and 20WR of the guide rail member 20. The ejector 22 has two elongated holes 22a in each of its side sections respectively facing the sidewall sections 20WL and 20WR. These two elongated holes 22a respectively engage with two guide pins provided at predetermined intervals on the corresponding one of the sidewall sections 20WL and 20WR. The ejector 22 is also provided with a connecting piece formed at approximately the center of a connecting section connecting these side sections. The connecting piece is connected to an engaging hole provided at one end of the eject cam member 24. In addition, the paired bent pieces 22K (see FIG. 1) are provided at positions near both ends of the connecting section, which are on the opposite sides across the connecting piece. At the time of ejecting the module 10, the bent pieces 22K engage with the end, having the inclined surface portion 12CH, of the case 12 of the module 10.

The eject cam member 24 is made of a thin metal plate and has the engaging hole at the one end, and a connecting end at the other end. The engaging hole is to engage with the connecting piece as described above, while the connecting end is to engage with a notch of the eject lever member 26. In addition, a rotation shaft 24S is provided at approximately the center of the eject cam member 24. The rotation shaft 24S is fixed to an upper portion of the connector accommodating section 20A of the guide rail member 20. This structure allows the eject cam member 24 to rotate about the rotation shaft 24S in the direction indicated by the arrow, namely, in a counterclockwise direction in FIG. 9 at the time of installing the module 10, and, meanwhile, in a clockwise direction in FIG. 9 at the time of ejecting the module 10.

The eject lever member 26 is made of a thin metal plate, and has two elongated holes 26ga and 26gb formed at predetermined intervals. The elongated holes 26ga and 26gb movably engage with the respective guide pins that are provided to the sidewall section 20WL of the guide rail member 20 through one of the side sections of the ejector 22.

The notch is formed at one end, in contact with the eject cam member 24, of the eject lever member 26. Thereby, the eject lever member 26 is supported so as to freely move with the eject cam member 24 along the sidewall section 20WL in inserting and ejecting directions of the module 10.

In addition, the spring receptacle 28 is connected to an end, closer to the connector accommodating section 20B of the guide rail member 20, of the eject lever member 26.

The spring receptacle 28 has holes at an end. These holes receive one ends of the respective coil springs 34.

The eject button 30 is connected to the other ends of the respective coil springs 34.

As shown in FIG. 9, the eject button 30 consists of a guide section and the operation section 30E. The guide section guides a guide pin 32GP to be described later. The operation section 30E is connected to the guide section and protrudes outside through the hole 102a of the module guide 102. The guide section of the eject button 30 is movably supported by a support (not shown) of the guide rail member 20. The guide section has a first guide groove 30SL and a second guide groove 30G. A guide arm 32A of the locking member 32 is inserted into the first guide groove 30SL, while the second guide groove 30G guides the guide pin 32GP provided to the guide arm 32A. The locking member 32 will be described later.

The first guide groove 30SL is formed in a portion, facing the outer peripheral surface of the sidewall section 20WL, of the guide section. The first guide groove 30S has an elongated shape having a predetermined length and extending in the inserting and ejecting directions of the module 10 to reach one end of the guide section. The second guide groove 30G is formed so as to intersect with the first guide groove 30SL. The second guide groove 30G consists of a parallel groove and an inclined groove. The parallel groove is formed near the surface of the guide section opposite to the surface facing the outer peripheral surface of the sidewall section 20WL. The inclined groove, which communicates with the parallel groove, is formed so as to gradually come closer to the surface, facing the outer peripheral surface of the sidewall section 20WL, of the guide section, as coming closer to the spring receptacle 28.

Figure 14:
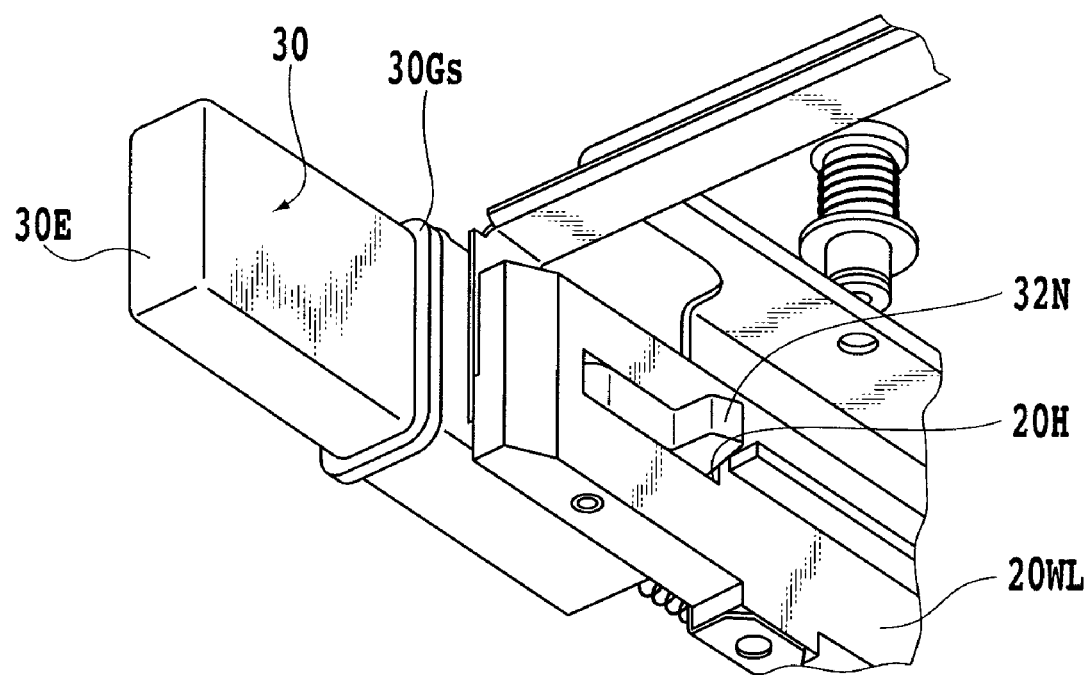
FIG. 14 is an enlarged perspective view of part of the eject mechanism shown in FIG. 8.
Figure 15:
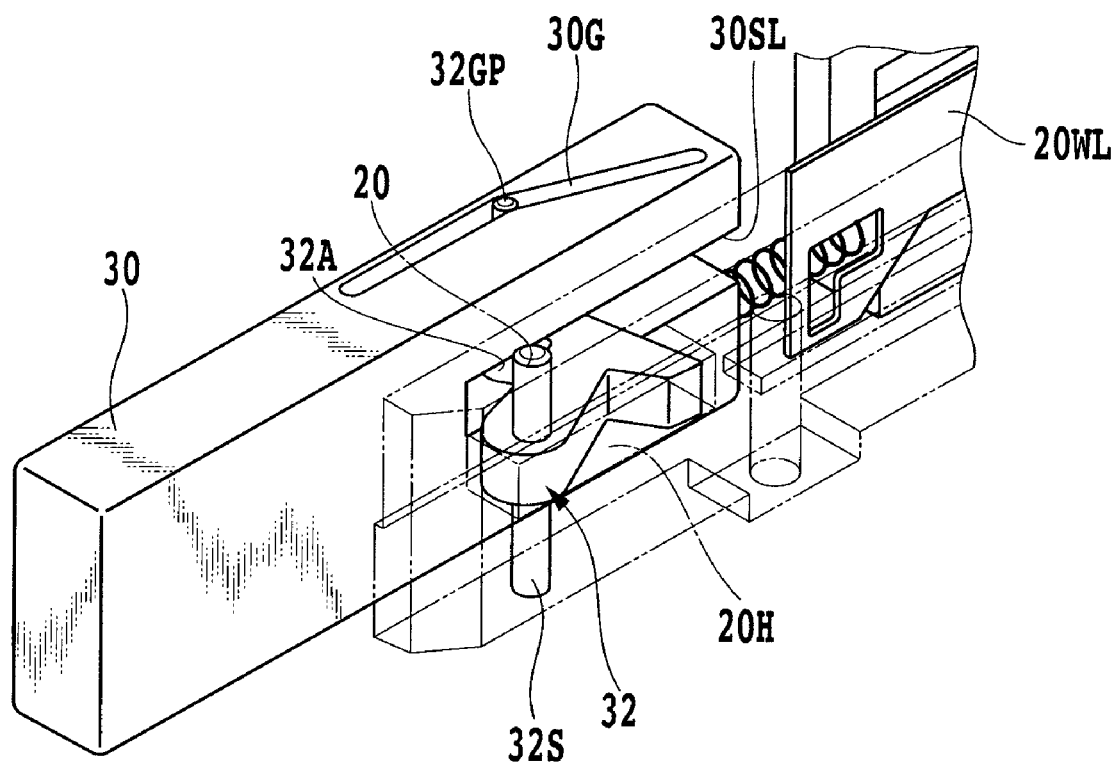
FIG. 15 an enlarged perspective view of part of the eject mechanism shown in FIG. 8.

The locking member 32 to be described later can be switched between a lock state and an unlock state. When the locking member 32 is in the lock state, the locking nib 32N engages with the recess 12D of the module 10, and thereby the module 10 accommodated in the module accommodating section 20B is locked therein. The locking member 32 switches to the unlock state, if the locking nib 32N becomes disengaged from the recess 12D of the module 10 in response to an operation of the eject button 30. Note that FIG. 14 shows the lock state of the locking member 32, while FIG. 15 shows the unlock state of the locking member 32.

This structure enables the following movements of the locking member 32. Firstly, suppose the case where the eject button 30 is moved toward the spring receptacle 28. In this case, the guide pin 32GP moves sequentially through the inclined groove and the parallel groove of the second guide groove 30G, which rotates the locking member 32 in a counterclockwise direction in FIG. 15 about a support shaft 32S to be described later. Secondly, suppose the case where a biasing force of the coil springs 34 moves the eject button 30 away from the spring receptacle 28. In this case, the guide pin 32GP moves sequentially through the parallel groove and the inclined groove of the second guide groove 30G, which rotates the locking member 32 in a clockwise direction in FIG. 15.

Figure 16:
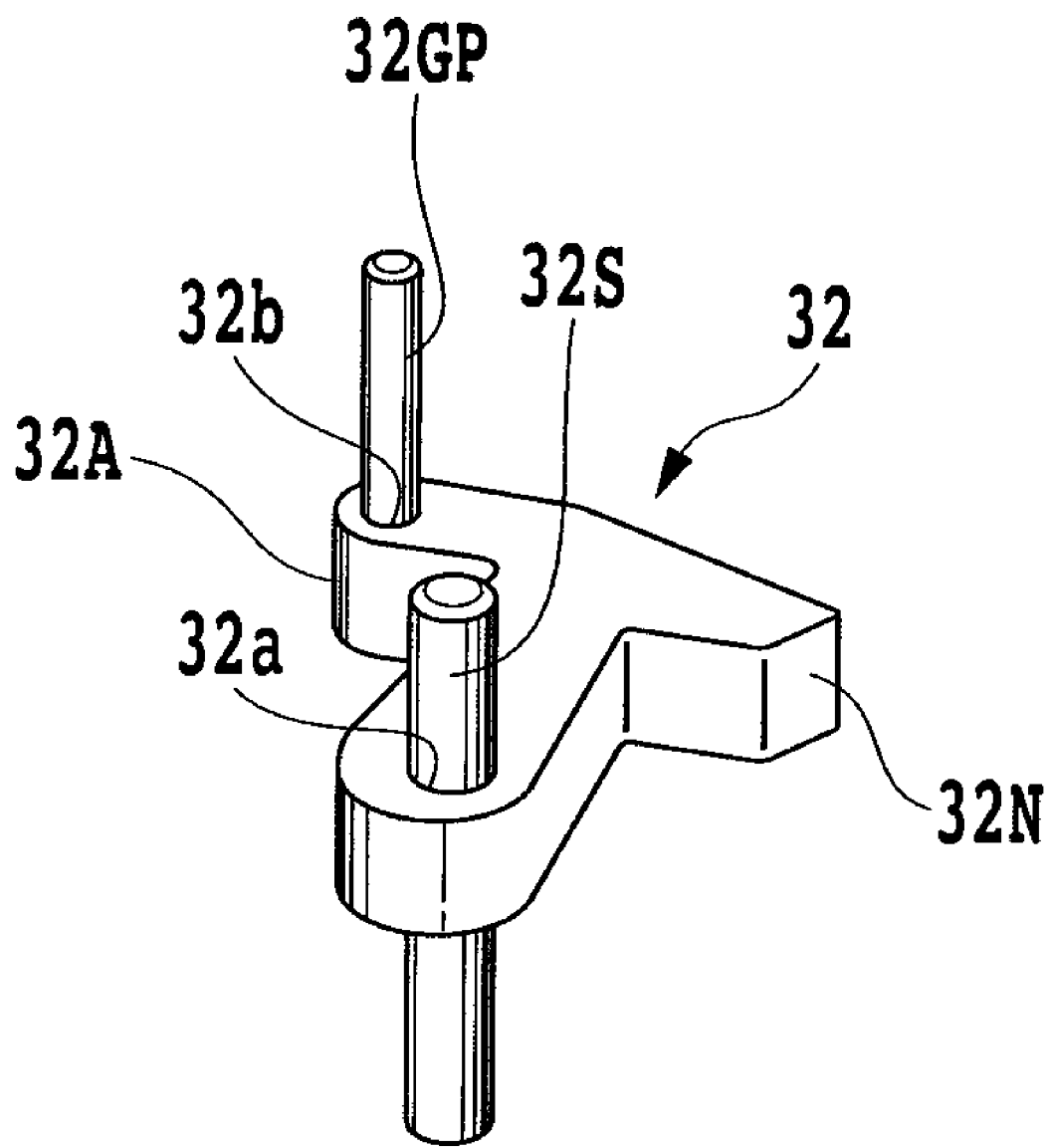
FIG. 16 is a perspective view of a locking member used in the eject mechanism shown in FIG. 8.

As enlarged in FIG. 16, the locking member 32 includes a rotation arm section, the locking nib 32N and the guide arm 32A. The rotation arm section has a hole 32a to which the support shaft 32S is to be inserted. The support shaft 32S is supported in a through hole provided in an end of the sidewall section 20WL. The locking nib 32N and the guide arm 32A are integrally formed at an end of the rotation arm section so that the locking member 32 can have an approximately T-shape. The hole 32a is drilled through the rotation arm section in a direction perpendicular to its flat sides. The thickness of the rotation arm section is set less than the short side dimension of an approximately rectangular through hole 20H formed on the end of the sidewall section 20WL. The through hole through which the support shaft 32S is to pass is drilled through the sidewall section 20WL in a direction perpendicular to the long sides of the through hole 20H.

The guide arm 32A has a hole 32b in which the guide pin 32GP is fitted. The guide pin 32GP is provided approximately in parallel to the support shaft 32S. The guide arm 32A is inserted in the through hole 20H and the first guide groove 30SL. The guide pin 32GP is slidably engaged with the second guide groove 30G.

In the eject button 30, a collar 30Gs is formed at the connection between the guide section and the operation section 30E. The collar 30Gs may be formed integrally with the guide section or the operation section 30E, or separately formed of a seal material. The collar 30Gs is pressed against the inner peripheral surface of the foregoing housing 100 by the biasing force of the coil springs 34 all the time except for when the module 10 is being ejected, that is, except for when the operation section 30E is pushed in. This means that the spring force presses the eject button 30 against the panel of the housing 100, which prevents noise generated in the housing 100 from leaking outside through a gap between the panel and the operation section 30E of the eject button 30.

Figure 17A:
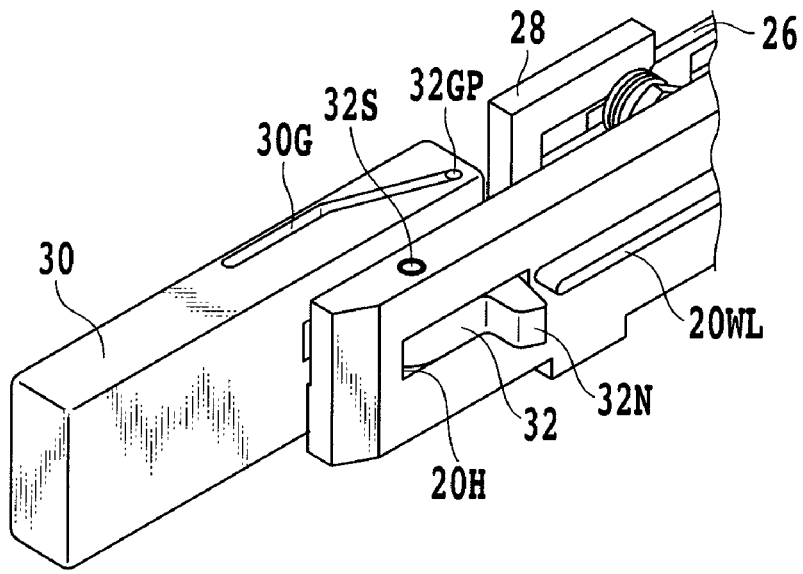
FIG. 17A is a perspective view made available for illustrating an operation of the locking member in the eject mechanism shown in FIG. 8.
Figure 17B:
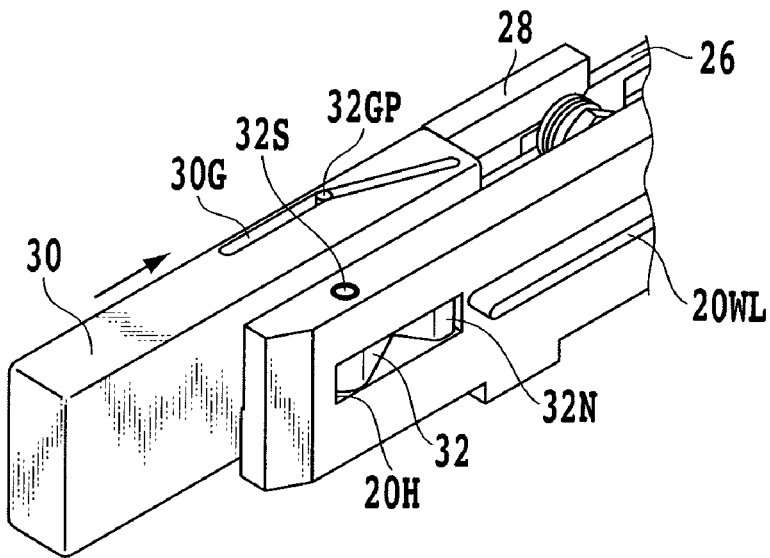
FIG. 17B is a perspective view made available for illustrating the operation of the locking member in the eject mechanism shown in FIG. 8.

In the above-described structure, the locking member 32 is switched from the lock state to the unlock state as follows. In the lock state, the locking nib 32N of the locking member 32 engages with the recess 12D of the module 10, as shown in FIG. 17A. When, with the locking member 32 in this lock state, the eject button 30 is pushed in against the biasing force of the coil springs 34 in the direction indicated by the arrow shown in FIG. 17B till the eject button 30 comes in contact with the spring receptacle 28, the guide pin 32GP of the locking member 32 is guided through the inclined groove of the above-described second guide groove 30G. In this event, the eject lever member 26 does not move at all. Along with this movement of the guide pin 32GP, the locking nib 32N of the locking member 32 starts to move away from the recess 12D and eventually stays in the through hole 20H. As a result, the locking nib 32N of the locking member 32 switches to the unlock state.

Figure 17C:
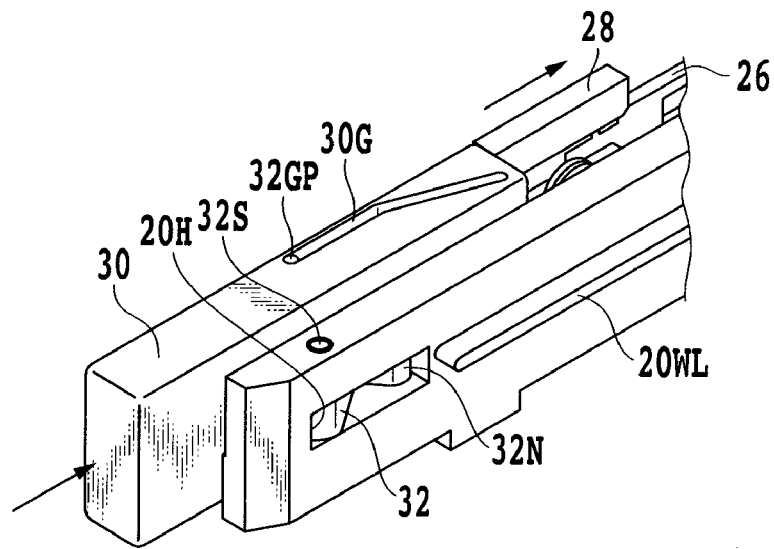
FIG. 17C is a perspective view made available for illustrating the operation of the locking member in the eject mechanism shown in FIG. 8.

Then, when the eject button 30 is further pushed in with its one end in contact with the spring receptacle 28 in the direction indicated by the arrow shown in FIG. 17C, the guide pin 32GP of the locking member 32 is guided through the parallel groove of the above-described second guide groove 30G. In this event, the eject lever member 26 is pushed to move in the direction indicated by the arrow shown in FIG. 17C while the locking member 32 is in the unlock state. Thereby, the above-described eject cam member 24 is rotated to move the ejector 22 in the direction to eject the module 10. As a result, the paired bent pieces 22K of the ejector 22 push the module 10 out of the module accommodating section 20B.

Figure 17D:
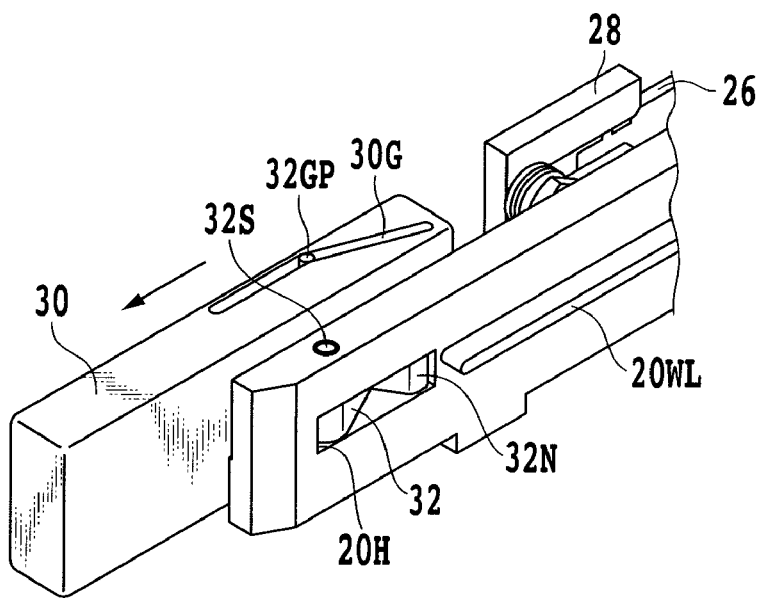
FIG. 17D is a perspective view made available for illustrating the operation of the locking member in the eject mechanism shown in FIG. 8.
Figure 18:
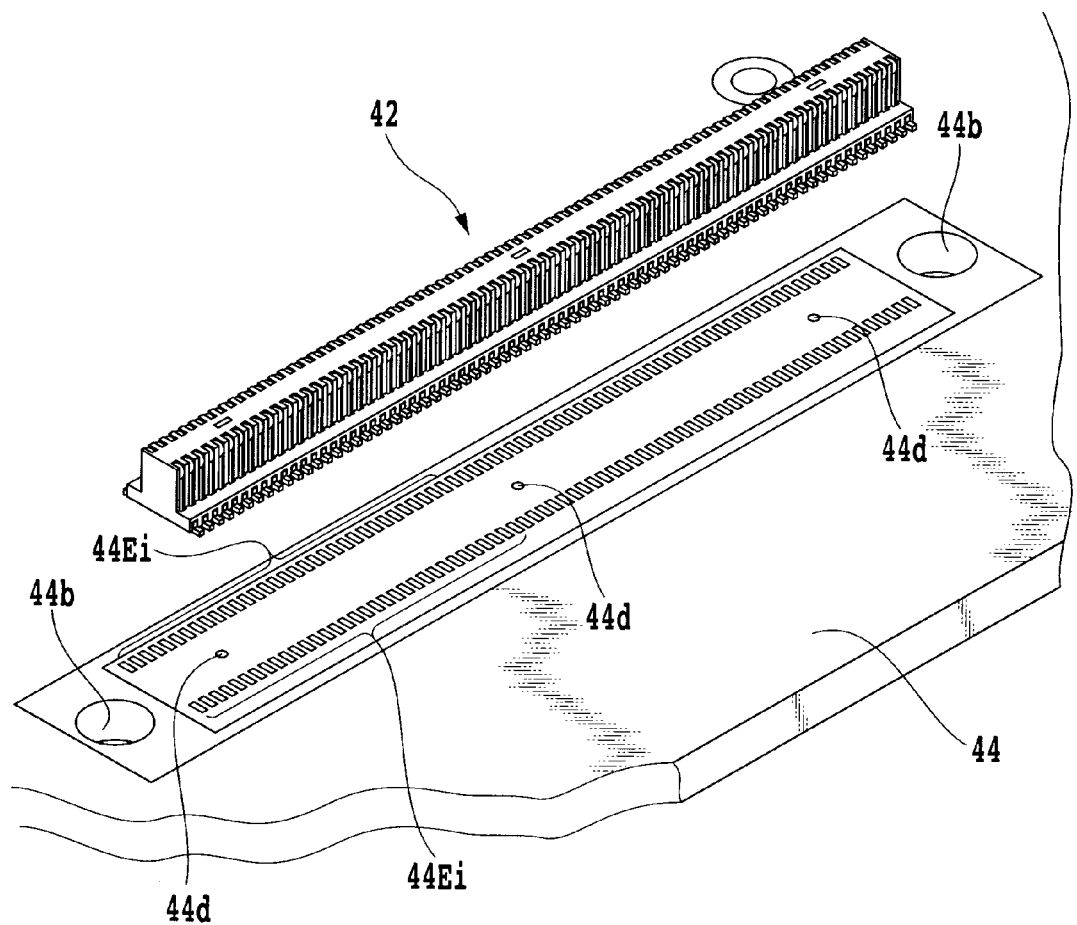
FIG. 18 is a perspective view showing a board connector used in the example of a connector for connection to a module board according to the present invention, as well as the printed wiring board.

Then, when the eject button 30 is released, the biasing force of the coil springs 34 moves the eject button 30 in the direction indicated by the arrow shown in FIG. 17D, namely, in the direction away from the spring receptacle 28. Thereby, the guide pin 32GP of the locking member 32 is guided sequentially through the parallel groove and the inclined groove of the second guide groove 30G. As a result, the locking member 32 comes back to the lock-state position shown in FIG. 17A again.

As shown in FIG. 1, the host connector 40 and the board connector 42 are provided in the connector accommodating section 20A of the guide rail member 20 and in a predetermined position on the printed wiring board 44, respectively.

Figure 19:
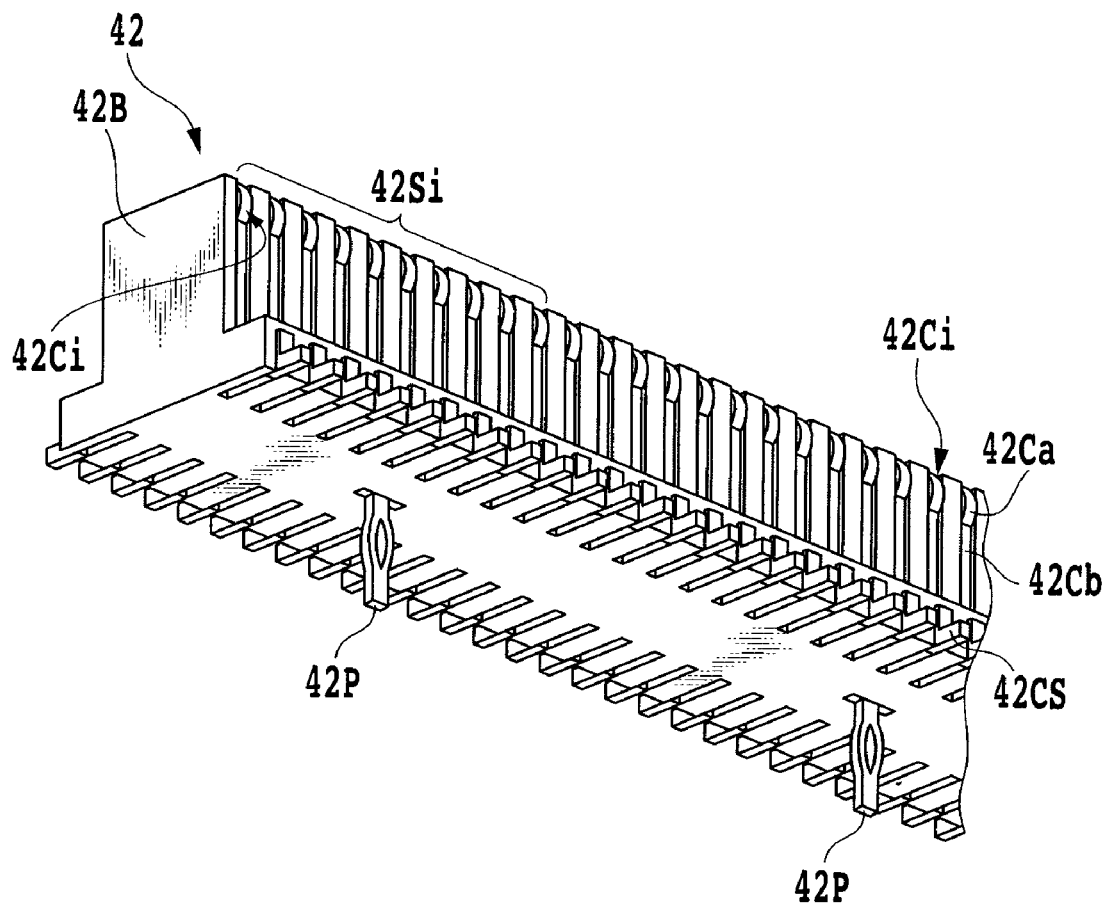
FIG. 19 is a perspective view of the board connector shown in FIG. 18.

As shown in FIG. 19, the board connector 42 includes, as main components, a connector body 42B and contact terminals 42Ci (i=1 to n, where n is a positive integer). The connector body 42B has an inverted T-shaped cross section, and is designed to be fitted into a contact connection section 74C of the host connector 40. The contact terminals 42Ci are provided respectively in slits 42Si (i=1 to n, where n is a positive integer) of the connector body 42B.

On the bottom of the connector body 42B, three metal press-in holders 42P are provided at intervals equivalent to those between holes 44d provided in an end portion of the printed wiring board 44. A contact pad set consisting of two parallel lines of contact pads 44Ei (i=1 to n, where n is a positive integer) is formed in a region, surrounding the holes 44d, of the printed wiring board 44. The contact pads 44Ei are electrically connected to the conductive pattern of the printed wiring board 44.

The connector body 42B is made of a flexible resin and has the slits 42Si arranged at predetermined intervals in a line extending in the longitudinal direction of the connector body 42B. The positions of the slits 42Si correspond to those of the contact pads 44Ei. As enlarged in FIG. 19, each contact terminal 42Ci consists of a fixed terminal section 42CS and a movable terminal section 42Cb. The fixed terminal section 42CS is fixed to one of the contact pads 44Ei by soldering. The movable terminal section 42Cb, which has contact portions 42Ca, is formed to connect to the fixed terminal section 42CS.

Figure 20:
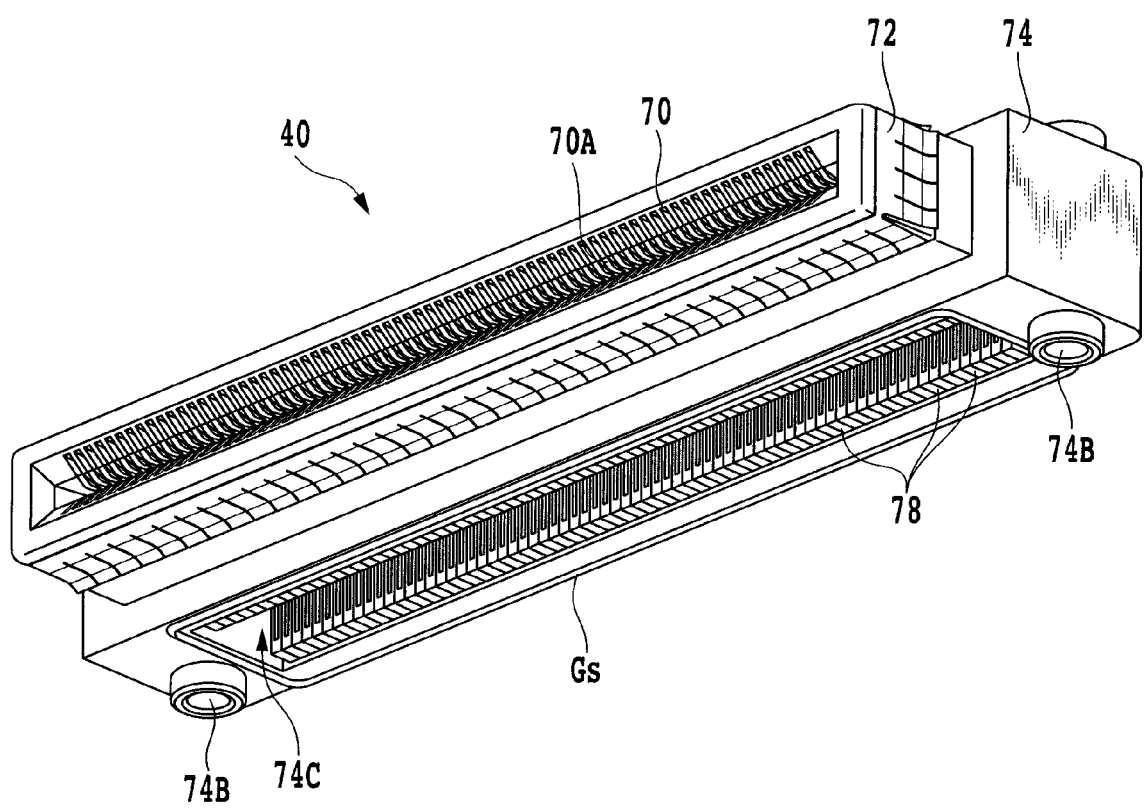
FIG. 20 is a perspective view of a host connector used in the example of a connector for connection to a module board according to the present invention.
Figure 21:
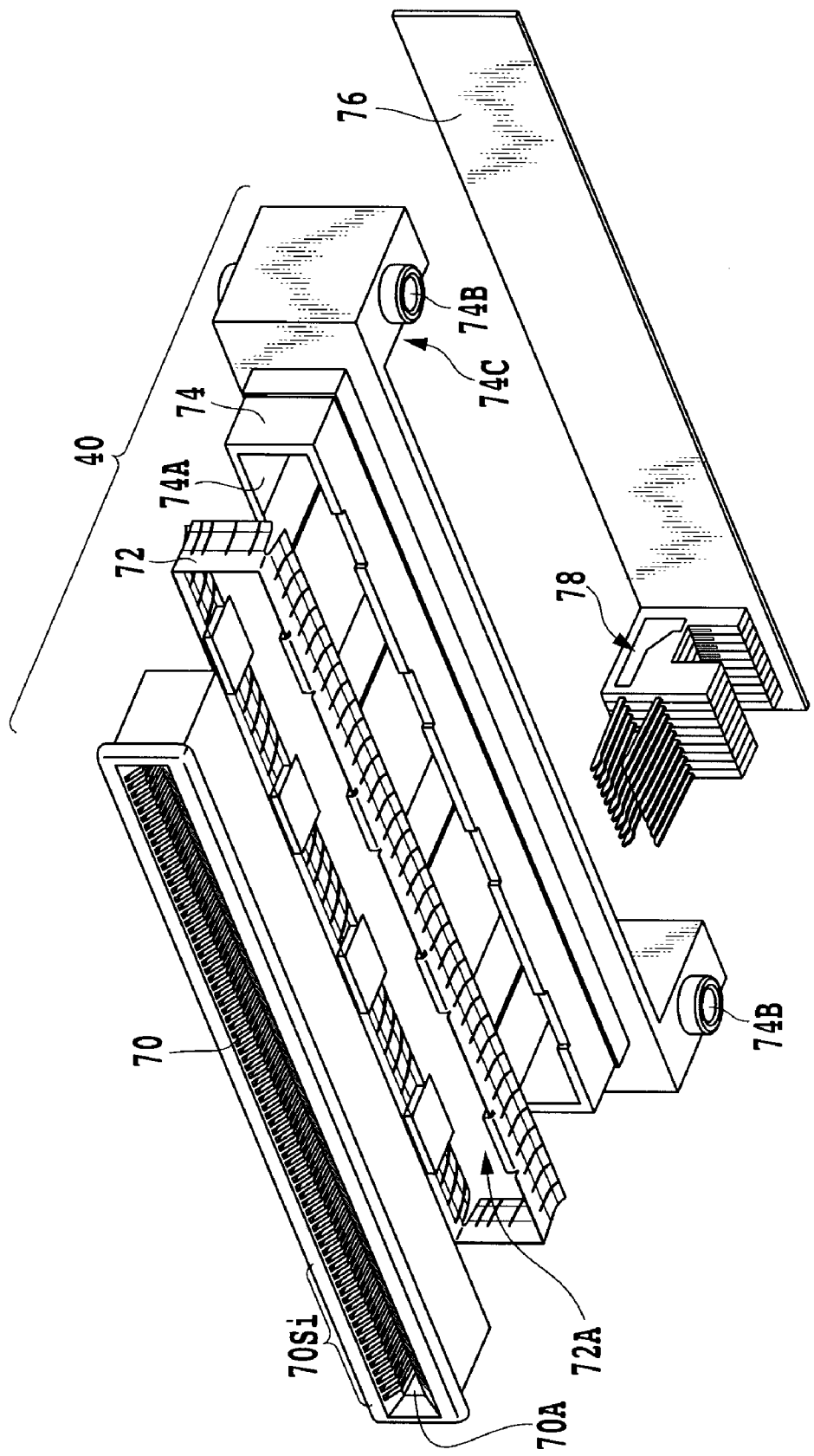
FIG. 21 is an exploded perspective view illustrating a structure of the host connector shown in FIG. 20.

As shown in enlarged views of FIGS. 20 and 21, the host connector 40 includes, as main components, a connector insulator 70, a finger 72 and a die-cast case 74. The connector insulator 70 has a slot 70A in which the above-described connecting terminal groups of the module board 14 are to be detachably inserted. The finger 72 fills a gap between the connector insulator 70 and the above-described opening formed in the end surface 12CE of the module 10. The case 74 has the contact connection section 74C that accommodates multiple contact blades 78.

The connector insulator 70 has slits 70Si (i=1 to n, where n is a positive integer) on its wall section defining the slot 70A. The slits 70Si are arranged at predetermined intervals and each accommodate a pair of contact terminals 78a and 78b of the contact blades 78. The contact terminals 78a and 78b will be described later.

The finger 72 has an opening 72A into which an outer peripheral section of the connector insulator 70 is to be fitted.

The case 74 has a board slot 74A on its front side. An end of the connector insulator 70 is fitted into the board slot 74A. The finger 72 is fitted onto the outer peripheral surface of the board slot 74A. In the contact connection section 74C of the case 74, the multiple contact blades 78 are arranged at positions respectively corresponding to those of the slits 70Si in the slot 70A. In addition, a back plate 76 is fixed to the back side of the case 74. As shown in FIG. 20, a gasket Gs is provided along the periphery of an opening end of the contact connection section 74C. The gasket Gs prevents noise from leaking out. The case 74 has a pair of holes 74B provided at positions outside the gasket Gs. Fixing machine screws BS2 are inserted into the respective holes 74B. After the fixing machine screws BS2 are screwed into their female screw holes in the guide rail member 20 through the holes 74B and holes 44b of the printed wiring board 44 with the host connector 40 and the board connector 42 connected to each other, a portion including the connector accommodating section 20A of the guide rail member 20 is fixed to the printed wiring board 44.

Figure 22:
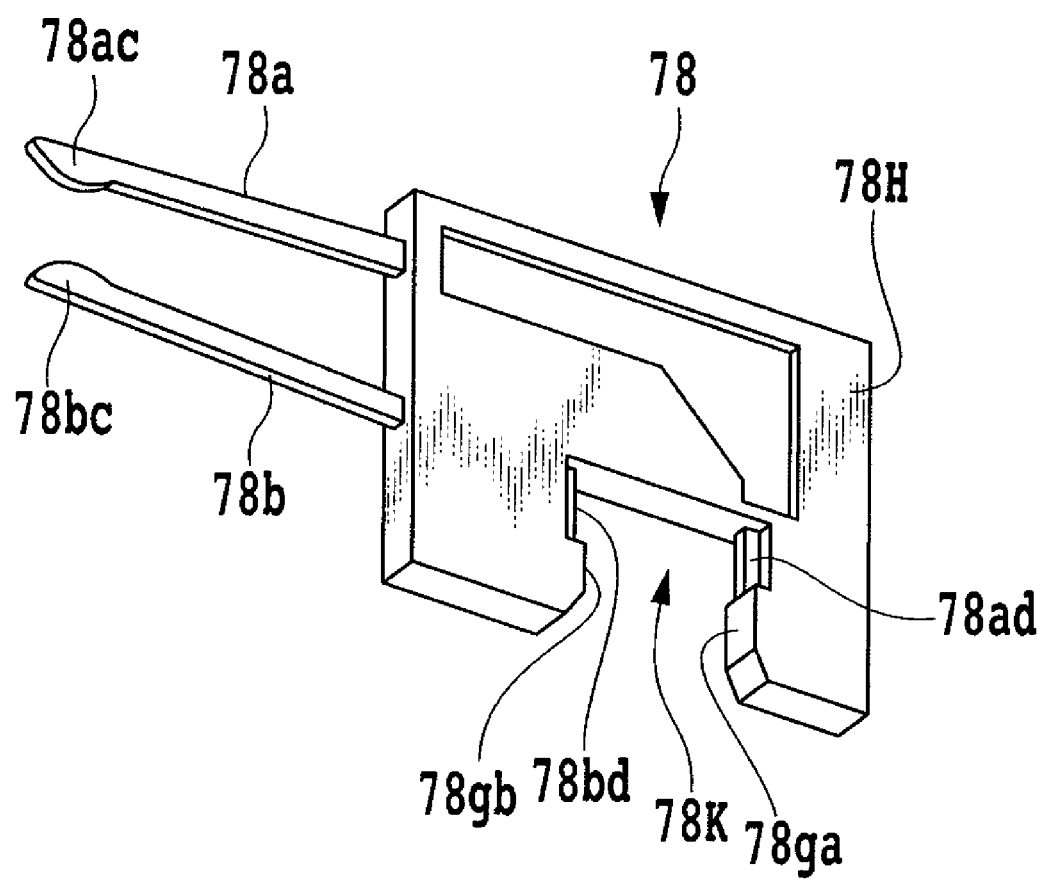
FIG. 22 is a perspective view of a contact blade used in the host connector shown in FIG. 20.
Figure 23:
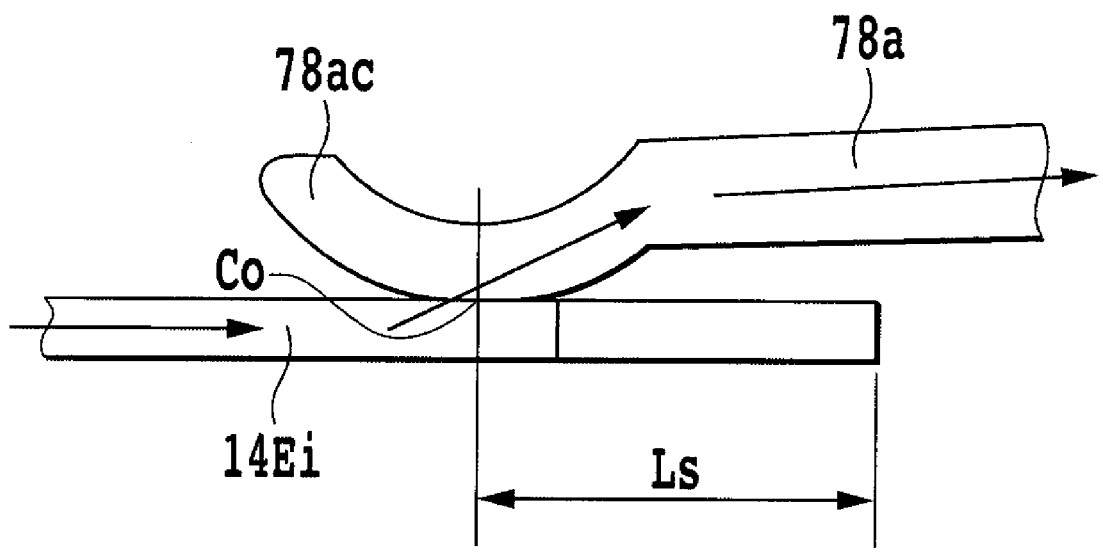
FIG. 23 is a view made available for illustrating a positional relation between a contact portion of the contact blade and a contact pad of a module board.

As enlarged in FIG. 22, each contact blade 78 includes a blade body 78H and contact terminals 78a and 78b, which are formed integrally with the blade body 78H by insert molding.

The blade body 78H has a notch 78K in which an upper portion of the above-described connector body 42B of the board connector 42 is to be inserted. Guide sections 78ga and 78gb are formed as sections defining the notch 78K, which has an approximately rectangular shape. The guide sections 78ga and 78gb, which face each other, are designed to come in contact with the upper portion of the connector body 42B. In addition, a fixed terminal section 78ad of the contact terminal 78a is exposed at a position adjacent to the guide section 78ga, and a fixed terminal section 78bd of the contact terminal 78b is exposed at a position adjacent to the guide section 78gb. The contact terminal 78a has a contact portion 78ac at its elastically displaceable tip end. The contact terminal 78b has a contact portion 78bc at its elastically displaceable tip end.

When the host connector 40 is connected to the board connector 42, the fixed terminal sections 78ad and 78bd of each contact blade 78 are in contact with the above-described contact portions 42Ca of the corresponding contact terminal 42Ci, respectively. Specifically, each of the fixed terminal sections 78ad and 78bd is contact with one of these contact portions 42Ca facing thereto.

In addition, each of the contact portions 78ac and 78bc of the contact terminals 78a and 78b in each contact blade 78 of the host connector 40 is in contact with the corresponding contact pad 14Ei of the module board 14 in the installed module 10. Once the module 10 is installed in the connector for connection to a module board, the end surface 12CE is contact with the edge 20E (see FIG. 9) of the guide rail member 20, and the locking nib 32N of the locking member 32 engages to the recess 12D. Thus, the movement of the installed module 10 in the inserting and ejecting directions is restricted. As a result, the distance Ls from a contact point Co between each contact portion 78ac and the corresponding contact pad 14Ei to the outer end of the contact pad 14Ei does not vary, but is fixed to a predetermined value.

The distance Ls from the contact point Co between each contact portion 78ac and the corresponding contact pad 14Ei to the outer end of the contact pad 14Ei is equivalent to the stub length of a signal transmission line. Accordingly, an increase in the distance Ls causes degradation of return loss (dB) (transmission performance degradation). Thus, particularly when the signal frequency exceeds 10 GHz, appropriate setting of the distance Ls is critical. For example, the distance Ls is set to approximately 0.3 mm, which is determined based on the results shown in FIG. 24 of the return loss (dB) simulation conducted by the inventor of the present invention.

Figure 24:
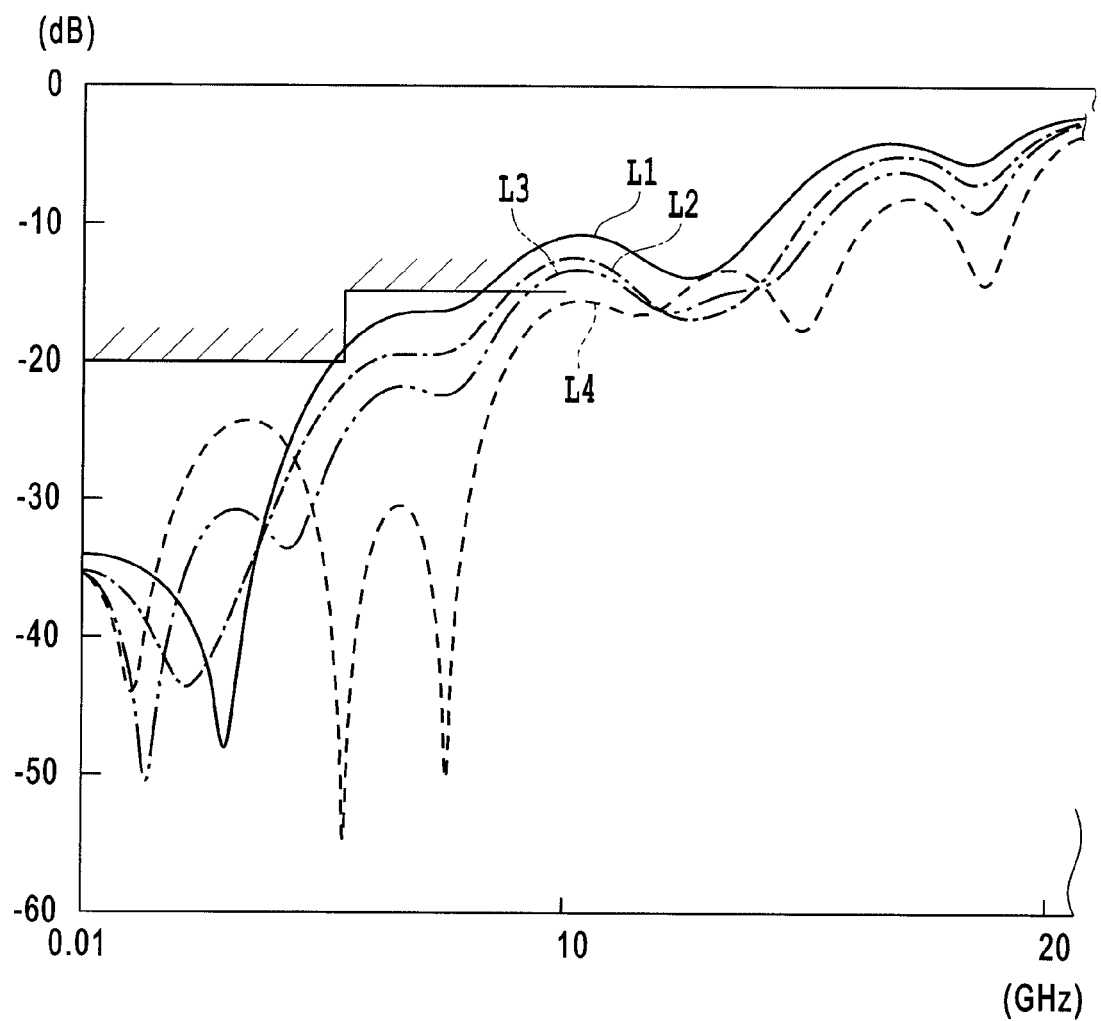
FIG. 24 is a characteristic graph showing characteristic lines representing the return loss of a host connector used in the example of a connector for connection to a module board according to the present invention.

FIG. 24 is a graph with return loss (dB) on the vertical axis and frequency (GHz) on the horizontal, and shows return loss characteristic lines L1 to L4. The characteristic lines L1 to L4 are obtained when the distance Ls is set to 2.0 mm, 1.5 mm, 1.1 mm and 0.31 mm, respectively.

As is clear from the simulation results, in order to set the return loss to around −15 dB when the signal frequency is 10 GHz, the distance Ls needs to be set to around 0.3 mm.

(1) In the foregoing example, a member holding the host connector 40 and a member holding the locking member 32 are integrated into a single member. This reduces a tolerance in combining the locking member 32 and the connection section of the host connector 40 for a module board, and thus reduces horizontal backlash of the connection section. The backlash reduction further enables reduction in the stub length causing transmission performance degradation in a high-speed transmission connector.

Moreover, unlike the foregoing example, a typical connector is fixed to a printed wiring board by a method such as soldering. Accordingly, when the typical connector is mounted on the printed wiring board, only a host connector is firstly mounted onto the printed wiring board, and then a frame member is mounted thereon. This produces an additional mounting tolerance between the host connector and the frame member. In general, the tolerance is around ±0.2 mm (0.4 mm). This dimensional difference will produce backlash between a position of a module being in close contact with the host connector, and a position of the module fixed by the locking member. Accordingly, in order to maintain contact with the contact terminals even if such backlash is produced, each contact pad of the module has to have a margin between a contact point and a contact end point at which the contact with the corresponding contact terminal becomes broken. When a module is in close contact with the host connector, the contact point is positioned closer to the rear of the connector than the contact end point.

In a high-speed transmission line, an extra conductive portion protruding from a line through which a signal is actually transmitted is called "stub," which is one of factors that degrade transmission performance of the transmission line. In a high-speed transmission connector of a 10 Gbps class, the stub is desired to be reduced to around 1 mm. Thus, it is highly advantageous that 0.4 mm reduction of the stub is achieved only by combining the connectors.

(2) In addition, the printed wiring board 44 as described above generally has warpage. Thus, when a surface mount technology (SMT) connector is used as a board connector and thus soldered onto a printed wiring board, the SMT connector must be conformed to warpage of the printed wiring board so that contact terminals of the SMT connector can be in close contact with pads of the printed wiring board. In general, warpage of a printed wiring board is around 0.8% of its length. Thus, when used as a multipin board connector, a typical SMT connector becomes so long that soldering faces of its terminals will not be in contact with the pads. Under this condition, soldering is impossible. For example, a warpage of 0.48 mm occurs at the center of a connection region for a connector whose inter-terminal distance is 60 mm.

However, an SMT connector having a flat fitting surface includes contacts bent at 90 degrees, and a connector insulator having some size and high rigidity. Thus, it is difficult to deform the connector so as to conform it to warpage of a printed wiring board. Even if the connector is bent by force and soldered onto the printed wiring board, the resilience of the connector attributable to its rigidity might cause the solder joints to come off.

This problem can be solved by a method as employed in the foregoing example. In the above-described method, aboard connector flexible enough to conform to warpage of a printed wiring board is used as a first connector and soldered onto the printed wiring board, and then a host connector serving as a second connector is fitted onto the first connector.

In other words, if a sufficient fitting stroke is secured, the fitting stroke can accommodate a warpage difference between the first and second connectors event if the first connector has the same warpage as that of the printed wiring board. The board connector can be conformed to warpage of the printed wiring board by any of the following methods: providing the press-in holders 42P respectively on the center and both ends of the board connector as in the foregoing example; pressing in holding terminals at the time of mounting the connector with a mounter; and press-soldering the terminals of the connector onto the board by using a solder jig such a heat press-fit. In this method, if the solder terminals of the board connector have vertical flexibility, the warpage-conforming capability of the board connector can be further increased.

(3) In another method for preventing solder joints of the board connector from coming off, a solder ball is attached to the tip of each terminal of the board connector so that warpage corresponding to the size of the ball can be accommodated. In this method, if the above-described second connector having a flat fitting surface is directly soldered onto a printed wiring board, a shear force is applied to the solder joints. Accordingly, the solder joints might be broken off after module inserting and ejecting operations are repeated in the connector. According to the present invention, the board connector and the host connector are formed as separate members, and the guide sections 78ga and 78gb, and the outer peripheral surface of the connector body 42B are provided as contact portions between the first connector and the second connector. This structure allows the contact portions to absorb forces generated with horizontal inserting and ejecting operations of the module board, and thus can greatly reduce a load on the solder joints.

Figure 25:
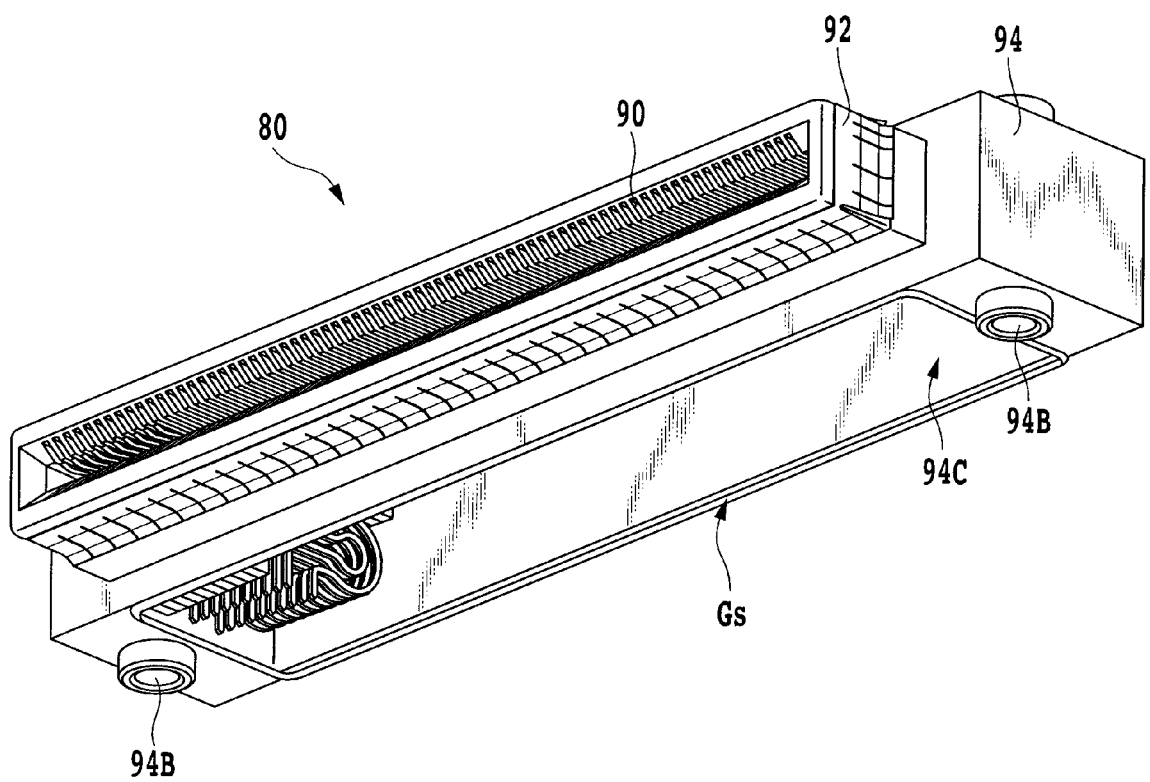
FIG. 25 is a perspective view of another example of a host connector used in the example of a connector for connection to a module board according to the present invention.
Figure 26:
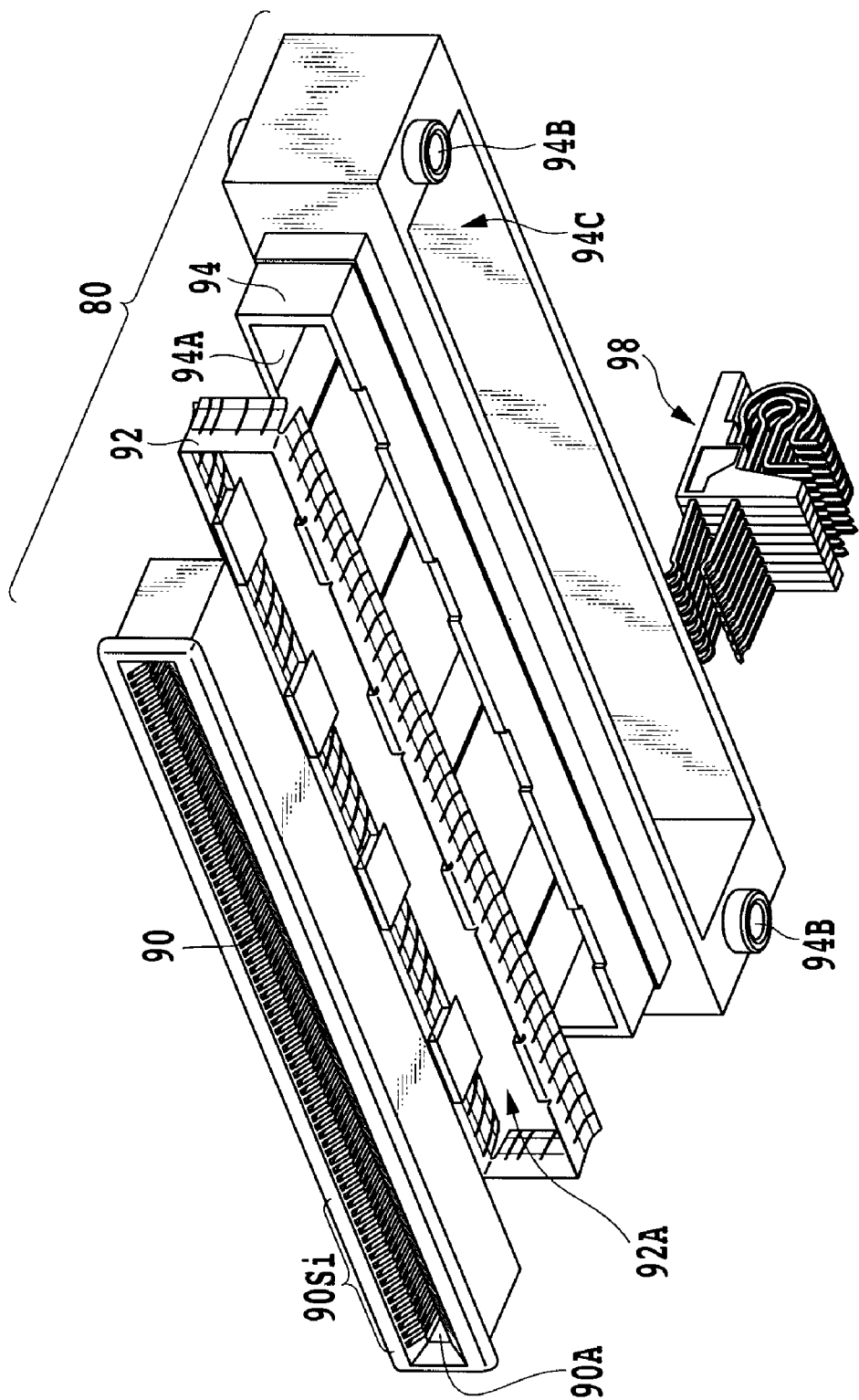
FIG. 26 is an exploded perspective view illustrating a structure of the host connector shown in FIG. 25.

FIGS. 25 and 26 show another example of a host connector used in an example of a connector for connection to a module board according to the present invention. This example does not require a board connector as described above.

As enlarged in FIGS. 25 and 26, a host connector 80 includes, as main components, a connector insulator 90, a finger 92 and a die-cast case 94. The connector insulator 90 has a slot 90A in which the above-described connecting terminal groups of the module board 14 are to be detachably inserted. The finger 92 fills a gap between the connector insulator 90 and the above-described opening formed in the end surface 12CE of the module 10. The case 94 has a contact connection section 94C that accommodates multiple compression-type contact blades 98.

The connector insulator 90 has slits 90Si (i=1 to n, where n is a positive integer) on its wall section defining the slot 90A. The slits 90Si are arranged at predetermined intervals, and each accommodate a pair of contact terminals 98a and 98b of the contact blades 98. The contact terminals 98a and 98b will be described later.

The finger 92 has an opening 92A into which an outer peripheral section of the connector insulator 90 is to be fitted.

The case 94 has a board slot 94A on its front side. An end of the connector insulator 90 is fitted into the board slot 94A. The finger 92 is fitted onto the outer peripheral surface of the board slot 94A. In the contact connection section 94C of the case 94, the multiple contact blades 98 are arranged at positions respectively corresponding to those of the slits 90Si in the slot 90A. As shown in FIG. 25, a gasket Gs is provided along the periphery of an opening end of the contact connection section 94C. The gasket Gs prevents noise from leaking out. The case 94 has a pair of holes 94B provided at positions outside the gasket Gs. Fixing machine screws BS2 are inserted into the respective holes 94B. After the fixing machine screws BS2 are screwed into their female screw holes in the guide rail member 20 through the holes 94B of the case 94 and holes 44b of the printed wiring board 44, a portion including the connector accommodating section 20A of the guide rail member 20 is fixed to the printed wiring board 44.

Figure 27:
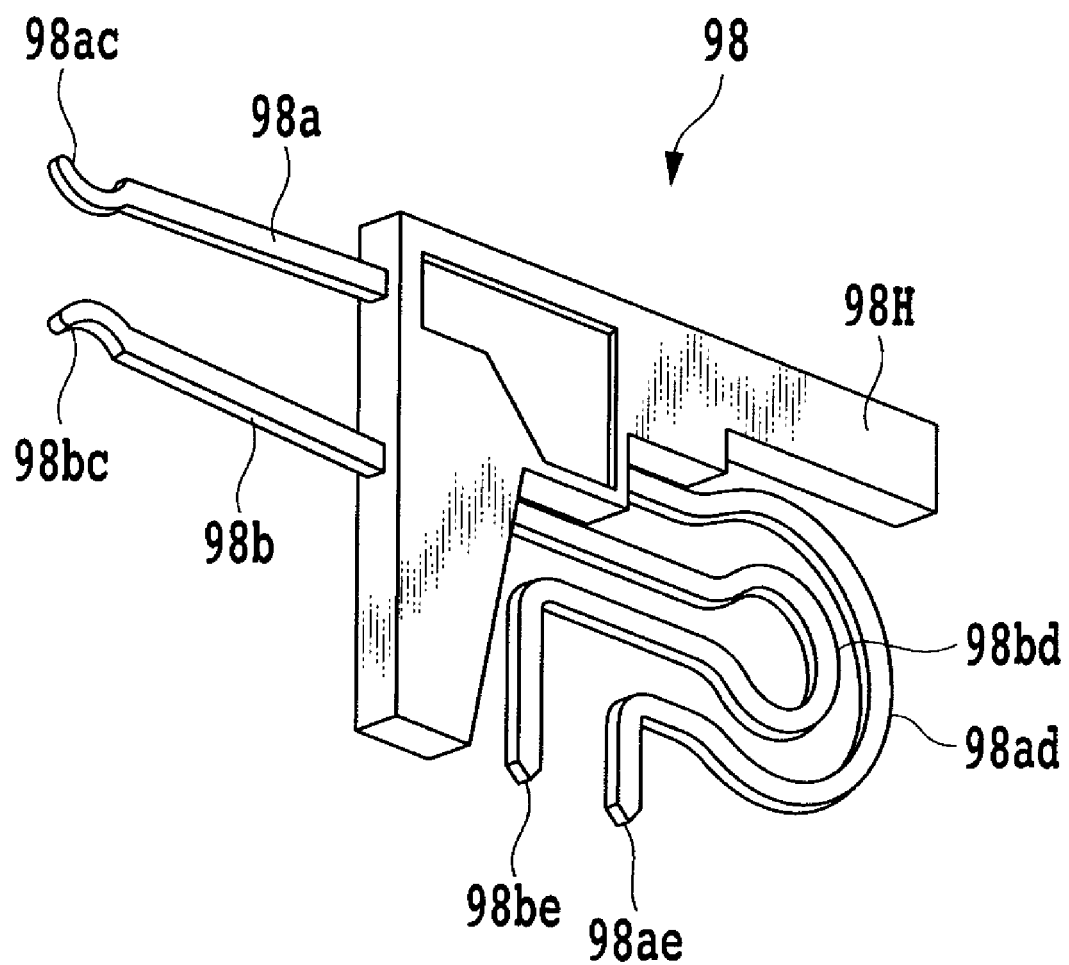
FIG. 27 is a perspective view of a contact blade used in the host connector shown in FIG. 25.

As enlarged in FIG. 27, each contact blade 98 includes a blade body 98H and contact terminals 98a and 98b, which are formed integrally with the blade body 98H by insert molding.

The blade body 98H has contact terminals 98a and 98b such that contact portions of contact terminals 98a and 98b described later protrude through the one end.

The contact terminal 98a has a contact portion 98ac at its elastically displaceable tip end. The contact terminal 98b has a contact portion 98bc at its elastically displaceable tip end. In addition, the contact terminal 98a has a fixed contact portion 98ae formed at its lowermost end. The fixed contact portion 98ae is to be brought into contact with the corresponding contact pad of the printed wiring board 44 with a predetermined pressure. Similarly, the contact terminal 98b has a fixed contact portion 98be formed at its lowermost end. The fixed contact portion 98be is to be brought into contact with the corresponding contact pad of the printed wiring board 44 with the predetermined pressure. A curved connection section 98ad is formed between the fixed contact portion 98ae and the contact portion 98ac. Similarly, a curved connection section 98bd is formed between the fixed contact portion 98be and the contact portion 98bc. The connection section 98bd has a smaller curvature radius than the connection section 98ad.

Figure 28:
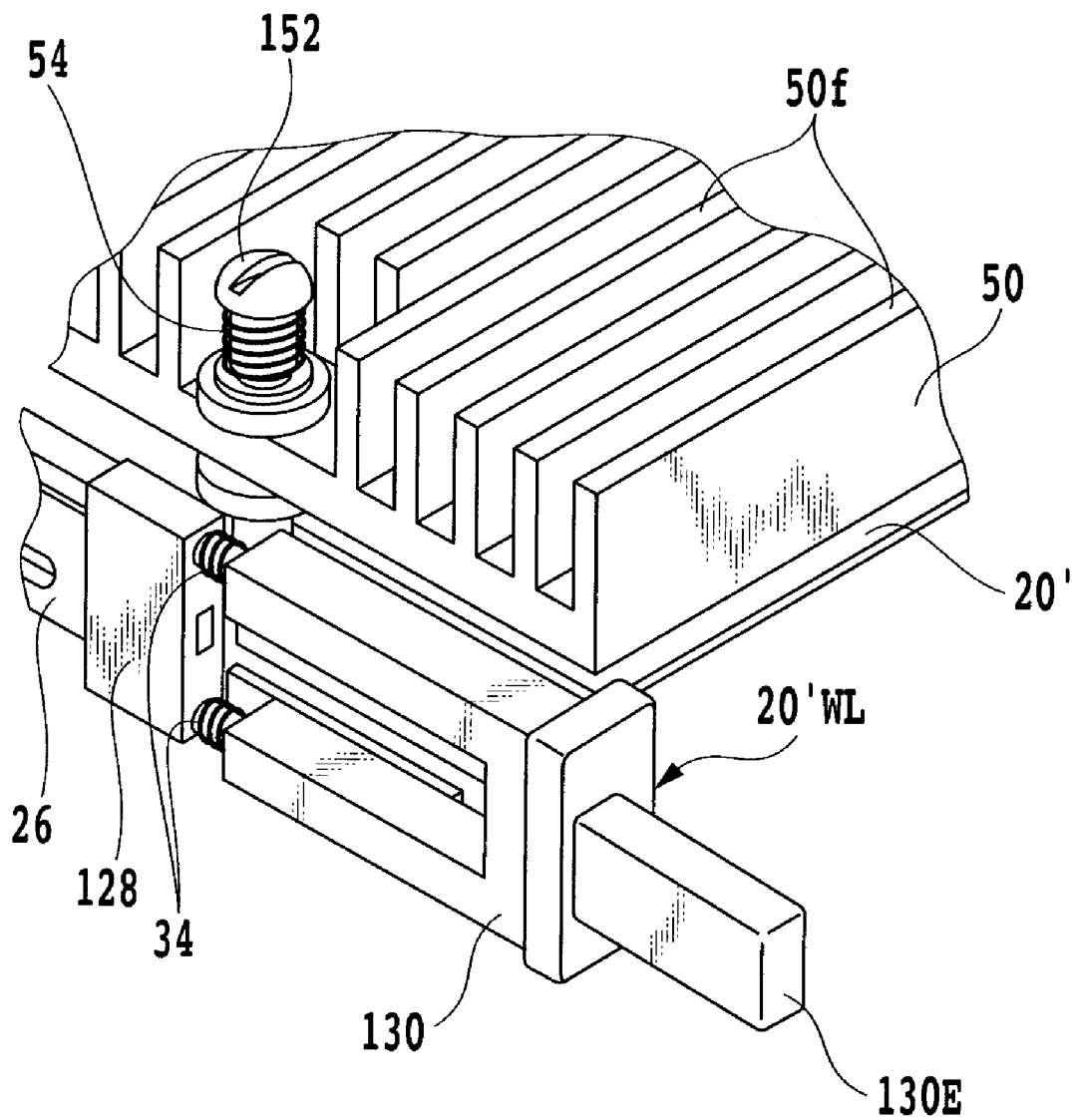
FIG. 28 is a perspective view showing another example of a heat sink and an eject mechanism used in an embodiment of a connector for connection to a module board according to the present invention.

FIG. 28 partially shows another example of a heat-sink support structure, and main part of another example of a locking member in an eject mechanism. Both the examples are used in an example of a connector for connection to a module board according to the present invention.

Note that, in FIGS. 28 to 35C, the same components as those in the example shown in FIGS. 1 and 2 are denoted by the same reference symbols, and the redundant description thereof will be omitted.

In the foregoing example, the heat sink unit is supported on the guide rail member 20 with the guide screws 52 inserted into the four holes formed among the heat-dissipating fins 50f so that the heat sink unit can move up and down with respect to the guide rail member 20. In addition, the coil springs 54 bias the heat sink unit in such a direction that the raised portion 50R can come closer to the inside of the module accommodating section 20B.

On the other hand, in the example shown in FIG. 28, each guide screw 152 is screwed into a female screw hole 20'S of a guide rail member 20' through shock-absorbing members 154 in addition to the coil spring 54. The female screw holes 20'S are formed in the upper edges of sidewall sections 20'WR and 20'WL forming the periphery of an opening of the guide rail member 20' (see FIG. 31).

Figure 29:
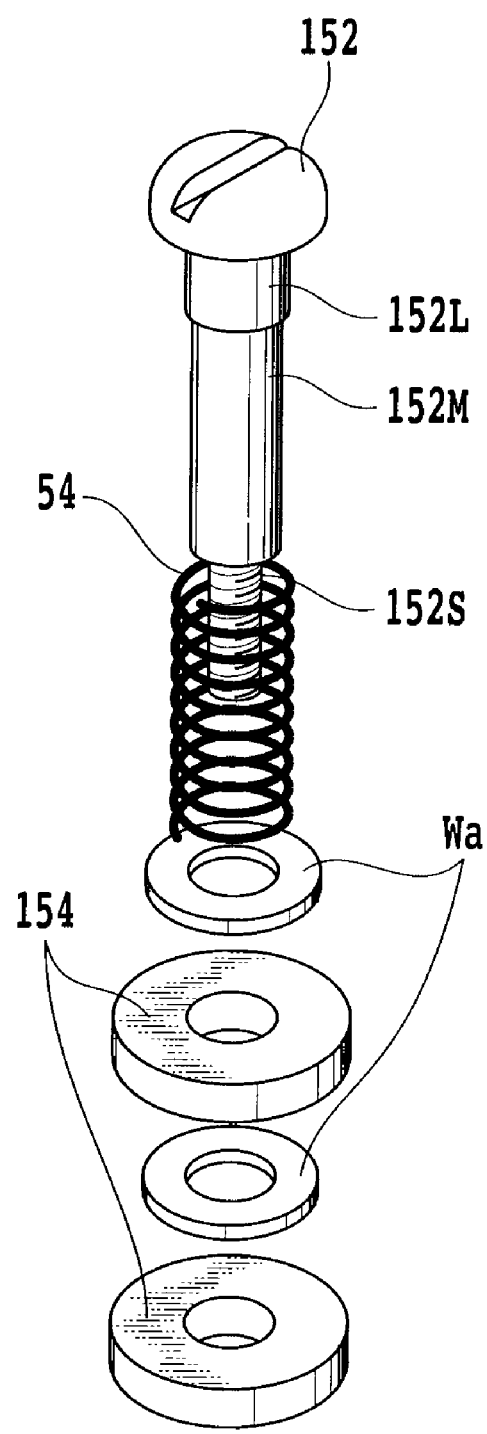
FIG. 29 is a perspective view illustrating a structure of a guide screw used in a support structure for the heat sink shown in FIG. 28.

As enlarged in FIG. 29, each guide screw 152 includes a male screw section 152S, a small-diameter section 152M and a large-diameter section 152L. The male screw section 152S is screwed into the female screw hole 20'S. The small-diameter section 152M is inserted into holes respectively of two washers Wa and the two shock-absorbing members 154. The large-diameter section 152L holds an end of the coil spring 54.

Each shock-absorbing member 154 has an annular shape and made of, for example, a rubber sheet. The paired shock-absorbing members 154 are provided as enlarged in FIG. 30A. Specifically, one is provided between the washers Wa, which are provided on the upper surface of the heat sink 50, while the other is provided between the opening end surface of the female screw hole 20'S and the contact surface of the heat sink 50.

Figure 30A:
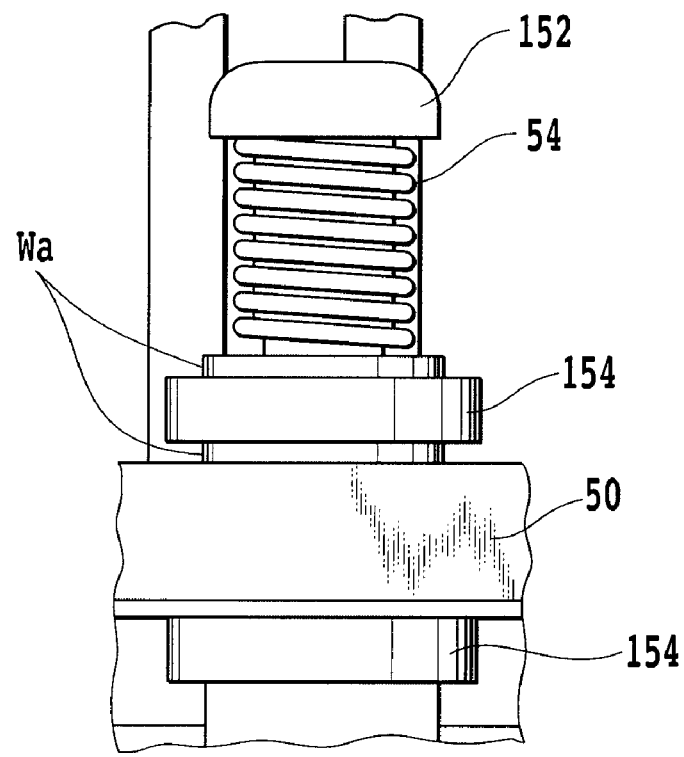
FIG. 30A is a view made available for illustrating a construction of the support structure for the heat sink shown in FIG. 28.
Figure 30B:
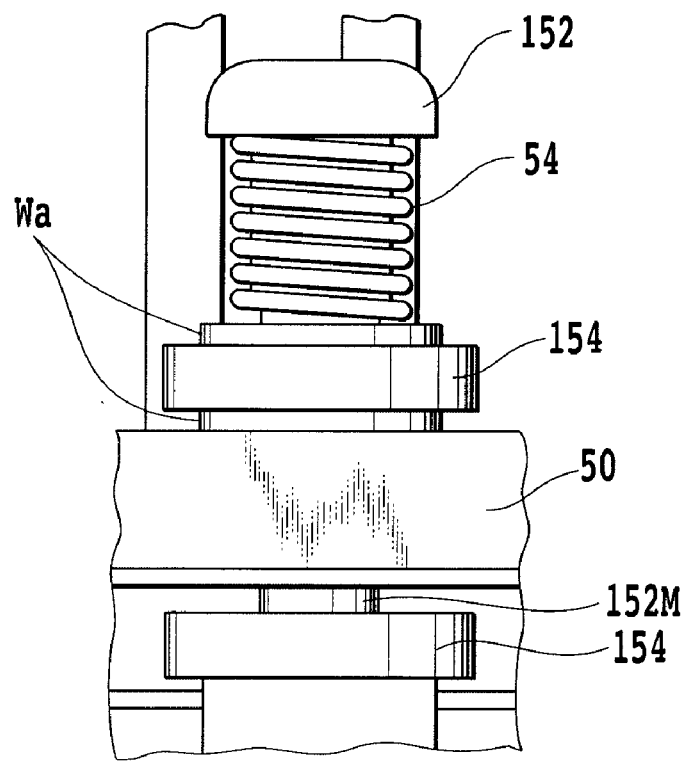
FIG. 30B is a view made available for illustrating an operation of the support structure for the heat sink shown in FIG. 28.

The above-described structure allows the case 12 of the module 10 to push the raised portion 50R, and thus raises the heat sink 50 against the biasing force of the coil springs 54 at the time of installing the module 10 into the module accommodating section 20B. As a result, the contact surface of the heat sink 50 moves away from the other one of the paired shock-absorbing members 154 as shown in FIG. 30B.

In the case where the heat sink 50 is increased in mass, acceleration such as shock and vibration acting on the connector from the outside might cause a force greater than the spring force of the coil springs 54 to be exerted on the heat sink 50, and thus might move the heat sink 50 up and down. For example, assume that acceleration of 50 G acts on the heat sink 50 having a mass of 500 g. In this case, a force of 500 g×50 G=25 (kg) is exerted on the heat sink 50 to violently move it up and down, which might damage the fixing members for the heat sink 50 and the installed module 10. However, in the foregoing example, the structure that restricts the movement of the heat sink 50 is provided to suppress this vertical movement, and the shock-absorbing members 154 (dumpers) are provided in this restriction structure. This can prevent the components such as those in the guide rail structure from being damaged upon such acceleration.

The eject mechanism supported by the guide rail member 20' shown in FIG. 28 includes, as main components, the above-described ejector 22, the eject cam member 24 and the eject lever member 26. The eject cam member 24 transmits an operating force to the ejector 22 in order to move the ejector 22 along the sidewall section 20'WL of the guide rail member 20'. The eject lever member 26 is connected to the eject cam member 24, and transmits an operating force exerted on an eject button 130 to the eject cam member 24 through the coil springs 34 and a spring receptacle 128.

Figure 31:
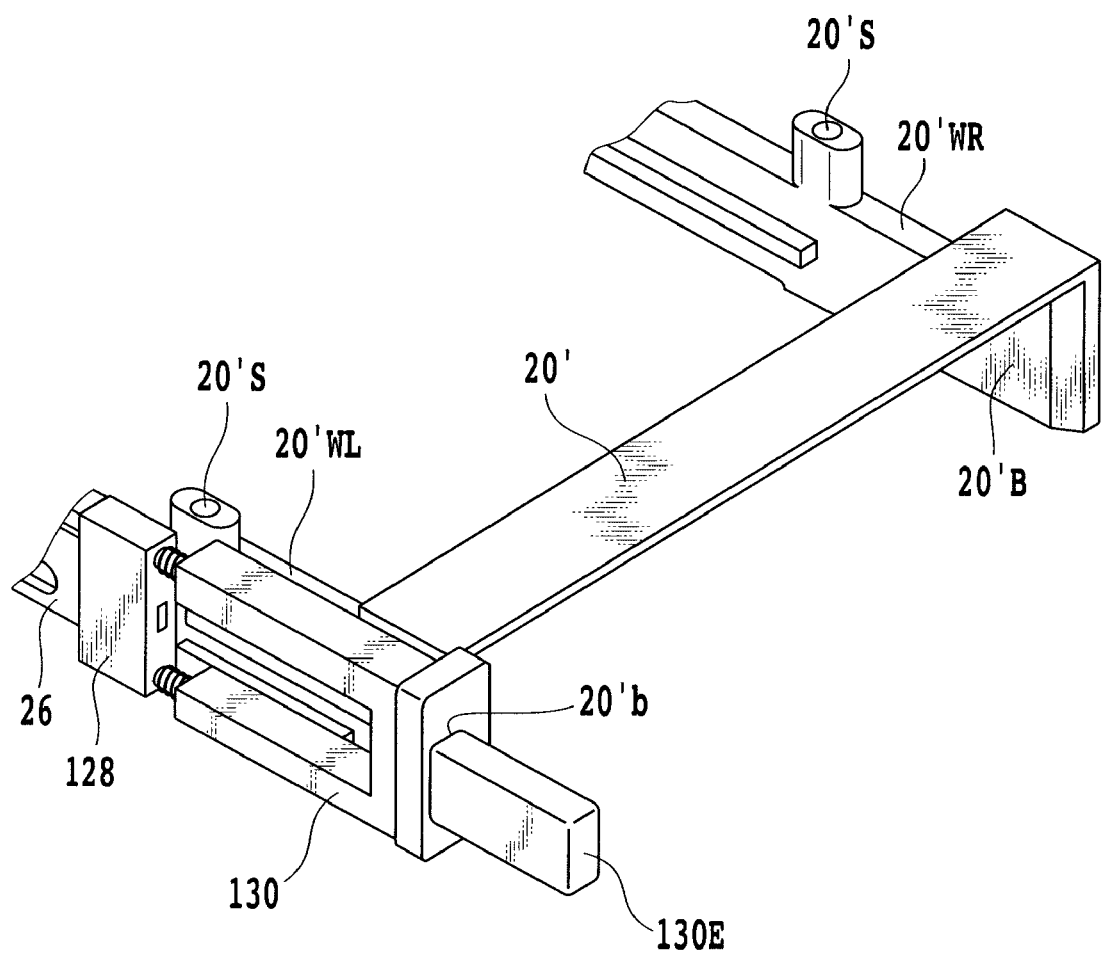
FIG. 31 is a perspective view showing main part of the eject mechanism shown in FIG. 28.
Figure 32:
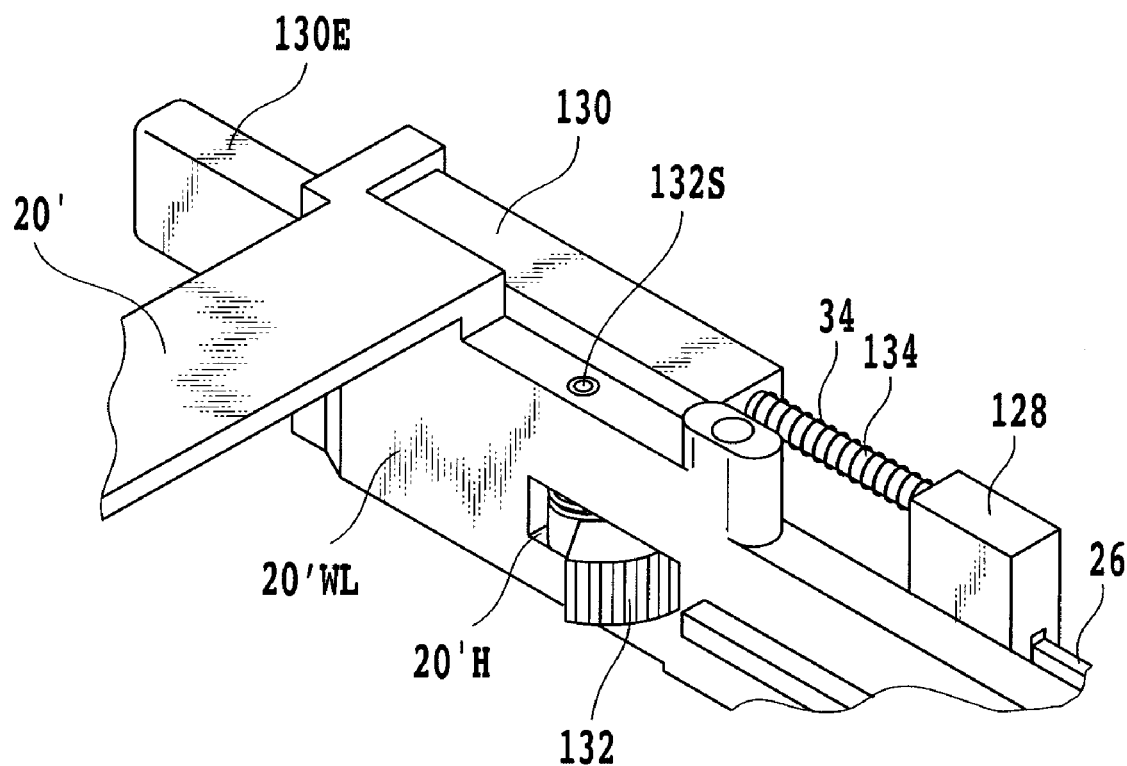
FIG. 32 is a perspective view showing main part of the eject mechanism shown in FIG. 28.

As shown in FIGS. 31 and 32, the spring receptacle 128 is connected to an end, closer to a module accommodating section 20'B of the guide rail member 20', of the eject lever member 26.

Figure 33A:
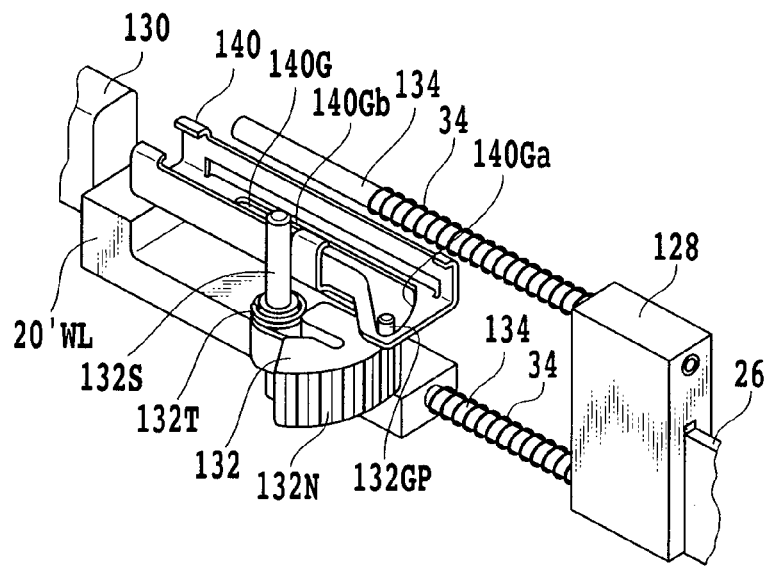
FIG. 33A is a perspective view made available for illustrating an operation of a locking member in the eject mechanism shown in FIG. 28 at the time of installing a module.
Figure 33B:
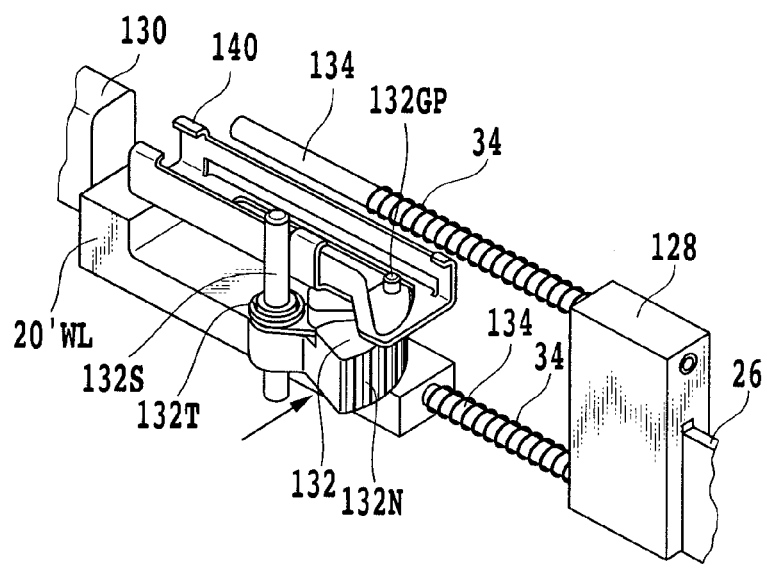
FIG. 33B is a perspective view made available for illustrating the operation of the locking member in the eject mechanism shown in FIG. 28 at the time of installing the module.

As shown in FIG. 33A, the spring receptacle 128 has two spring guide shafts 134 at an end. These spring guide shafts 134, which are arranged at a predetermined interval to extend in parallel to each other, guide the respective coil springs 34.

Each coil spring 34 is wound around the corresponding spring guide shaft 134, and ends of the spring guide shafts 134 opposite to the ends connected to the spring receptacle 128 is inserted into holes of the eject button 130, respectively. Thereby, the eject button 130 is slidably supported by the spring guide shafts 134.

As shown in FIG. 32, the eject button 130 consists of a guide section and an operation section 130E. The guide section has a cam plate 140 (see FIG. 33A) therein. The cam plate 140 will be described later. The operation section 130E is connected to the guide section and protrudes outside through the hole 102a of the module guide 102.

As shown in FIG. 33A, the cam plate 140 in the guide section of the eject button 130 has a groove 140G consisting of a guide groove 140Ga and a guide groove 140Gb. A guide pin 132GP of a locking member 132 to be described later is inserted into the groove 140G. The guide groove 140Gb has an elongated shape extending in the inserting and ejecting directions of the module 10. The guide groove 140Ga is connected to one end of the guide groove 140Gb and inclined toward the sidewall section 20'WL.

Figure 34A:
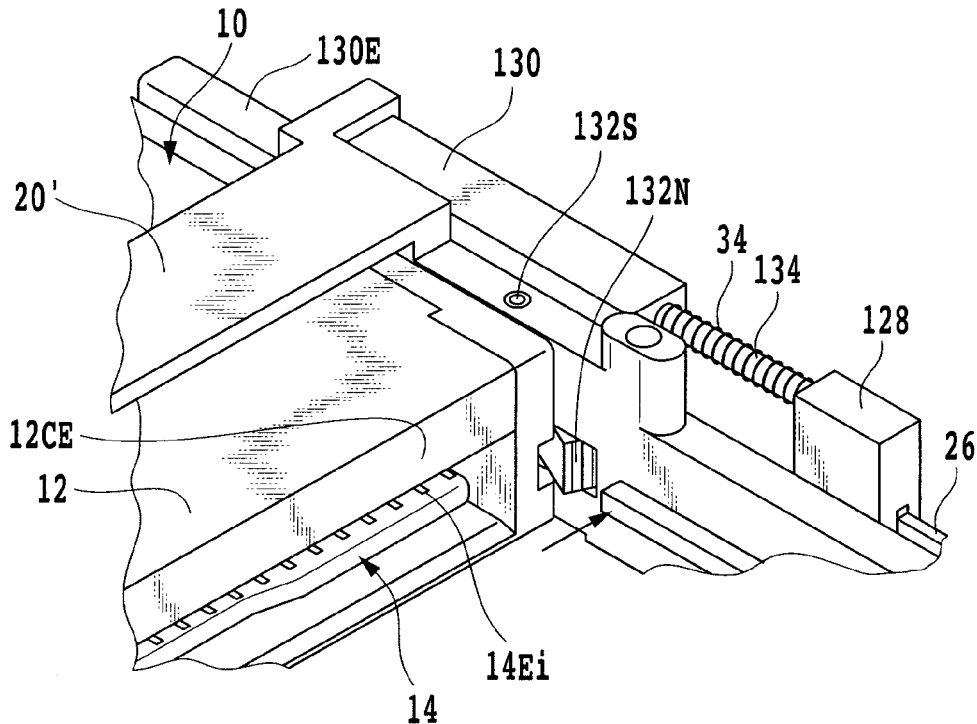
FIG. 34A is a perspective view made available for illustrating the operation of the locking member in the eject mechanism shown in FIG. 28 at the time of installing the module.
Figure 34B:
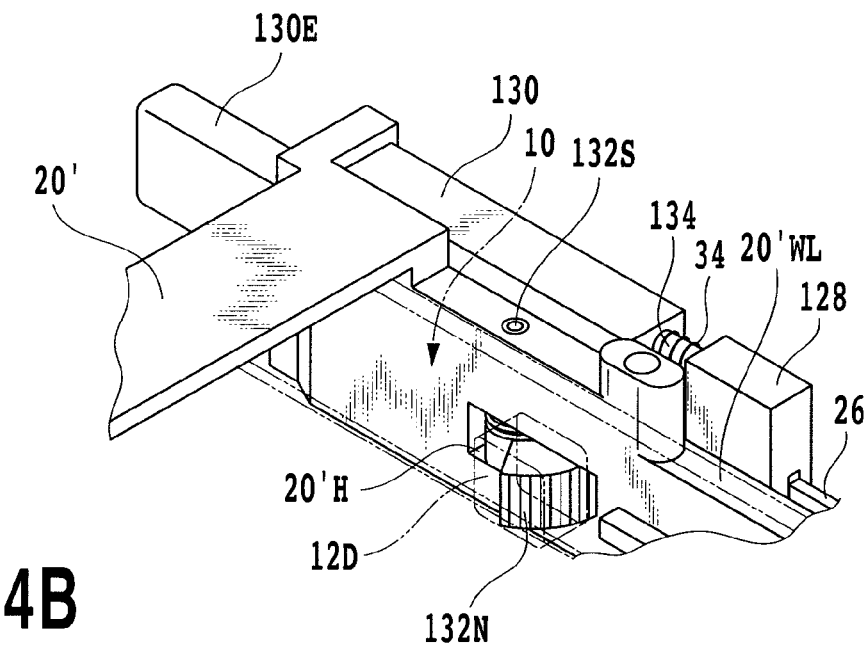
FIG. 34B is a perspective view made available for illustrating the operation of the locking member in the eject mechanism shown in FIG. 28 at the time of installing the module.

As shown in FIG. 34B, the locking member 132 to be described later can be switched between a lock state and an unlock state. When the locking member 132 is in the lock state, a locking nib 132N of the locking member 132 engages with the recess 12D of the module 10, and thereby the module 10 accommodated in a module accommodating section 20'B is locked therein. The locking member 132 switches to the unlock state, if the locking nib 132N becomes disengaged from the recess 12D of the module 10 in response to an operation of the eject button 130. Note that FIG. 33A shows the lock state of the locking member 132.

This structure enables the following movements of the locking member 132. Firstly, suppose the case where the eject button 130 is moved toward the spring receptacle 128. In this case, the guide pin 132GP moves sequentially through the inclined guide groove 140Ga and the parallel guide groove 140Gb, which rotates the locking member 132 in a counterclockwise direction in FIG. 35B about a support shaft 132S to be described later. Secondly, suppose the case where the biasing force of the coil springs 34 moves the eject button 130 away from the spring receptacle 128. In this case, the guide pin 132GP moves sequentially through the parallel guide groove 140Gb and the inclined guide groove 140Ga, which rotates the locking member 132 in a clockwise direction in FIG. 35C.

As enlarged in FIG. 33A, the locking member 132 includes a rotation arm section, the locking nib 132N and the guide pin 132GP. The rotation arm section has a hole to which the support shaft 132S is to be inserted. The support shaft 132S is supported in a through hole provided in an end of the sidewall section 20'WL. The locking nib 132N, which has a fan-like shape, is integrally formed at an end of the rotation arm section. The hole of the rotation arm section is drilled therethrough in a direction perpendicular to the flat sides of the rotation arm section. The thickness of the rotation arm section is set less than the short side dimension of an approximately rectangular through hole 20'H (see FIG. 32) formed on the end of the sidewall section 20'WL. A torsion spring 132T is wound around the circumferential edge of the hole of the rotation arm section. The ends of the torsion spring 132T are supported by the sidewall section 20'WL and the locking member 132, respectively. Thereby, the torsion spring 132T biases the locking member 132 in a direction toward the lock state, that is, in a clockwise direction in FIG. 33A.

The through hole through which the support shaft 132S is to pass is drilled through the sidewall section 20'WL in a direction perpendicular to the long sides of the through hole 20'H.

The guide pin 132GP is inserted into the guide groove 140Ga or 140Gb of the cam plate 140. The guide pin 132GP slidably engages with the guide groove 140Ga or 140Gb.

The above-described operation section 130E is movably supported by being inserted in a rectangular through hole 20'b. As shown in shown in FIG. 31, the through hole 20'b is formed in an end of the sidewall section 20'WL.

Figure 33C:
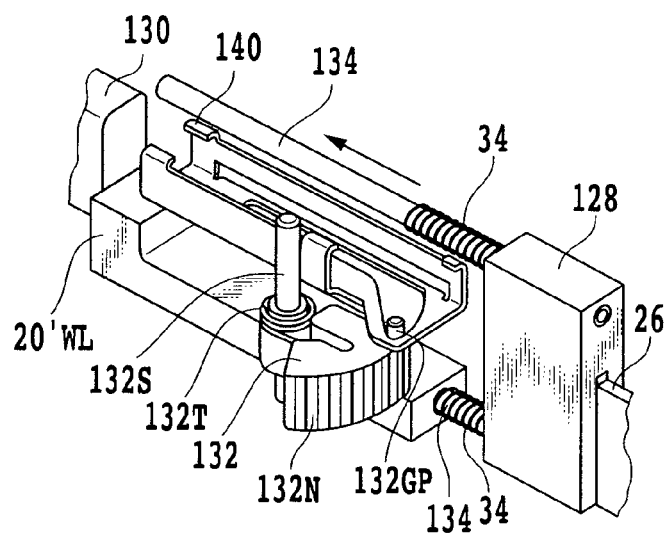
FIG. 33C is a perspective view made available for illustrating the operation of the locking member in the eject mechanism shown in FIG. 28 at the time of installing the module.

The above-described structure enables the following operations. At the time of installing the module 10 into the module accommodating section 20'B as shown in FIG. 34A, a leading portion of a side surface of the case 12 of the module 10 pushes the locking nib 132N of the locking member 132 against a biasing force of the torsion spring 132T in the direction indicated by the arrow shown in FIG. 33B. As a result, the locking nib 132N stays in the through hole 20'H of the sidewall section 20'WL. Then, when the module 10 is further pushed in, the locking nib 132N of the locking member 132 faces the recess 12D of the case 12, and then protrudes to engage with the recess 12D, as shown in FIGS. 33C and 34B. As a result, the locking member 132 switches to the lock state.

Figure 35A:
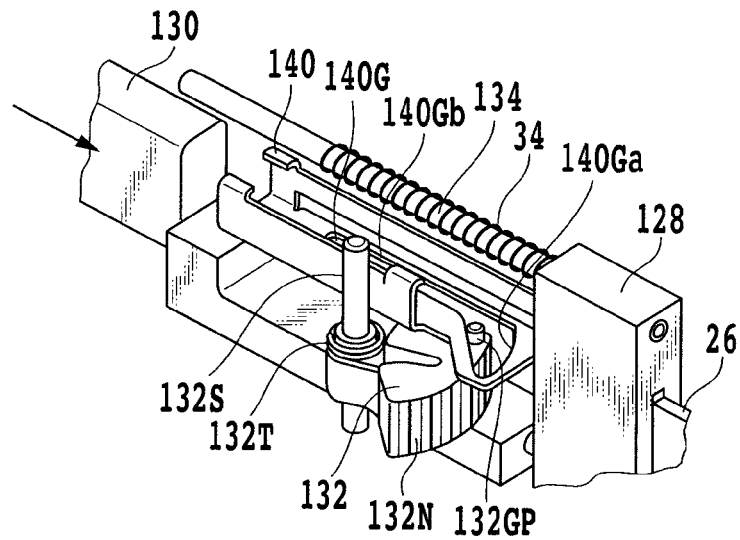
FIG. 35A is a perspective view made available for illustrating the operation of the locking member in the eject mechanism shown in FIG. 28 at the time of ejecting the module.
Figure 35B:
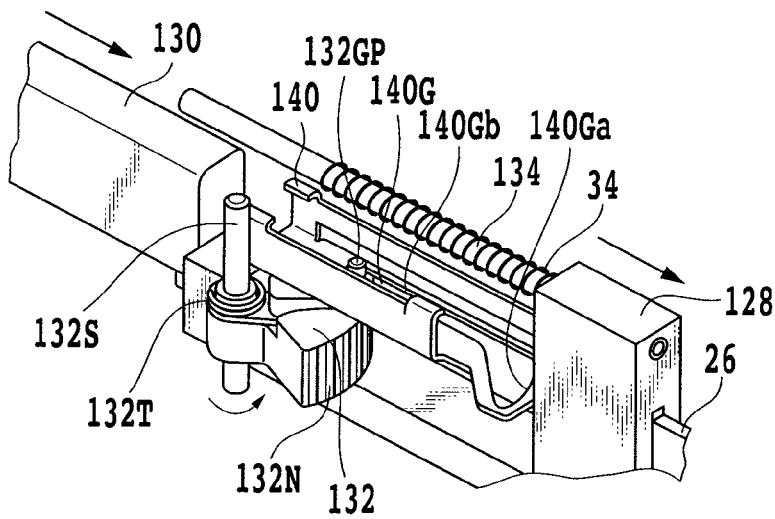
FIG. 35B is a perspective view made available for illustrating the operation of the locking member in the eject mechanism shown in FIG. 28 at the time of ejecting the module.

On the other hand, in order to eject the module 10 from the module accommodating section 20'B, the locking member 132 is switched from the lock state to the unlock state as follows. In the lock state, the locking nib 132N of the locking member 132 engages with the recess 12D of the module 10, as shown in FIG. 34B. When, with the locking member 132 in this lock state, the eject button 130 is pushed in the direction indicated by the arrow shown in FIG. 35A till an end surface of the eject button 130 comes in contact with the spring receptacle 128 against the biasing force of the coil springs 34 as shown in FIG. 35B, the guide pin 132GP of the locking member 132 is guided sequentially through the guide groove 140Ga and the parallel guide groove 140Gb. In this event, the eject lever member 26 does not move at all.

Along with this movement of the guide pin 132GP, the locking nib 132N of the locking member 132 starts to move away from the recess 12D and eventually stays in the through hole 20'H. As a result, the locking nib 132N of the locking member 132 switches to the unlock state.

Then, the eject button 130 is further pushed in with the end in contact with the spring receptacle 128 in the direction indicated by the arrow shown in FIG. 35B. In this event, the eject lever member 26 is pushed to move in the direction indicated by the arrow shown in FIG. 35B while the locking member 132 is in the unlock state. Thereby, the above-described eject cam member 24 is rotated to move the ejector 22 in the direction to eject the module 10. As a result, the paired bent pieces 22K of the ejector 22 push the module 10 out of the module accommodating section 20'B.

Figure 35C:
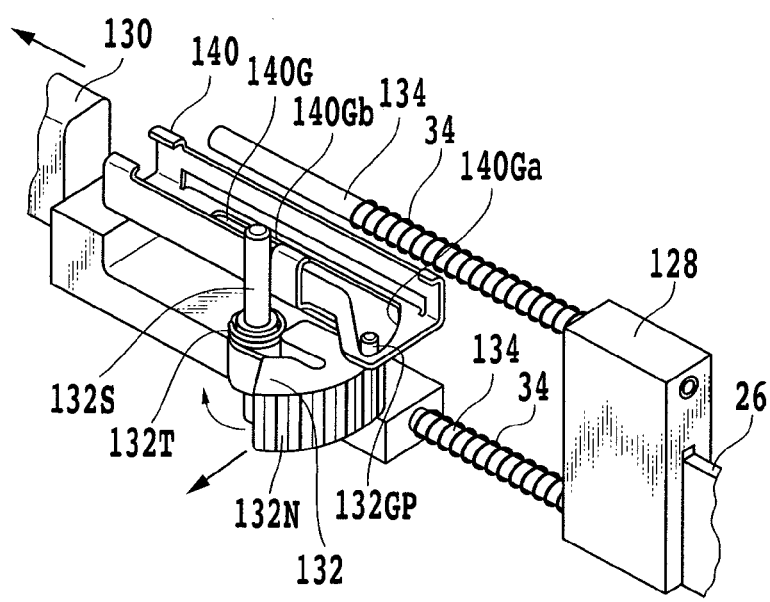
FIG. 35C is a perspective view made available for illustrating the operation of the locking member in the eject mechanism shown in FIG. 28 at the time of ejecting the module.

Then, when the eject button 130 is released, the biasing force of the coil springs 34 moves the eject button 130 in the direction indicated by the arrow shown in FIG. 35C, namely, in the direction away from the spring receptacle 128. Thereby, the guide pin 132GP of the locking member 132 is guided sequentially through the parallel guide groove 40Gb and the inclined guide groove 140Ga. As a result, the locking member 132 comes back to the lock-state position shown again.

Figure 40:
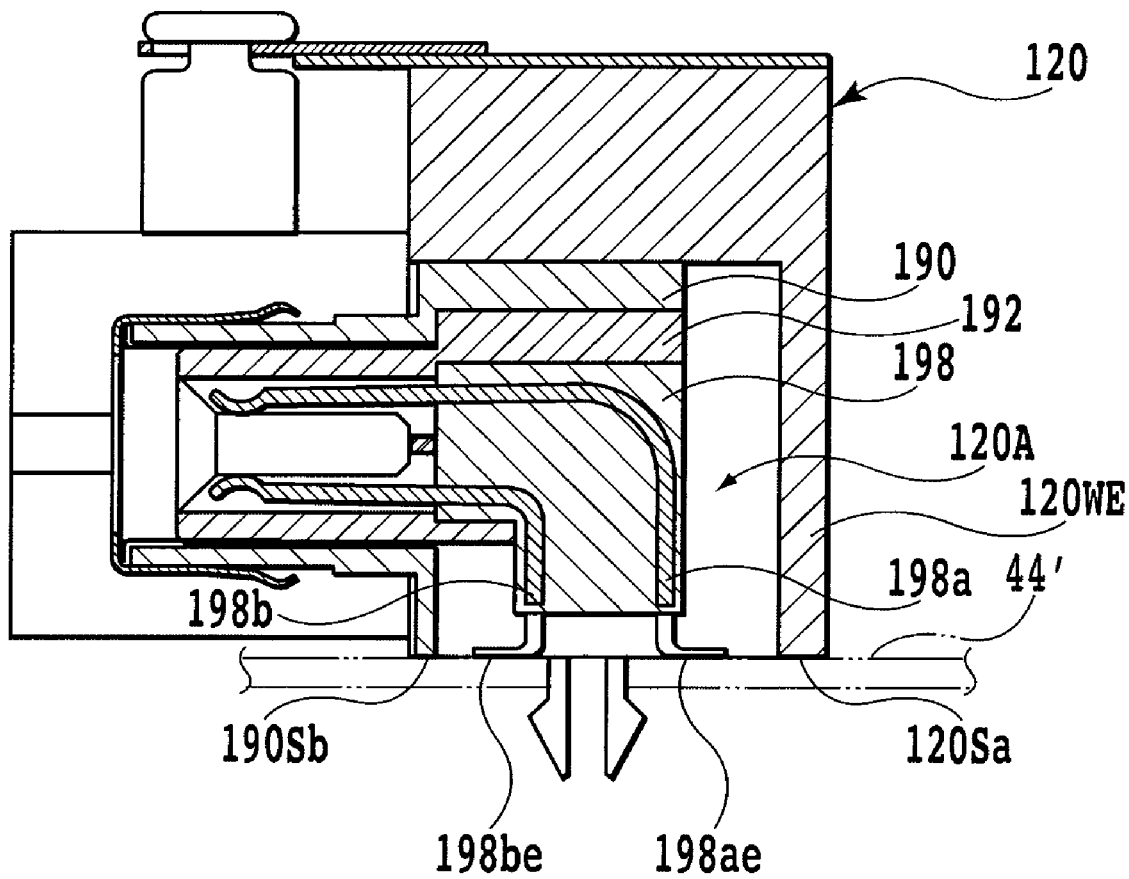
FIG. 40 is a partial cross-sectional view of the host connector shown in FIG. 39.

FIG. 40 shows main part of another example of a guide rail and main part of another example of a host connector. Both the examples are used in an example of a connector for connection to a module board according to the present invention.

Figure 36:
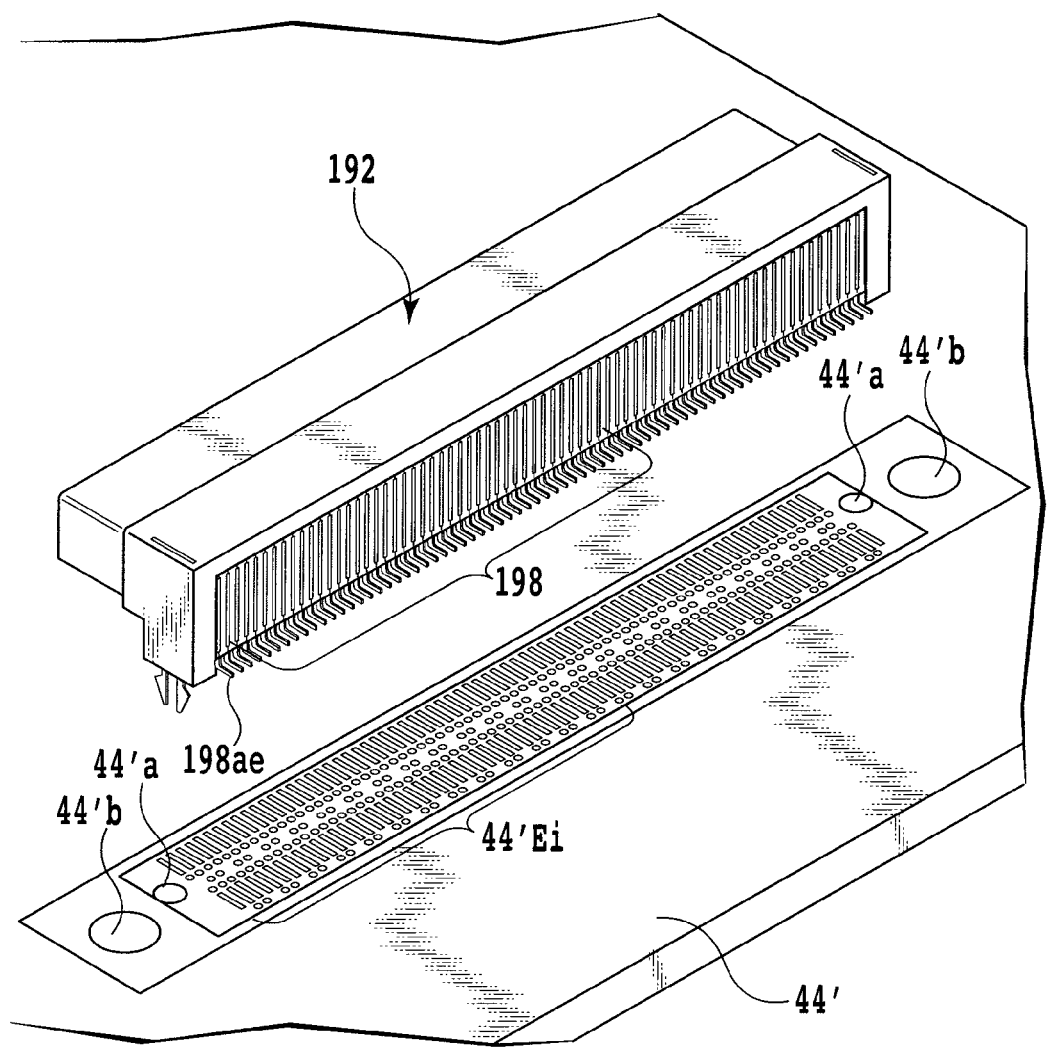
FIG. 36 is a perspective view showing main part of a connector body in the other example of a host connector used in an embodiment of a connector for connection to a module board according to the present invention, as well as a printed wiring board.

In the foregoing example shown in FIG. 1, one side of the connector accommodating section 20A of the guide rail member 20 opens outside. By contrast, in the example shown in FIG. 40, one side of a connector accommodating section 120A of a guide rail member 120 communicates with a module accommodating section (not shown), and the other side of the connector accommodating section 120A is closed by a wall section 120WE. Thereby, together with a printed wiring board 44', the guide rail member 120 defines an enclosed region therein. The bottom of the connector accommodating section 120A is in contact with the top surface of the printed wiring board 44'. At the same time, a shield surface 120Sa is formed on the bottom of the wall section 120WE. The shield surface 120Sa is in contact with the top surface of the printed wiring board 44', and thus shields the connector accommodating section 120A. As shown in FIG. 36, in the top surface of the printed wiring board 44', two holes 44'a are provided at a predetermined interval in a region on which the connector accommodating section 120A is placed. A metal press-in holder is inserted to each hole 44'a. A solder-fixing pad set consisting of two parallel lines of contact pads 44'Ei (i=1 to n, where n is a positive integer) is formed between the two holes 44'a. The contact pads 44'Ei are electrically connected to a conductive pattern of the printed wiring board 44'. In the printed wiring board 44', holes 441b are formed at positions adjacent to the respective holes 44'a. The above-described machine screws BS2 are inserted into the holes 44'b, respectively.

Figure 37:
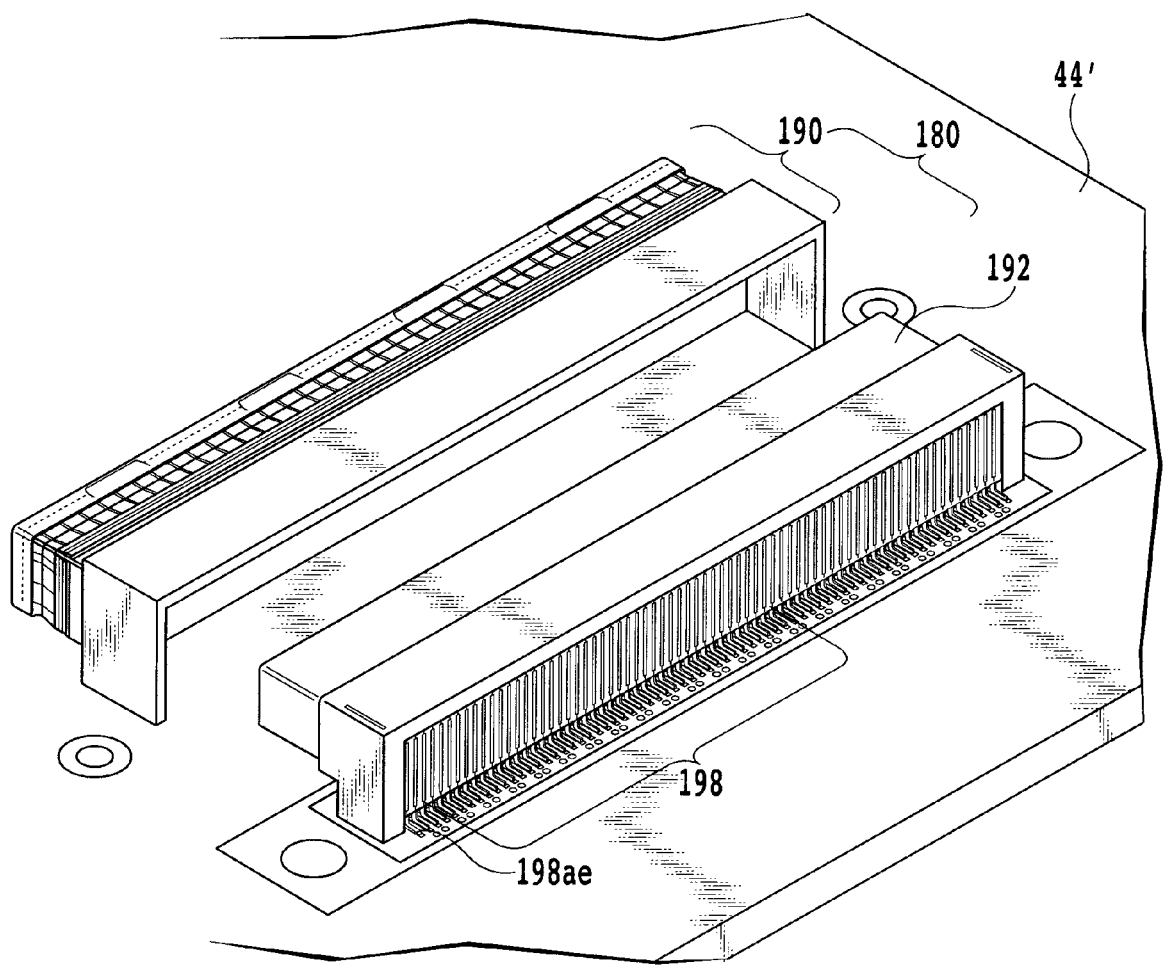
FIG. 37 is an exploded perspective view showing the other example of a host connector used in the example of a connector for connection to a module board according to the present invention.
Figure 38:
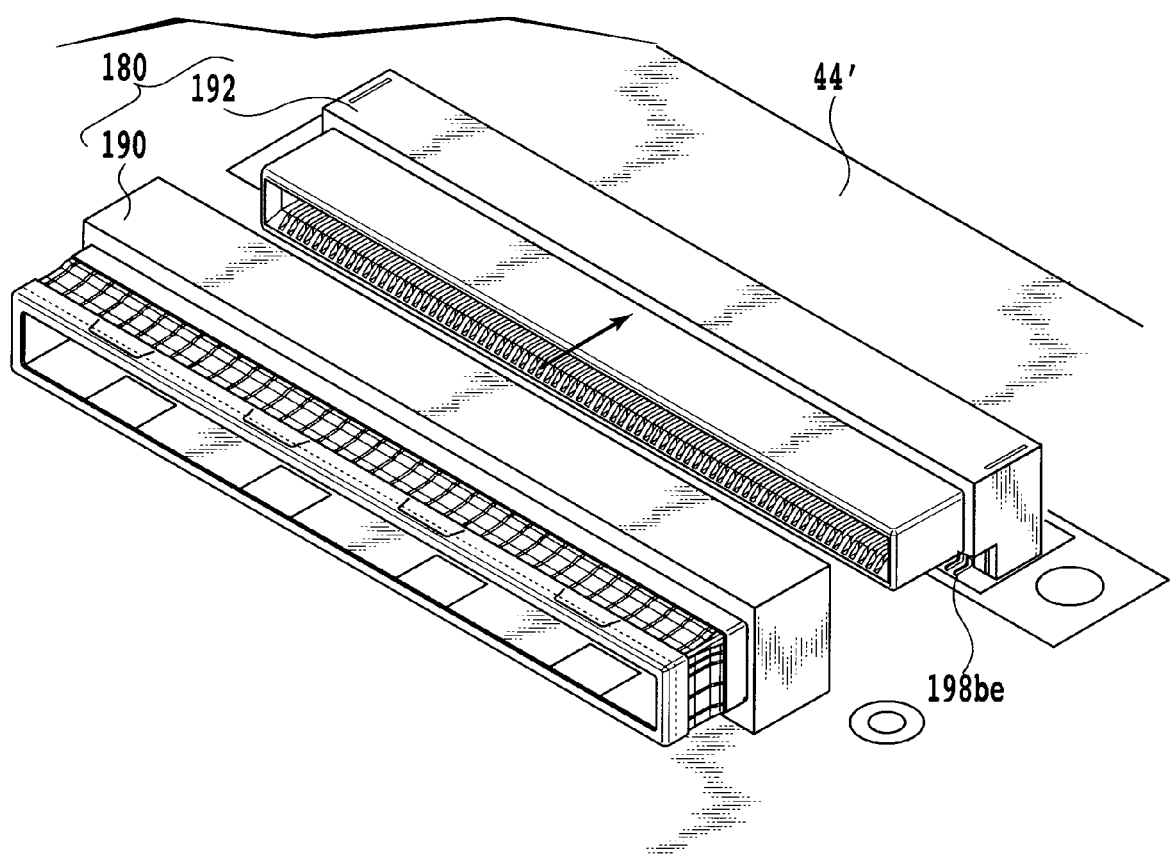
FIG. 38 is an exploded perspective view showing the other example of a host connector used in an embodiment of a connector for connection to a module board according to the present invention.

As shown in FIGS. 37 and 38, a host connector 180 includes a metal cover member 190 and a connector body 192. The cover member 190 includes a metal die-cast case, a finger and a finger holder. The die-cast case has a slot in which the above-described connecting terminal groups of the module board 14 are to be detachably inserted. The finger 72 fills a gap between the cover member 190 and the above-described opening formed in the end surface 12CE of the module 10. The finger holder fixes the finger onto the die-cast case.

As shown in FIG. 40, the die-cast case has a recessed section on the side facing the inside of the guide rail member 120. The recessed section opens outside and accommodates the connector body 192. A shield surface 190Sb is formed on a lower portion of the recessed section. The finger has an opening into which the periphery of the slot of the die-cast case is to be fitted.

The connector body 192 includes an insulator case accommodating multiple contact blades 198. The insulator case has slits on its wall section defining a slot in which the connecting terminal groups of the module board 14 are to be detachably inserted. The slits are arranged at predetermined intervals, and each accommodate a pair of contact terminals 198a and 198b of the contact blades 198. The contact terminals 198a and 198b will be described later.

Each contact blade 198 includes a blade body and the contact terminals 198a and 198b, which are formed integrally with the blade body by insert molding.

Each of the contact terminals 198a and 198b has a contact portion at its elastically displaceable tip end. In addition, the contact terminal 198a has a fixed contact portion 198ae formed at its lowermost end. The fixed contact portion 198ae is soldered and fixed to the corresponding contact pad of the printed wiring board 44'. The fixed contact portion 198ae is bent so as to protrude from an edge of an opening of the insulator case that opens to the wall section 120WE.

Similarly, the contact terminal 198b has a fixed contact portion 198be formed at its lowermost end. The fixed contact portion 198be is soldered and fixed to the corresponding contact pad of the printed wiring board 44'. The fixed contact portion 198be is bent toward the closed end of the insulator case.

The host connector 180 having the above-described structure is mounted on to the printed wiring board 44' as follows. Firstly, as shown in FIG. 36, the connector body 192 is placed on the printed wiring board 44' so that the contact terminals 198a and 198b can be placed exactly on the respective contact pads 44'Ei. Then, as shown in FIG. 37, each of the fixed contact portions 198ae and 198be of the contact terminals 198a and 198b is fixed onto the corresponding contact pad 44'Ei by reflow soldering. This method has an advantage that solder is sufficiently molten during the reflow soldering process. This is because the method prevents a phenomenon in which the members such as the die-cast case conduct heat away from the fixed contact portions 198ae and 198be, and thus allows the temperature thereof to rise sufficiently while being reflow soldered. In addition, since the fixed contact portions 198ae and 198be are exposed outside, the soldered portions thereof can be visually checked or repaired after the soldering process.

Figure 39:
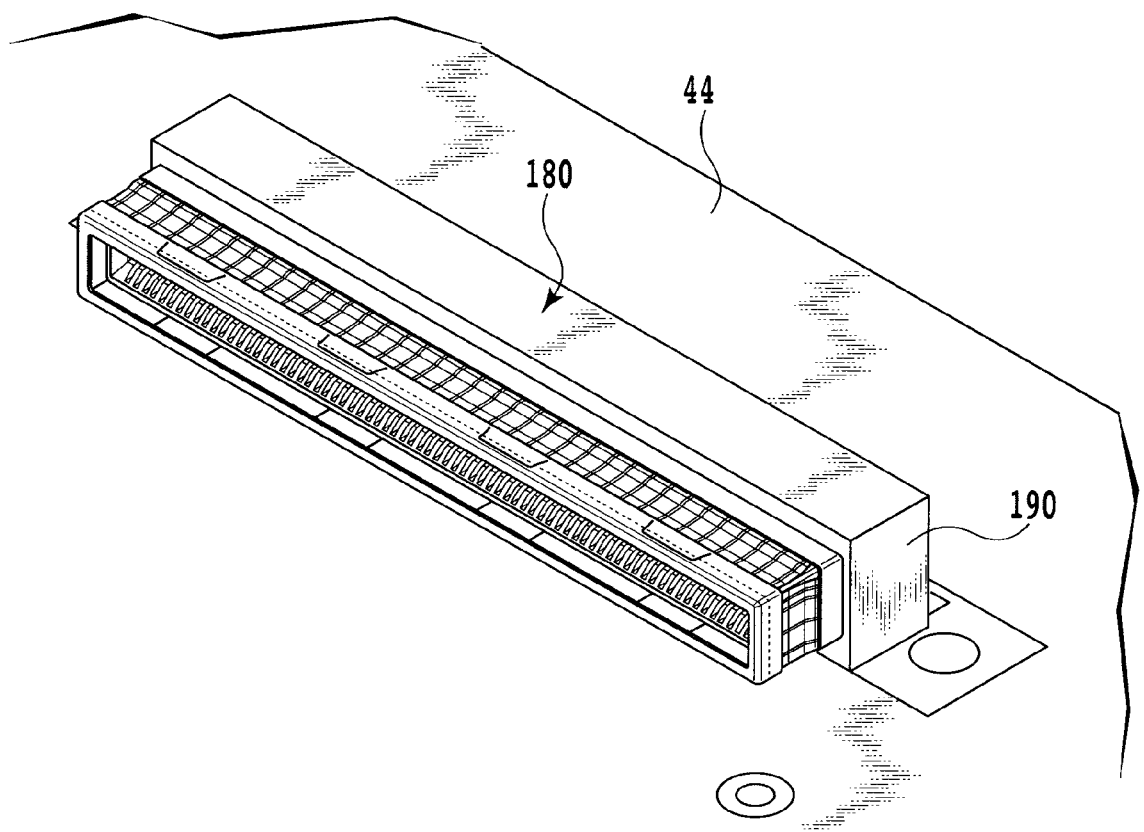
FIG. 39 is a perspective external view of the other example of a host connector used in an embodiment of a connector for connection to a module board according to the present invention.

Subsequently, the inner periphery of the die-cast case in the cover member 190 is fitted onto the outer periphery of the connector body 192 in the direction indicated by the arrow in FIG. 38. In this way, the host connector 180 is mounted on the printed wiring board 44' as shown in FIGS. 39 and 40. Accordingly, since the wall section 120WE of the guide rail member 120 is extended to the top surface of the printed wiring board 44', the wall section 120WE combined with the metal cover member 190 of the host connector 180 can implement a shield structure.

Figure 41:
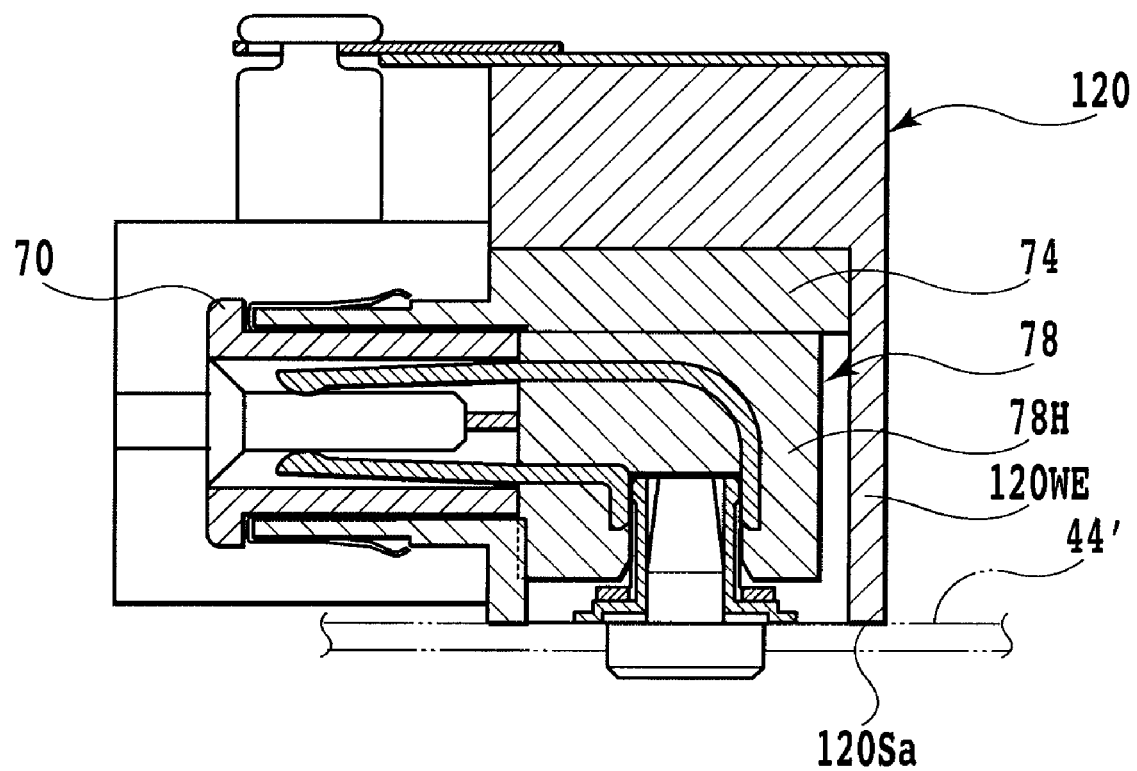
FIG. 41 is a partial cross-sectional view showing a state of the host connector in FIG. 20 placed in a guide rail shown in FIG. 40.

FIG. 41 shows the host connector 40 shown in FIG. 20 that is accommodated in the above-described connector accommodating section 120A of the guide rail member 120. Note that, in FIG. 41, the same components as those in the example shown in FIG. 20 are denoted by the same reference symbols, and the redundant description thereof will be omitted.

In this example as well, the wall section 120WE combined with the metal case 74 of the host connector 40 can implement a shield structure.

Figure 42:
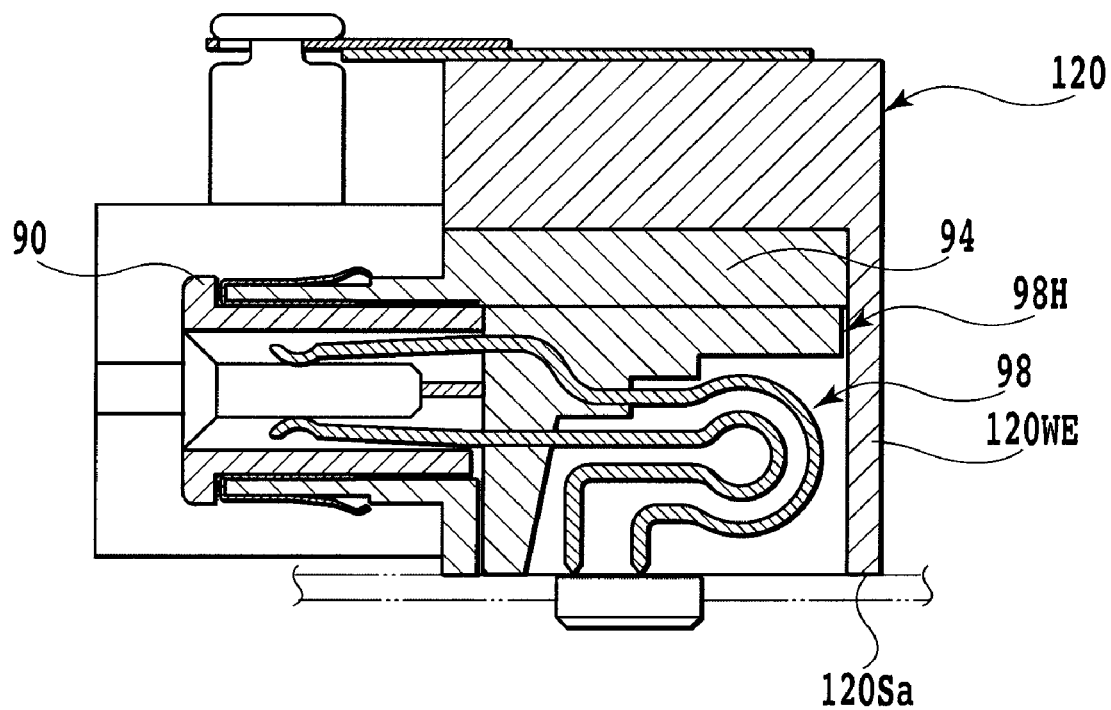
FIG. 42 is a partial cross-sectional view showing a state of the host connector in FIG. 25 placed in a guide rail shown in FIG. 40.

FIG. 42 shows the host connector 80 shown in FIG. 25 that is accommodated in the above-described connector accommodating section 120A of the guide rail member 120. Note that, in FIG. 42, the same components as those in the example shown in FIG. 25 are denoted by the same reference symbols, and the redundant description thereof will be omitted.

In this example as well, the wall section 120WE combined with the metal case 94 of the host connector 80 can implement a shield structure.

Note that, in the foregoing example, the anti-misoperation button cover 104 is rotatably supported by the module guide 102. However, the anti-misoperation button cover according to the present invention is not limited to this example. Alternatively, an anti-misoperation mechanism having a button structure may be employed, for example. When a cover of the anti-misoperation mechanism is pulled up, the cover comes in contact with the eject button, and thus can be operated as part of the button for module ejection.

Module insertion openings sometimes protrude from the front panel. In this case, if the insertion openings are provided close to one another, sufficient space for pushing their eject buttons might not be secured. Such a problem can be solved by employing the above-described button structure. Specifically, when pulled up for module ejection, the anti-misoperation cover becomes part of the eject button, and thus facilitates an eject operation.

Figure 43:
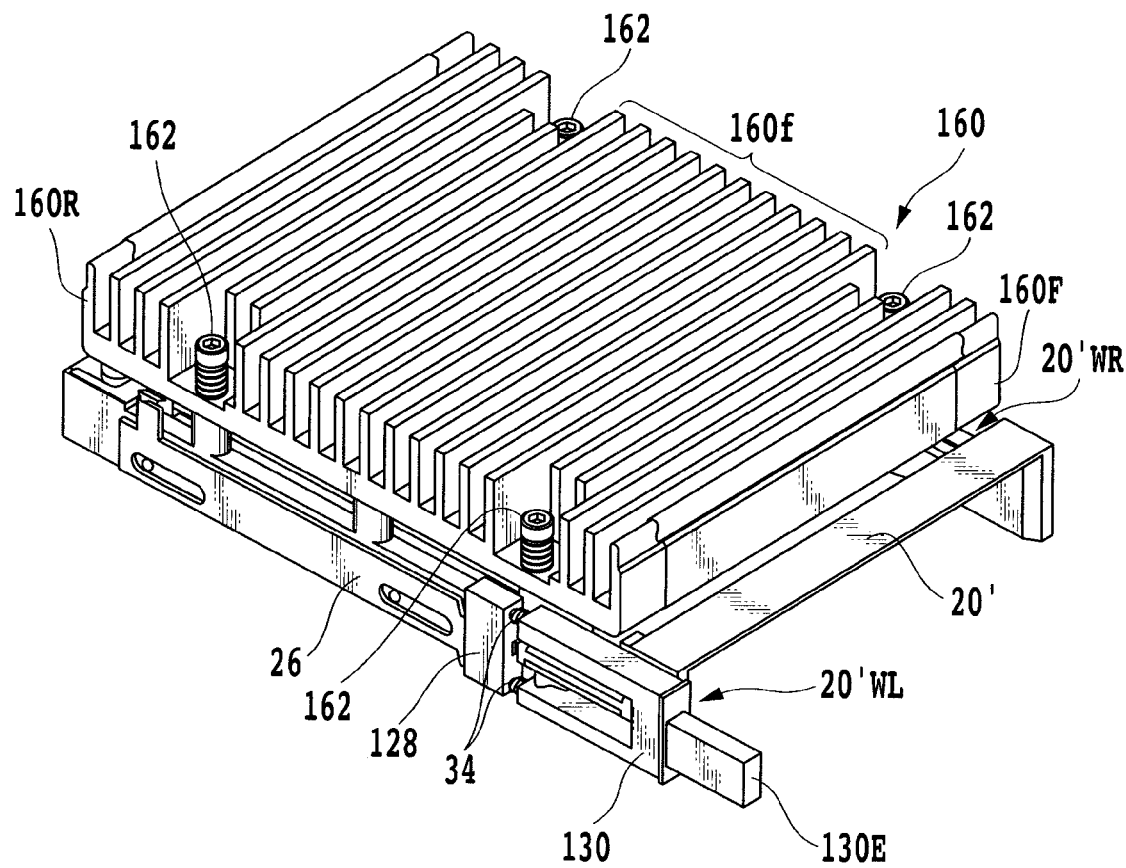
FIG. 43 is a perspective view showing another example of a heat sink unit used in an embodiment of a connector for connection to a module board according to the present invention, as well as a guide rail member.
Figure 44:
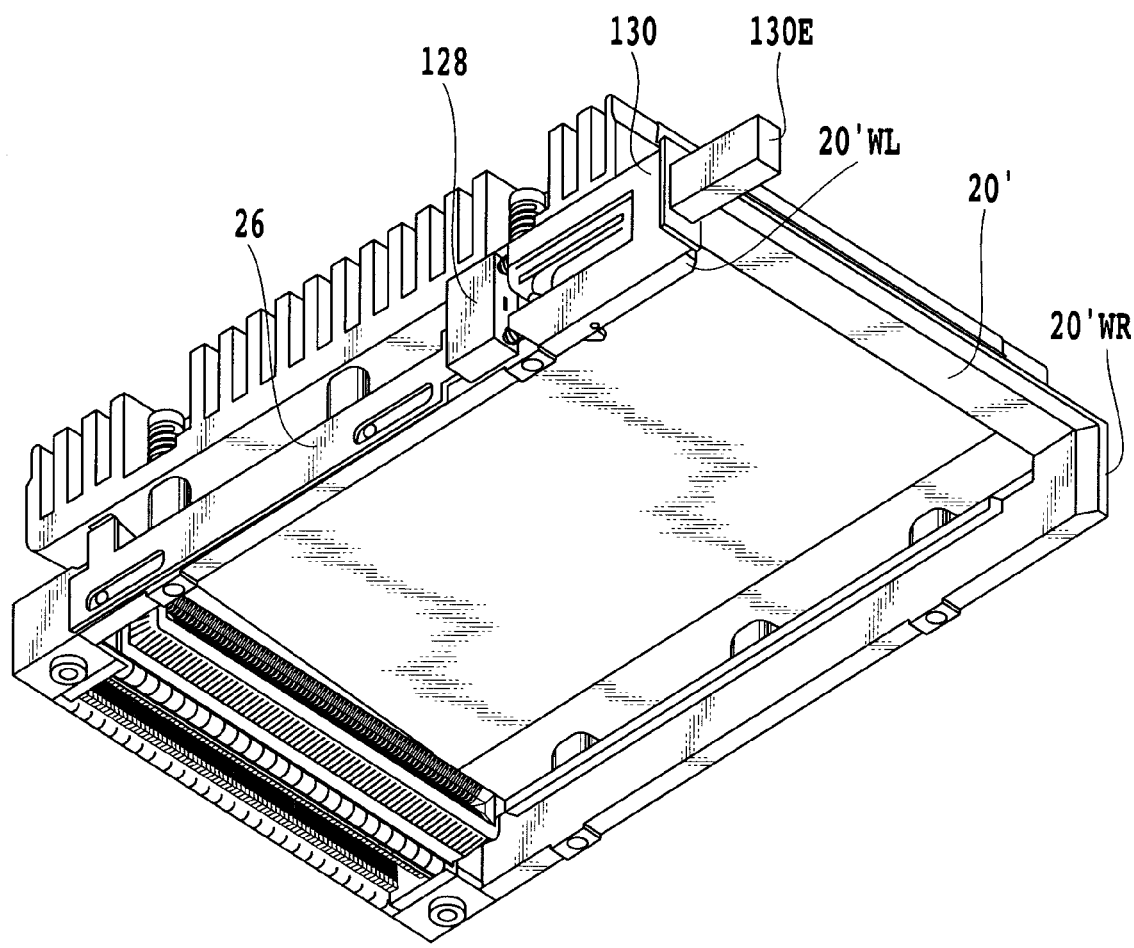
FIG. 44 is a perspective view illustrating an internal structure of the example shown in FIG. 43.

FIG. 43 shows another example of a heat sink unit used in an example of a connector for connection to a module board according to the present invention. Note that in FIGS. 43 and 44, the same components as those in the example shown in FIG. 31 are denoted by the same reference symbols, and the redundant description thereof will be omitted.

As shown in FIG. 10, in the foregoing example, the heat sink unit that dissipates heat from the module 10 includes the heat sink 50 having the multiple heat-dissipating fins 50f, the thermally conductive sheet 60, the slide sheet 58 and the fixing frame member 56. The thermally conductive sheet 60 and the slide sheet 58 are stacked in this order on the raised portion 50R of the heat sink 50 and fixed thereto. The fixing frame member 56 is used to fix the thermally conductive sheet 60 and the slide sheet 58 to the heat sink 50. After the machine screws BS3 are screwed into their female screw holes of the heat sink 50 through the holes 56a, respectively, the fixing frame member 56 presses, against the heat sink 50, both ends of the slide sheet 58 provided on the raised portion 50R with the thermally conductive sheet 60 interposed therebetween, and thus fixes both ends of the slide sheet 58 to the heat sink 50.

Figure 45:
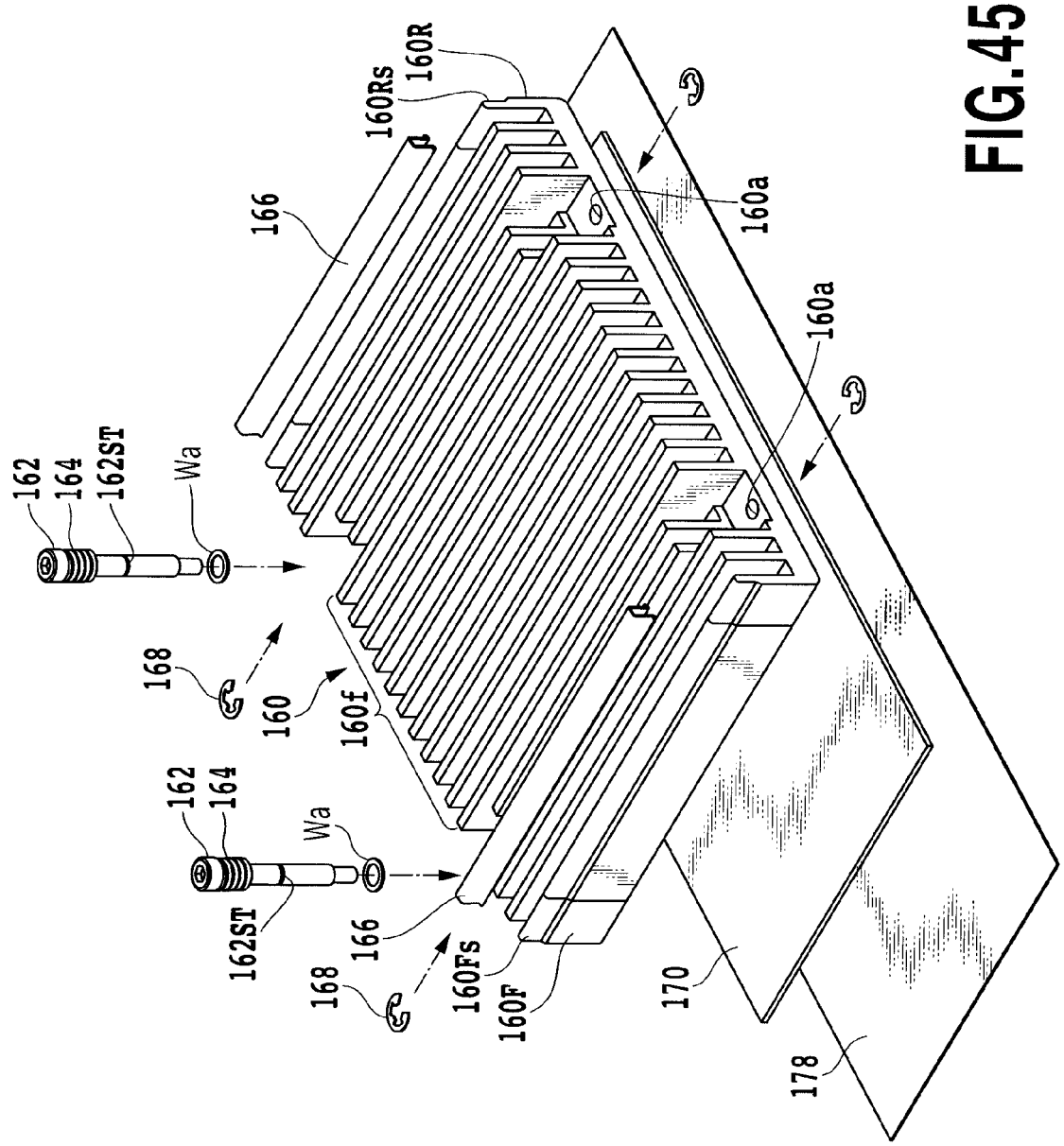
FIG. 45 is an exploded perspective view of the structure of the example shown in FIG. 43.
Figure 46:
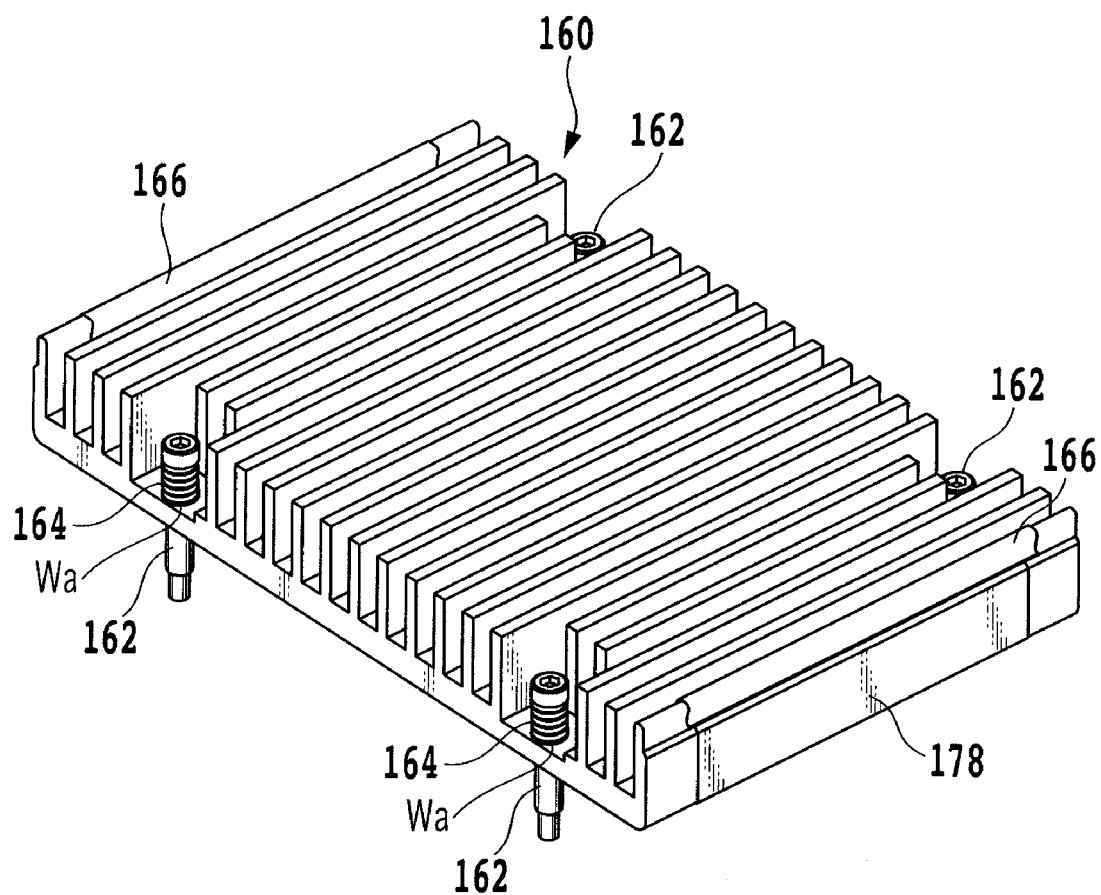
FIG. 46 is a perspective view showing an appearance of a heat sink unit shown in FIG. 43.

By contrast, the heat sink unit in the example shown in FIG. 43 includes a heat sink 160, a thermally conductive sheet 170, a slide sheet 178 and a pair of clip members 166, instead, as enlarged in FIG. 45. The heat sink 160 has multiple heat-dissipating fins 160f. The thermally conductive sheet 170 and the slide sheet 178 are stacked in this order on the flat back surface of a base of the heat sink 160 and fixed thereto. The clip members 166 fix the thermally conductive sheet 170 and the slide sheet 178 to the heat sink 160.

Figure 49:
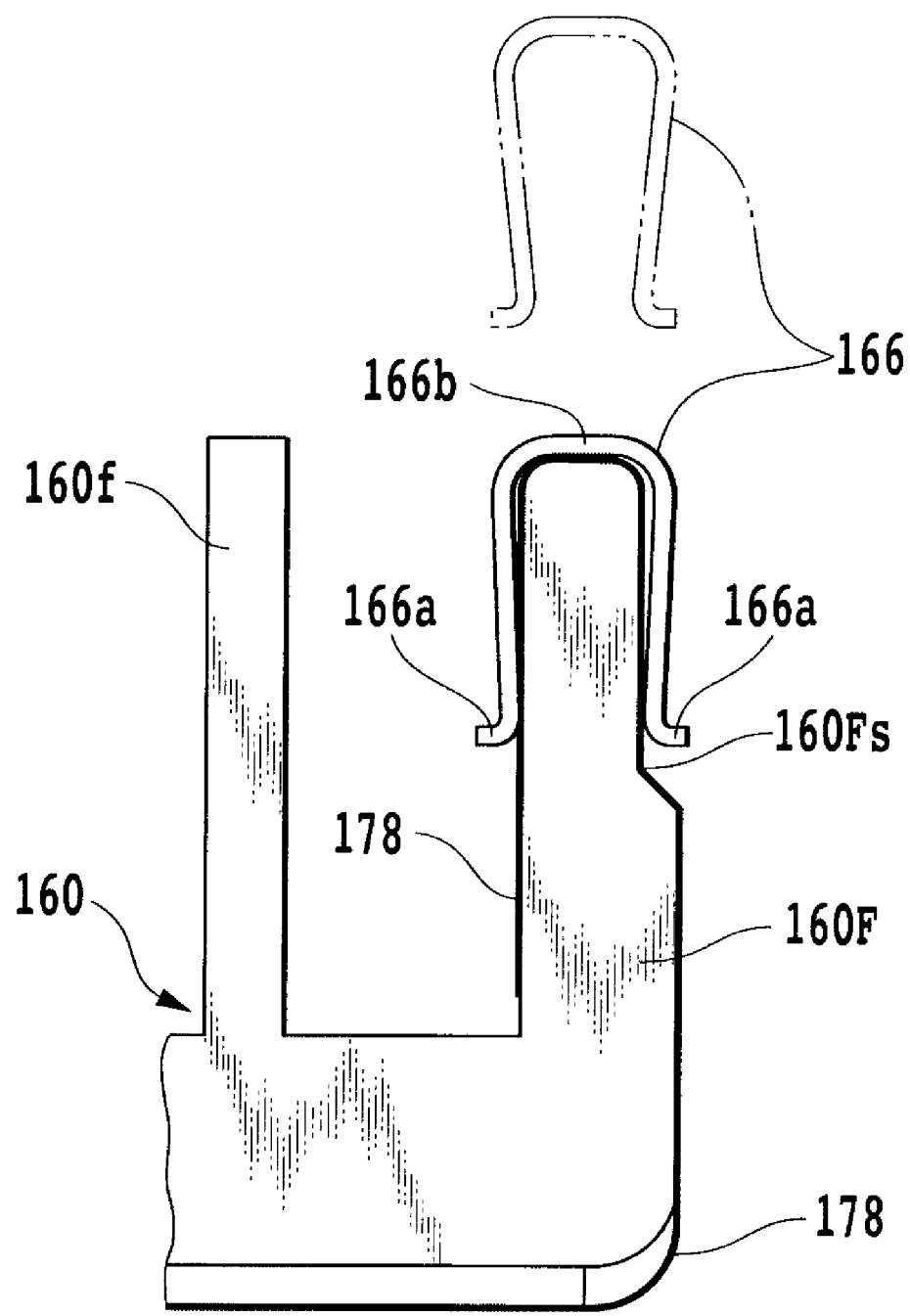
FIG. 49 is an enlarged partial side plan view showing one end portion of the example shown in FIG. 47, as well as a clip member.

On one of the surfaces of the base of the heat sink 160, the heat-dissipating fins 160f each having an approximately rectangular cross section are formed in parallel to one another at predetermined intervals. The clip members 166 to be described later are provided to clip fitting portions 160Fs and 160Rs of sheet-fixing end sections 160F and 160R of the heat sink 160 with ends of the slide sheet 178 interposed therebetween, respectively. The sheet-fixing end sections 160F and 160R are formed respectively on ends of the heat sink 160 that extend in a direction approximately perpendicular to the direction in which the heat-dissipating fins 160f are arranged side by side. The corner at which the lower edge of the sheet-fixing end section 160F and the base is joined together is formed to have a circular surface or chamfered. As enlarged in FIG. 49, the clip fitting portion 160Fs, which is formed in an upper portion of the sheet-fixing end section 160F, is thinner than the sheet-fixing end section 160F. The clip fitting portion 160Rs has the same shape as the clip fitting portion 160Fs.

The back surface of the base has no raised portion as that in the foregoing example, and thus is flat. The back surface of the base is in contact with the thermally conductive sheet 170 that efficiently conducts heat to the back surface. The thermally conductive sheet 170 is formed in a thickness of approximately 0.5 mm, for example. The slide sheet 178, which is formed integrally with metal foil, is stacked on the thermally conductive sheet 170.

The short sides of the slide sheet 178 are approximately as long as those of the thermally conductive sheet 170. The slide sheet 178 needs only to have adequate durability and a relatively small friction coefficient, and may be made of a material such as YFLEX (registered trademark). Alternatively, the slide sheet 178 may be made by combining a copper film having a thickness of 0.012 mm and a liquid crystal polymer (LCP) film having a thickness of 0.0381 mm. In this case, the surface of either the copper film or the liquid crystal polymer (LCP) film of the slide sheet 178 may be in contact with the thermally conductive sheet 170. In addition, a thermally conductive silicon grease may be applied between the back surface of the base and the surface of the thermally conductive sheet 170 placed on the slide sheet 178 made of the above-described combined films. In the case where the slide sheet 178 is integrally formed of, for example, a film and metal foil, the film is reinforced with the metal foil which resists tearing. Accordingly, the slide of the module 10 might damage the film, but will never completely tear off the film.

Figure 47:
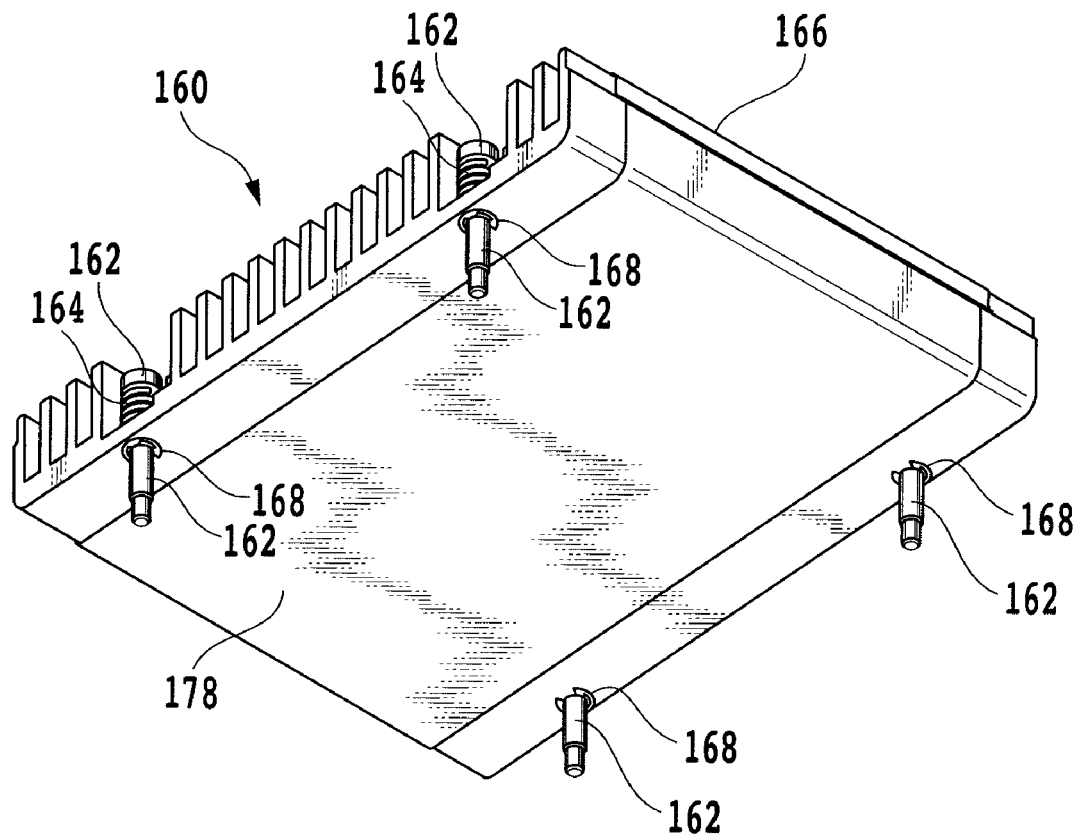
FIG. 47 is a perspective view showing the back-surface side of the heat sink unit shown in FIG. 43.

Each clip member 166 is made of a thin metal plate pressed to have an approximately U-shaped cross section. As shown in FIG. 47, the entire length of each clip member 166 is set to approximately the same as the length of the short sides of the slide sheet 178 and the thermally conductive sheet 170. As enlarged in FIG. 49, each clip member 166 includes a pair of elastic pieces 166a and a curved section 166b. The elastic pieces 166a grip therebetween the corresponding one of the ends of the slide sheet 178 that are bent along the wall surfaces of the clip fitting portions 160Fs and 160Rs. Thereby, the elastic pieces 166a fix the end of the slide sheet 178 onto the corresponding one of the clip fitting portions 160Fs and 160Rs of the heat sink 160. The curved section 166b connects the paired elastic pieces 166a to one another.

The clip members 166 are attached to the respective clip fitting portions 160Fs and 160Rs as follows. In the initial state, the paired elastic pieces 166a of each clip member 166 have shapes indicated by the two-dot chain lines in FIG. 49. When each clip member 166 is pressed onto the corresponding one of the ends of the slide sheet 178 that are bent along the wall surfaces, the pressure opens the clip member 166 so as to move the paired elastic pieces 166a away from each other, and thus the clip fitting portion 160Fs or 160Rs is fitted between the paired elastic pieces 166a. As a result, each of both ends of the slide sheet 178 that are bent along the wall surfaces is griped between the paired elastic pieces 166a of the corresponding clip member 166. Here, each gripped wall surface extends from the outside surface to the inside surface of the corresponding one of the clip fitting portions 160Fs and 160Rs. In this way, the slide sheet 178 and the thermally conductive sheet 170 are pressed onto the back surface of the base under a predetermined tension, and thus fixed thereto.

On the other hand, each clip member 166 is easily detached from the corresponding one of the clip fitting portions 160Fs and 160Rs by being pulled away by force against a frictional force attributed to an elastic force of the paired elastic pieces 166a.

Figure 48:
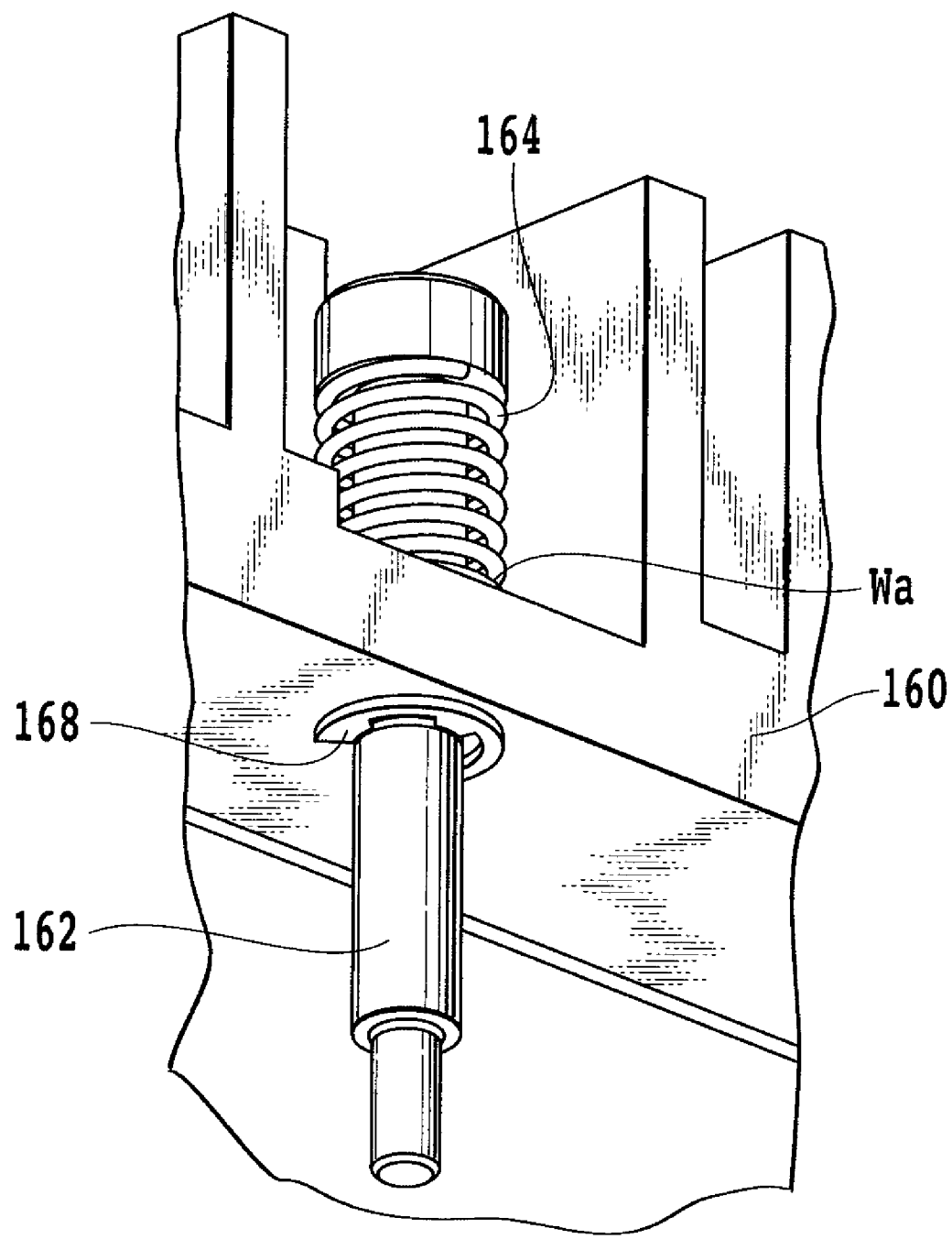
FIG. 48 is an enlarged perspective view partially showing main part of the example shown in FIG. 47.

The above-described heat sink unit is supported on the guide rail member 20' with guide screws 162 inserted into four holes 160a formed among the heat-dissipating fins 160f so that the heat sink unit can move up and down with respect to the guide rail member 20'. As enlarged in FIG. 48, each guide screw 162 has a male screw section formed at a tip of a portion protruding below the corresponding hole 160a. The male screw sections are screwed respectively into female screw holes (not shown) of the guide rail member 20'. A coil spring 164 and a washer Wa are wound around each guide screw 162 in a region between the head of the guide screw 162 and the opening end of the corresponding hole 160a on the side adjacent to the heat-dissipating fins 160f. In addition, each guide screw 162 has a stepped portion 162ST formed at a position below the head, as shown in FIG. 45. The diameter of the stepped portion 162ST is set larger than the bore diameter of the washer Wa. Accordingly, when the stepped portion 162ST comes in contact with the washer Wa, the movement of the heat sink unit is restricted.

An E-ring 168 is fixed to each guide screw 162 at a position near the back-side opening end of the corresponding hole 160a. The unillustrated female screw holes are formed in the upper edges of the sidewall sections 20'WR and 20'WL. Thereby, the coil springs 164 bias the heat sink unit in such a direction that the back surface thereof can come closer to the inside of the module accommodating section.

Figure 50A:
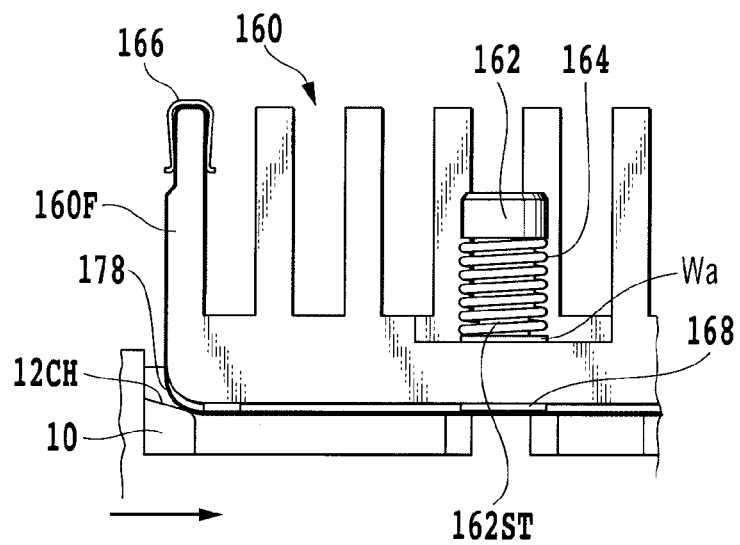
FIG. 50A is a view made available for illustrating an operation of the heat sink unit shown in FIG. 43.
Figure 50B:
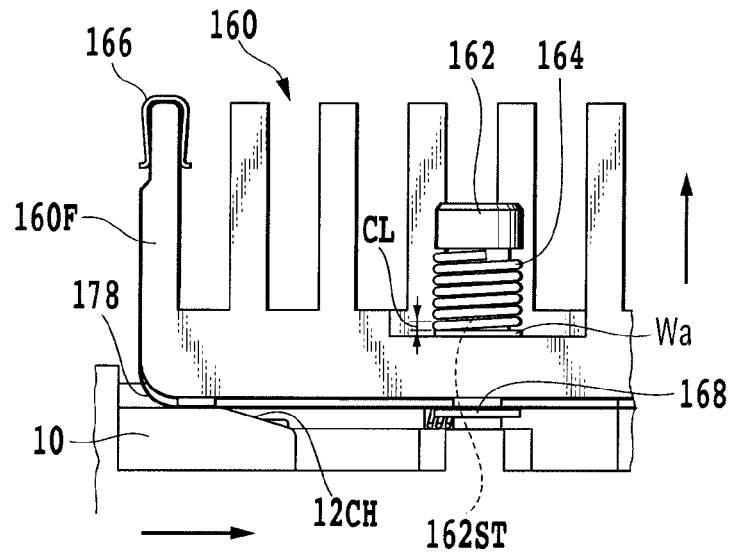
FIG. 50B is a view made available for illustrating the operation of the heat sink unit shown in FIG. 43.

The above-described structure of the heat sink unit enables the following operations as shown in FIG. 50A. When the end, having the inclined surface portion 12CH, of the module 10 is inserted into the module accommodating section in the direction indicated by the arrow shown in FIG. 50A, the inclined surface portion 12CH of the case 12 of the module 10 reaches and thus comes into contact with the back surface of the heat sink 160 as shown in FIG. 50B. In response, the heat sink unit starts to move up in the direction indicated by the arrow in FIG. 50B so that the surface of the slide sheet 178 can move away from the E-rings 168 against an elastic force of the coil springs 164. In this event, a predetermined clearance CL is created between each stepped portion 162ST and the corresponding washer Wa. The clearance accommodates an undesired manufacturing error.

Figure 50C:
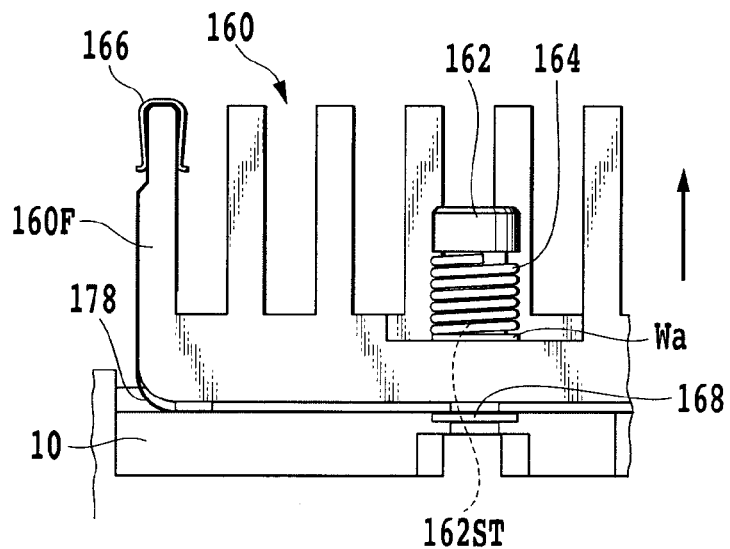
FIG. 50C is a view made available for illustrating the operation of the heat sink unit shown in FIG. 43.

Then, when the module 10 is further pushed in as shown in FIG. 50C, the heat sink unit is moved up in the direction indicated by the arrow in FIG. 50C to reach the uppermost position against the elastic force of the coil springs 164. This means that the module 10 is pushed in a manner that the upper surface of the case 12 of the module 10 is slid in contact with the slide sheet 178. In addition, while the heat sink unit is held at the uppermost position, the upper surface of the case 12 of the module 10 is in close contact with the slide sheet 178.

Thus, the structure allows the heat sink unit to be lifted up, and the case 12 of the module 10 to come into contact with the slide sheet 178, simply by inserting the module 10 into the module accommodating section. Moreover, the small surface friction coefficient of the slide sheet 178 provides an effect of allowing the module 10 to be inserted with a low insertion force.

In the structure of the above-described example, the slide sheet 178 and the thermally conductive sheet 170 are fixed to the heat sink 160 by attaching the clip members 166 onto the clip fitting portions 160Fs and 160Rs formed in upper portions of the sheet-fixing end sections 160F and 160R, respectively. However, the method for fixing the slide sheet 178 and the thermally conductive sheet 170 is not limited to this example. For example, as shown in a partial enlarged view of FIG. 51, clip members 174 for fixing, to a heat sink 160', the ends of the slide sheet 178 that are bent along the end surfaces of the heat sink 160' may be used, instead. Each of the clip members 174 is provided between one of facing short-side end sections 160'F and the adjacent one of heat-dissipating fins 160'f.

Figure 51:
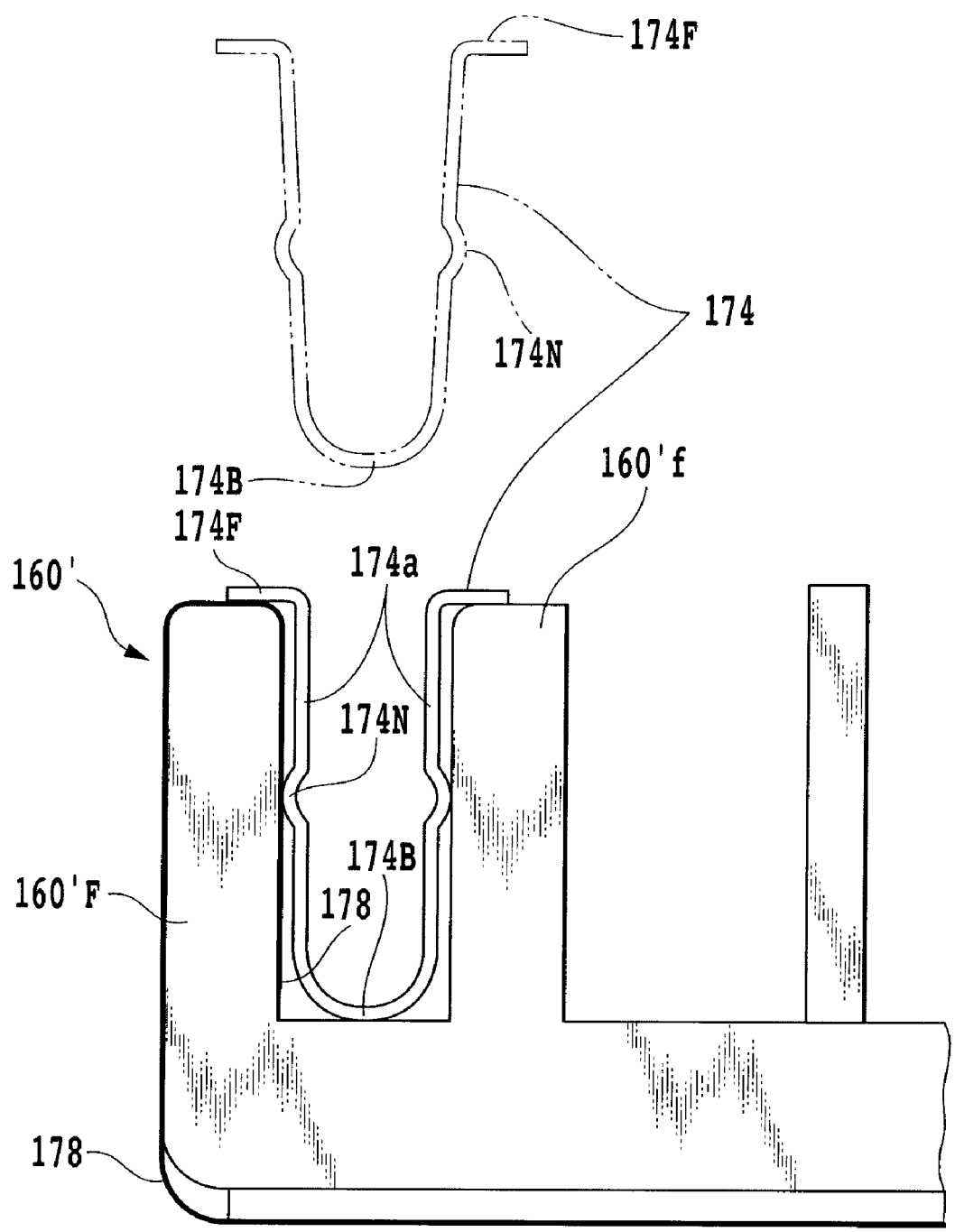
FIG. 51 is a side plan view showing another example of a clip member used in an embodiment of a connector for connection to a module board according to the present invention, as well as part of a heat sink.

In FIG. 51, each clip member 174 is made of a thin metal plate pressed to have an approximately U-shaped cross section. The entire length of each clip member 174 is set to approximately the same as the length of the short sides of the slide sheet 178 and the thermally conductive sheet 170. As shown in the partial enlarged view of FIG. 51, each clip member 174 includes a pair of elastic pieces 174a and a curved section 174B. The elastic pieces 174a press the corresponding one of the ends of the slide sheet 178 that are bent along the wall surfaces of the end sections 160'F. Thereby, the elastic pieces 174a fix the end of the slide sheet 178 onto the inside surface of the corresponding end section 160'F of the heat sink 160'. The curved section 174B connects the paired elastic pieces 174a to one another. Each of the paired elastic pieces 174a has a dimple 174N at the middle, and a bent flange 174F at the edge.

The clip members 174 are attached to the respective end sections 160'F as follows. In the initial state, the paired elastic pieces 174a of each clip member 174 have shapes indicated by the two-dot chain lines in FIG. 51. When each clip member 174 is inserted between the corresponding end section 160'F and the heat-dissipating fin 160'f adjacent thereto by making the elastic pieces 174a close to each other against their elastic force, and thereafter the elastic pieces 174a are released, the nibs 174N are pressed onto the corresponding one of the ends of the slide sheet 178 that are bent along the wall surfaces of the end sections 160'F. Thereby, the paired elastic pieces 174a are held between the corresponding end section 160'F and the heat-dissipating fin 160'f adjacent thereto.

As a result, each of both ends of the slide sheet 178 that are bent along the wall surfaces is pressed by the nibs 174N and the flanges 174F. Here, each gripped wall surface extends from the outside surface to the inside surface of the corresponding end section 160'F. In this way, the slide sheet 178 and the thermally conductive sheet 170 are pressed onto the back surface of the base under a predetermined tension, and thus fixed thereto.

On the other hand, each clip member 174 is easily detached from between the corresponding end section 160'F and the heat-dissipating fin 160'f adjacent thereto by being pulled away by force against a frictional force attributed to the elastic force of the paired elastic pieces 174a.

Figure 52:
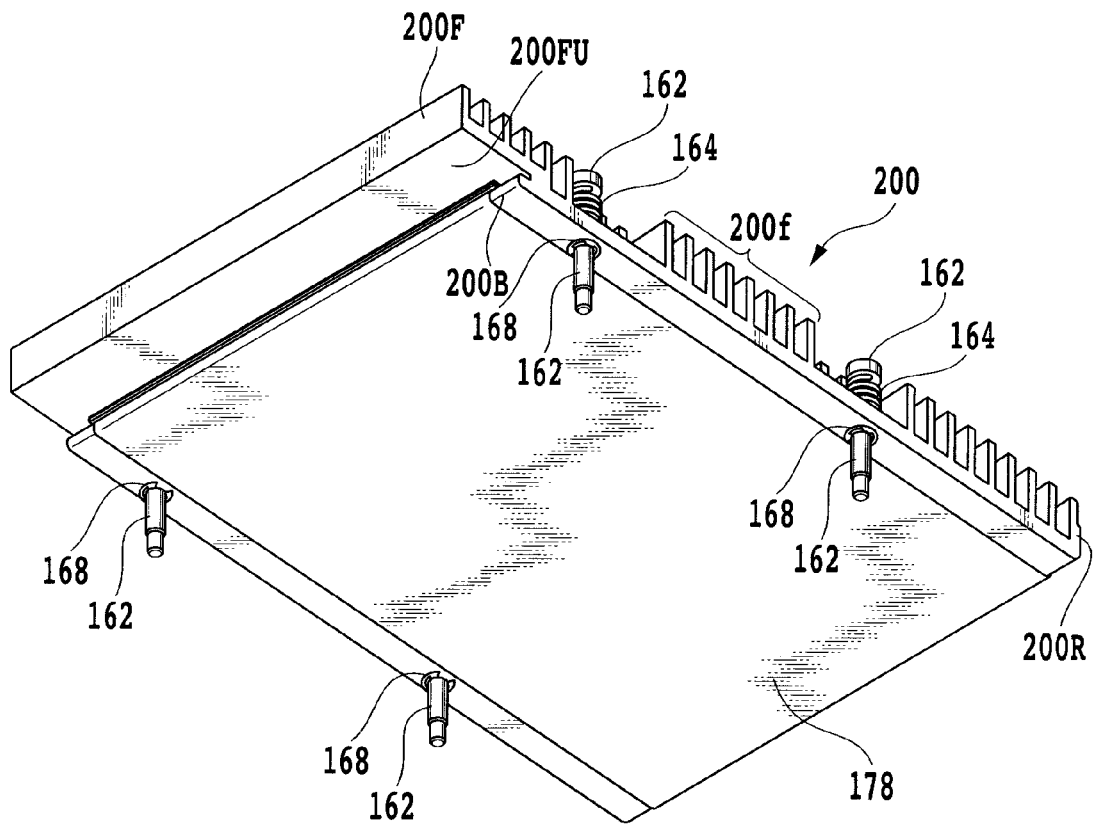
FIG. 52 is a perspective view showing still another example of a heat sink unit used in an embodiment of a connector for connection to a module board according to the present invention.
Figure 53:
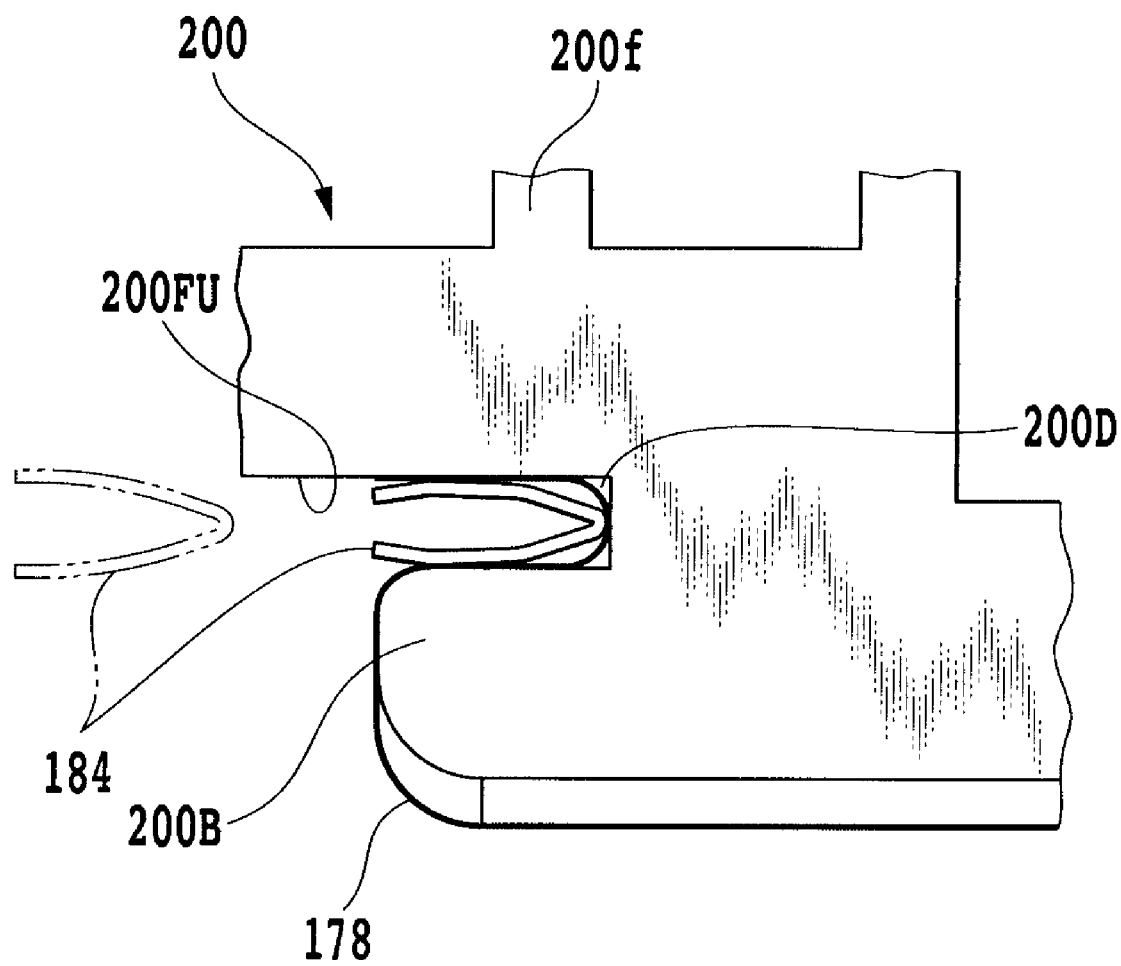
FIG. 53 is an enlarged side plan view partially showing main part of the example shown in FIG. 52.

FIG. 52 shows still another example of a heat sink unit used in an example of a connector for connection to a module board according to the present invention. Note that in FIGS. 52 and 53, the same components as those in the example shown in FIG. 45 are denoted by the same reference symbols, and the redundant description thereof will be omitted.

The heat sink unit shown in FIG. 52 includes a heat sink 200, the thermally conductive sheet 170, the slide sheet 178 and a clip member 184. The heat sink 200 has multiple heat-dissipating fins 200f. The thermally conductive sheet 170 and the slide sheet 178 are stacked in this order on the flat back surface of a base of the heat sink 200 and fixed thereto. The clip member 184 fixes the thermally conductive sheet 170 and the slide sheet 178 to the heat sink 200.

On one of the surfaces of the base of the heat sink 200, the heat-dissipating fins 200f each having an approximately rectangular cross section are formed in parallel to one another at predetermined intervals. The heat sink 200 has an extreme end section 200F having a surface 200FU on the side opposed to the heat-dissipating fins 200f, and a sheet-fixing groove 200D is formed in a stepped portion connected to the surface 200FU. The clip member 184 to be described later is provided in the sheet-fixing groove 200D with one end of the slide sheet 178 interposed therebetween. The elongated sheet-fixing groove 200D has a predetermined depth, and is formed in one end 200B of the heat sink 200 that extends in a direction approximately perpendicular to the direction in which the heat-dissipating fins 200f are arranged side by side.

The clip member 184 is made of a thin metal plate pressed to have an approximately V-shaped cross section. As shown in FIG. 52, the entire length of the clip member 184 is set to approximately the same as the length of the short sides of the slide sheet 178 and the thermally conductive sheet 170. As enlarged in FIG. 53, the clip member 184 includes a pair of elastic pieces and a curved section. The elastic pieces presses one end of the slide sheet 178 that is bent along one end surface of the heat sink 200 and the inside surface of the sheet-fixing groove 200D which has a rectangular cross section. Thereby, the elastic pieces fix the end of the slide sheet 178 into the sheet-fixing groove 200D of the heat sink 200. The curved section connects the paired elastic pieces to one another.

The clip member 184 is attached into the sheet-fixing groove 200D as follows. In the initial state, the paired elastic pieces of the clip member 184 have shapes indicated by the two-dot chain lines in FIG. 53. When the clip member 184 is pressed onto the bent end of the slide sheet 178 against an elastic force of the elastic pieces, the pressure makes the elastic pieces close to each other, and thus the paired elastic pieces are fitted into the sheet-fixing groove 200D with the end of the slide sheet 178 interposed therebetween. As a result, the one end of the slide sheet 178 that is bent along one end surface of the heat sink 200 and the inside surface of the sheet-fixing groove 200D is pressed by the paired elastic pieces of the clip member 184. In this way, the slide sheet 178 and the thermally conductive sheet 170 are pressed onto the back surface of the base under a predetermined tension, and thus fixed thereto.

On the other hand, the clip member 184 is easily detached from the sheet-fixing groove 200D by being pulled away by force against a frictional force attributed to the elastic force of the paired elastic pieces. Note that the other end of the slide sheet 178, which is bent along the surface of a fixing wall section 200R, may be fixed by using the clip member 166 shown in FIG. 49 or may be fixed onto the surface of the fixing wall section 200R with a predetermined fixing plate interposed therebetween by using multiple machine screws.

The above-described heat sink unit is supported on the guide rail member 20' with the guide screws 162 inserted into four holes formed among the heat-dissipating fins 200f so that the heat sink unit can move up and down with respect to the guide rail member 20'. The male screw sections of the guide screws 162, each of which is formed at the tip of a portion protruding below the corresponding hole 160a, are screwed respectively into the female screw holes (not shown) of the guide rail member 20'. The coil spring 164 and the washer Wa are wound around each guide screw 162 in a region between the head of the guide screw 162 and the opening end of the corresponding one of the four holes on the side adjacent to the heat-dissipating fins 200f. In addition, the E-ring 168 is fastened to each guide screw 162 at a position near the back-side opening end of the corresponding one of the four holes. The unillustrated female screw holes are formed in the upper edges of the sidewall sections 20'WR and 20'WL. Thereby, the coil springs 164 bias the heat sink unit in such a direction that the back surface thereof can come closer to the inside of the module accommodating section.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A connector for connection to a module board, comprising:
    a guide rail member defining a module accommodating section detachably and attachably accommodating a module that includes a module board;
    a connector section provided adjacent to the module accommodating section, and electrically connecting the module board of the module to a wiring board;
    a heat sink that dissipates heat from the module, the heat sink being supported so as to be movable up and down with respect to said guide rail member in response to insertion and ejection of the module to the module accommodating section of the module; and
    at least one sheet member provided between said heat sink and the module, wherein
    said sheet member comprises a thermally conductive sheet touching said heat sink and a slide sheet superimposed on the thermally conductive sheet.

2. The connector for connection to a module board according to claim 1, wherein the slide sheet is formed of a composite material comprising a metal film and a liquid crystal polymer film.

3. The connector for connection to a module board according to claim 1, wherein the connector further comprises a fixing frame member for fixing said sheet member to said heat sink.

4. The connector for connection to a module board according to claim 1, wherein the connector further comprises clip members for fixing said sheet member to said heat sink.

5. The connector for connection to a module board according to claim 1, wherein the slide sheet is formed from a metal foil.

6. The connector for connection to a module board according to claim 1, wherein the slide sheet is formed from a metal plate.

7. The connector for connection to a module board according to claim 1, wherein the connector further includes an eject mechanism attached to a periphery of a guide rail member, and selectively ejecting the module from the module accommodating section, wherein
    said eject mechanism comprises:
    an eject button to be operated upon selectively ejecting the module from the module accommodating section;
    a locking member rotational movably provided in a through hole of said guide rail member so as to be switched between a lock state and an unlock state in response to an operation of the eject button, the locking member in the lock state engaging with a portion to be engaged of the module to lock the module in the module accommodating section, the locking member in the unlock state being away from the portion to be engaged of the module and thus waiting in the through hole to unlock the module in the module accommodating section; and a collar-like portion formed on an operation section of the eject button so as to conform to an opening of a housing provided with the wiring board, the collar-like portion being pressed against an inner peripheral surface around the opening of the housing during the lock state.

8. The connector for connection to a module board according to claim 1, wherein the connector section consists of:
   a first connector supported by the guide rail member, and having contact terminals to be electrically connected respectively to an electrode group of the module board; and
   a second connector provided on the wiring board, and having contact terminals to be electrically connected respectively to the contact terminals of the first connector.

* * * * *